(12) United States Patent
Ishii et al.

(10) Patent No.: US 10,804,284 B2
(45) Date of Patent: Oct. 13, 2020

(54) THREE-DIMENSIONAL MEMORY DEVICE CONTAINING BIDIRECTIONAL TAPER STAIRCASES AND METHODS OF MAKING THE SAME

(71) Applicant: SANDISK TECHNOLOGIES LLC, Plano, TX (US)

(72) Inventors: Yasushi Ishii, Yokkaichi (JP); Jun Akaiwa, Yokkaichi (JP); Kiyokazu Shishido, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 21 days.

(21) Appl. No.: 15/950,356

(22) Filed: Apr. 11, 2018

(65) Prior Publication Data

US 2019/0319040 A1 Oct. 17, 2019

(51) Int. Cl.
*H01L 27/11582* (2017.01)
*H01L 23/522* (2006.01)
(Continued)

(52) U.S. Cl.
CPC ... *H01L 27/11582* (2013.01); *H01L 21/31111* (2013.01); *H01L 21/31144* (2013.01);
(Continued)

(58) Field of Classification Search
CPC .................. H01L 27/11551–11556; H01L 27/11578–11582
See application file for complete search history.

(56) References Cited

U.S. PATENT DOCUMENTS 5,915,167 A 6/1999 Leedy
7,952,136 B2 5/2011 Kito et al.
(Continued)

FOREIGN PATENT DOCUMENTS

EP 3021360 A1 5/2016
JP 2012119478 A1 6/2012
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Bryan R Junge
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures vertically extending through the alternating stack, each memory stack structure including a memory film and a vertical semiconductor channel, and a contact well set that includes contact wells extending through a respective upper region of the alternating stack. Each of the contact wells contains first stepped surfaces which have a stepwise descending vertical profile along a first horizontal direction and second stepped surfaces which have a stepwise descending vertical profile along a second horizontal direction which is perpendicular to the first horizontal direction.

20 Claims, 48 Drawing Sheets

(51) Int. Cl.
*H01L 23/528* (2006.01)
*H01L 21/311* (2006.01)
*H01L 21/768* (2006.01)
*H01L 27/11521* (2017.01)
*H01L 27/11526* (2017.01)
*H01L 27/11556* (2017.01)
*H01L 27/11568* (2017.01)
*H01L 27/11573* (2017.01)
*H01L 29/10* (2006.01)
*H01L 21/3105* (2006.01)
*H01L 21/02* (2006.01)

(52) U.S. Cl.
CPC ...... *H01L 21/76802* (2013.01); *H01L 23/528* (2013.01); *H01L 23/5226* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/1037* (2013.01); *H01L 21/0217* (2013.01); *H01L 21/02164* (2013.01); *H01L 21/31053* (2013.01)

(56) References Cited

U.S. PATENT DOCUMENTS

| | | | |
|---|---|---|---|
| 8,187,932 B2 | 5/2012 | Nguyen et al. | |
| 8,284,601 B2 | 10/2012 | Son et al. | |
| 8,394,716 B2 | 3/2013 | Hwang et al. | |
| 8,520,425 B2 | 8/2013 | Xiao et al. | |
| 8,884,357 B2 | 11/2014 | Wang et al. | |
| 8,946,023 B2 | 2/2015 | Makala et al. | |
| 9,196,567 B1 * | 11/2015 | Chan | H01L 24/06 |
| 9,230,905 B2 | 1/2016 | Takaki et al. | |
| 9,230,987 B2 | 1/2016 | Pachamuthu et al. | |
| 9,343,507 B2 | 5/2016 | Takaki et al. | |
| 9,356,034 B1 | 5/2016 | Yada et al. | |
| 9,449,924 B2 | 9/2016 | Takaki | |
| 9,502,429 B2 | 11/2016 | Hironaga | |
| 9,515,023 B2 | 12/2016 | Tobitsuka et al. | |
| 9,583,539 B2 | 2/2017 | Takaki | |
| 9,589,981 B2 | 3/2017 | Nishikawa et al. | |
| 9,646,981 B2 | 5/2017 | Nishikawa et al. | |
| 9,685,408 B1 * | 6/2017 | Jiang | H01L 27/11575 |
| 9,905,573 B1 | 2/2018 | Mada et al. | |
| 2008/0101664 A1 | 5/2008 | Perez | |
| 2008/0149913 A1 | 6/2008 | Tanaka et al. | |
| 2009/0182449 A1 | 7/2009 | Frei et al. | |
| 2009/0230449 A1 | 9/2009 | Sakaguchi et al. | |
| 2010/0090188 A1 | 4/2010 | Futatsuyama | |
| 2010/0207186 A1 * | 8/2010 | Higashi | H01L 27/11578 257/314 |
| 2010/0219560 A1 | 9/2010 | Campbell | |
| 2010/0254191 A1 | 10/2010 | Son et al. | |
| 2012/0132983 A1 | 5/2012 | Fukuzumi | |
| 2012/0195128 A1 | 8/2012 | Fujiwara et al. | |
| 2012/0211816 A1 * | 8/2012 | Yahashi | H01L 27/11573 257/314 |
| 2012/0256247 A1 | 10/2012 | Alsmeier | |
| 2013/0130468 A1 | 5/2013 | Higashitani et al. | |
| 2013/0270714 A1 | 10/2013 | Lee et al. | |
| 2013/0279257 A1 | 10/2013 | Costa et al. | |
| 2014/0027838 A1 * | 1/2014 | Kido | H01L 27/0688 257/329 |
| 2014/0054787 A1 | 2/2014 | Eun et al. | |
| 2014/0264898 A1 | 9/2014 | Hu et al. | |
| 2014/0284675 A1 * | 9/2014 | Watanabe | H01L 29/7926 257/314 |
| 2014/0300597 A1 | 10/2014 | Holcomb | |
| 2015/0036407 A1 * | 2/2015 | Nakajima | H01L 29/7926 365/63 |
| 2015/0061068 A1 * | 3/2015 | Akutsu | H01L 21/76877 257/499 |
| 2015/0170748 A1 | 6/2015 | Costa et al. | |
| 2015/0179577 A1 | 6/2015 | Tobitsuka et al. | |
| 2015/0179659 A1 | 6/2015 | Takaki et al. | |
| 2015/0325587 A1 | 11/2015 | Chen | |
| 2016/0111361 A1 | 4/2016 | Oh et al. | |
| 2016/0147973 A1 | 5/2016 | Holcomb | |
| 2016/0148835 A1 | 5/2016 | Shimabukuro et al. | |
| 2016/0204117 A1 | 7/2016 | Liu et al. | |
| 2016/0300885 A1 | 10/2016 | Konevecki et al. | |
| 2016/0322376 A1 | 11/2016 | Lee | |
| 2017/0077139 A1 | 3/2017 | Iguchi | |
| 2017/0236746 A1 | 8/2017 | Yu et al. | |
| 2017/0243650 A1 | 8/2017 | Ogawa et al. | |
| 2018/0102281 A1 * | 4/2018 | Yang | G11C 16/08 |
| 2018/0182775 A1 * | 6/2018 | Kim | H01L 27/11565 |
| 2018/0286743 A1 * | 10/2018 | Chang | H01L 25/0657 |
| 2019/0139978 A1 * | 5/2019 | Kim | H01L 27/11575 |
| 2019/0237477 A1 * | 8/2019 | Baek | G11C 8/14 |

FOREIGN PATENT DOCUMENTS

| | | |
|---|---|---|
| KR | 20100109745 A | 10/2010 |
| KR | 20110021444 A | 3/2011 |

OTHER PUBLICATIONS

International Application No. PCT/US2014/071397, Invitation to Pay Additional Fees and Search Report dated Mar. 26, 2015.
International Application No. PCT/US2014/071397, International Search Report, dated Mar. 18, 2015, 5 pgs.
Written Opinion of the International Searching Authority for PCT/US2014/071397, dated Mar. 18, 2015, 11 pgs.
International Preliminary Report on Patentability for International Application No. PCT/US2014/071397, 12 pages, dated Jun. 21, 2016.
International Application No. PCT/US2017/063075, International Search Report and Written Opinion, dated Mar. 8, 2018, 18pgs.
U.S. Appl. No. 14/643,211, Office Action dated Apr. 4, 2016, 22pgs.
U.S. Appl. No. 15/367,791, filed Dec. 2, 2016, SanDisk Technologies LLC.
U.S. Appl. No. 15/451,773, filed Mar. 7, 2017, SanDisk Technologies LLC.
U.S. Appl. No. 15/632,703, filed Jun. 26, 2017, SanDisk Technologies LLC.
U.S. Appl. No. 15/805,599, filed Nov. 7, 2017, SanDisk Technologies LLC.
U.S. Appl. No. 15/956,139, filed Apr. 18, 2018, SanDisk Technologies LLC.

* cited by examiner

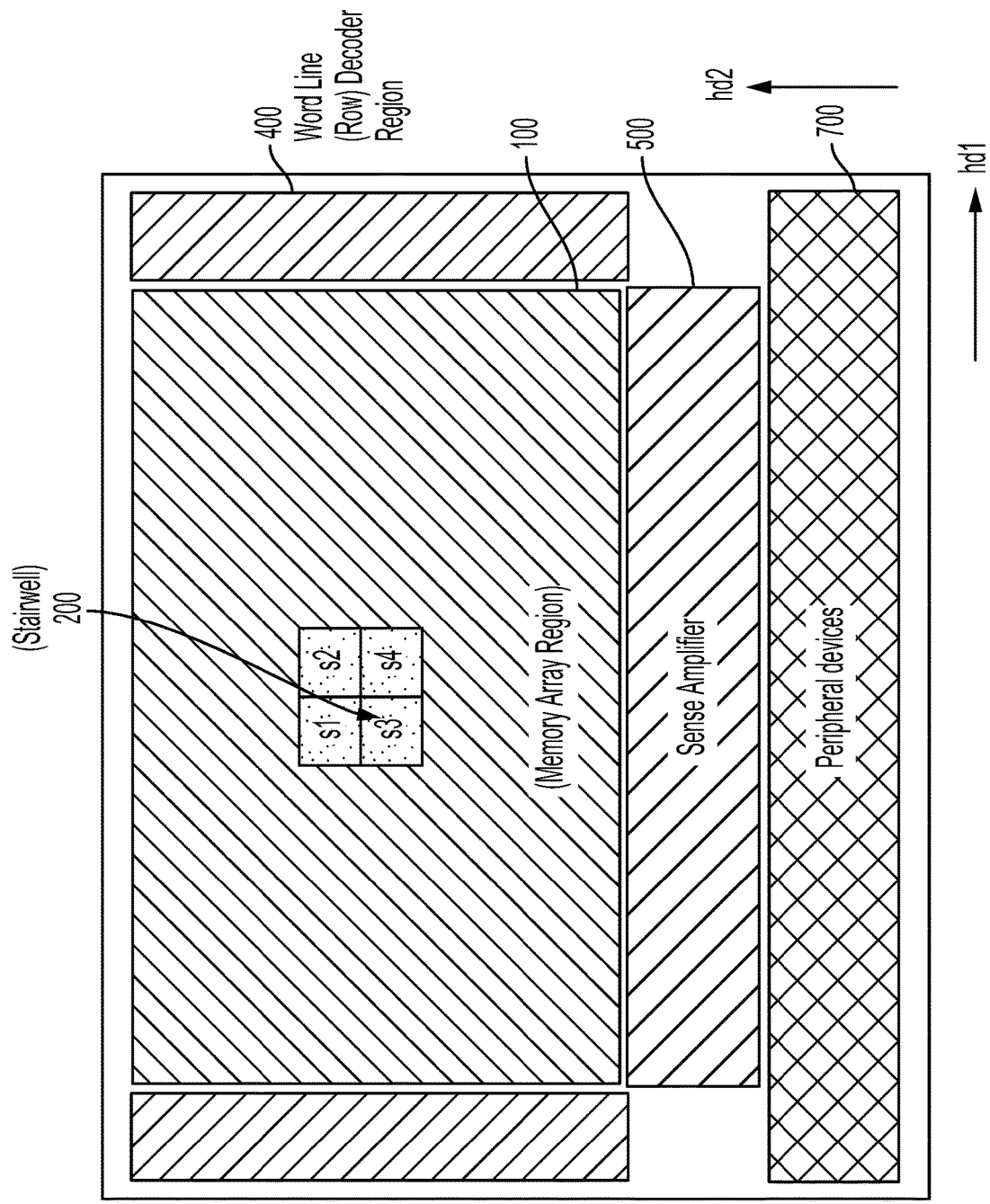

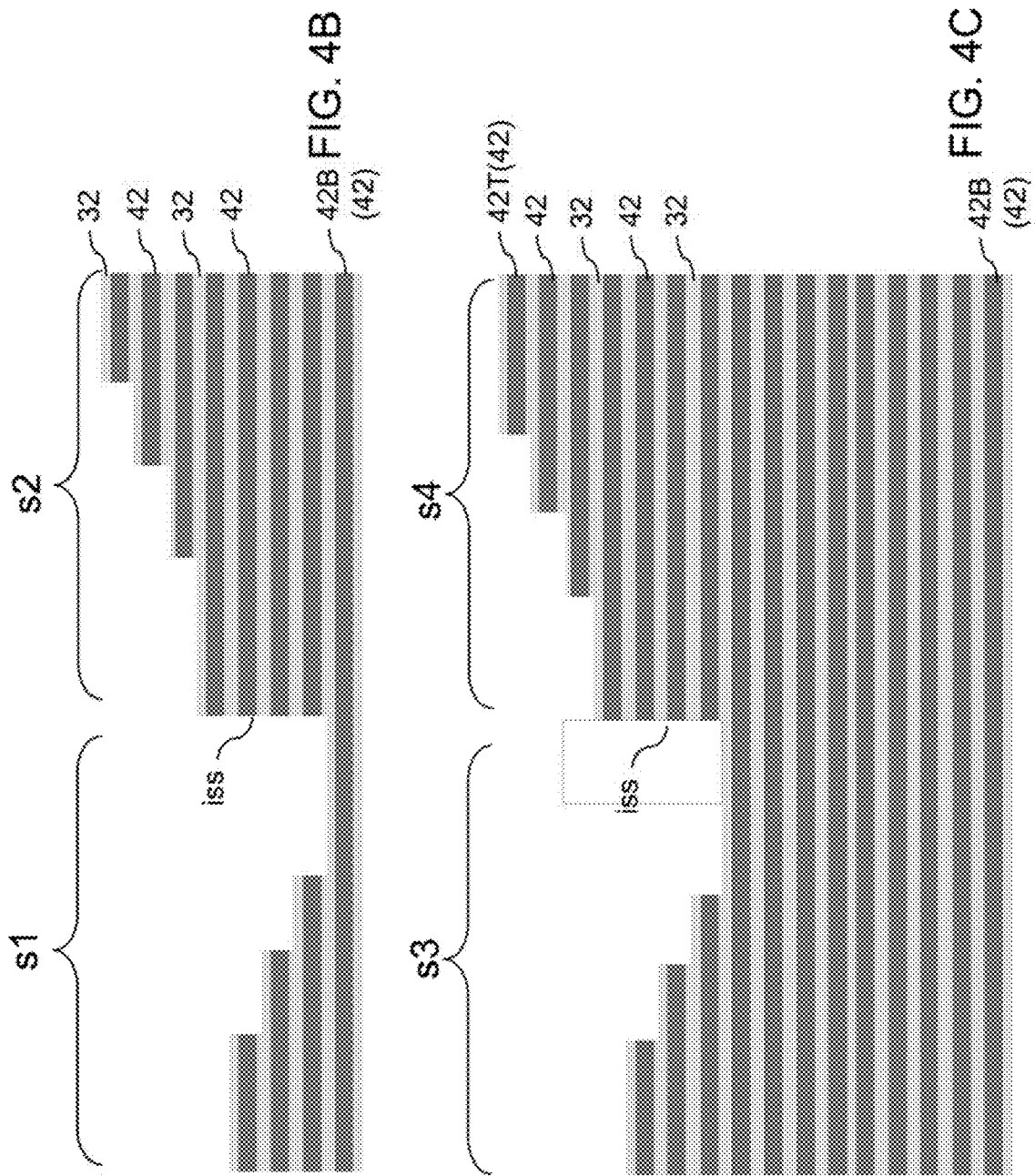

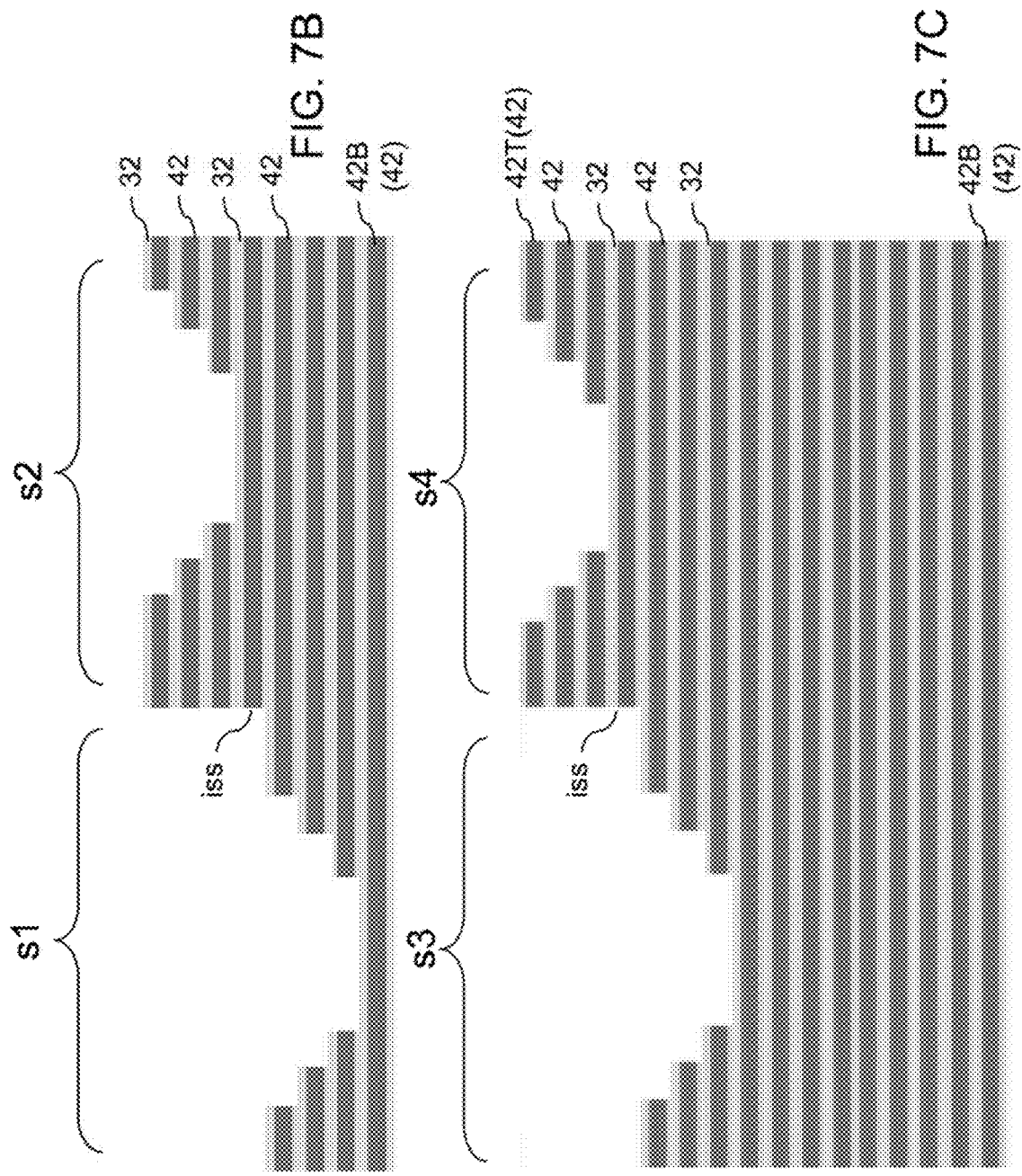

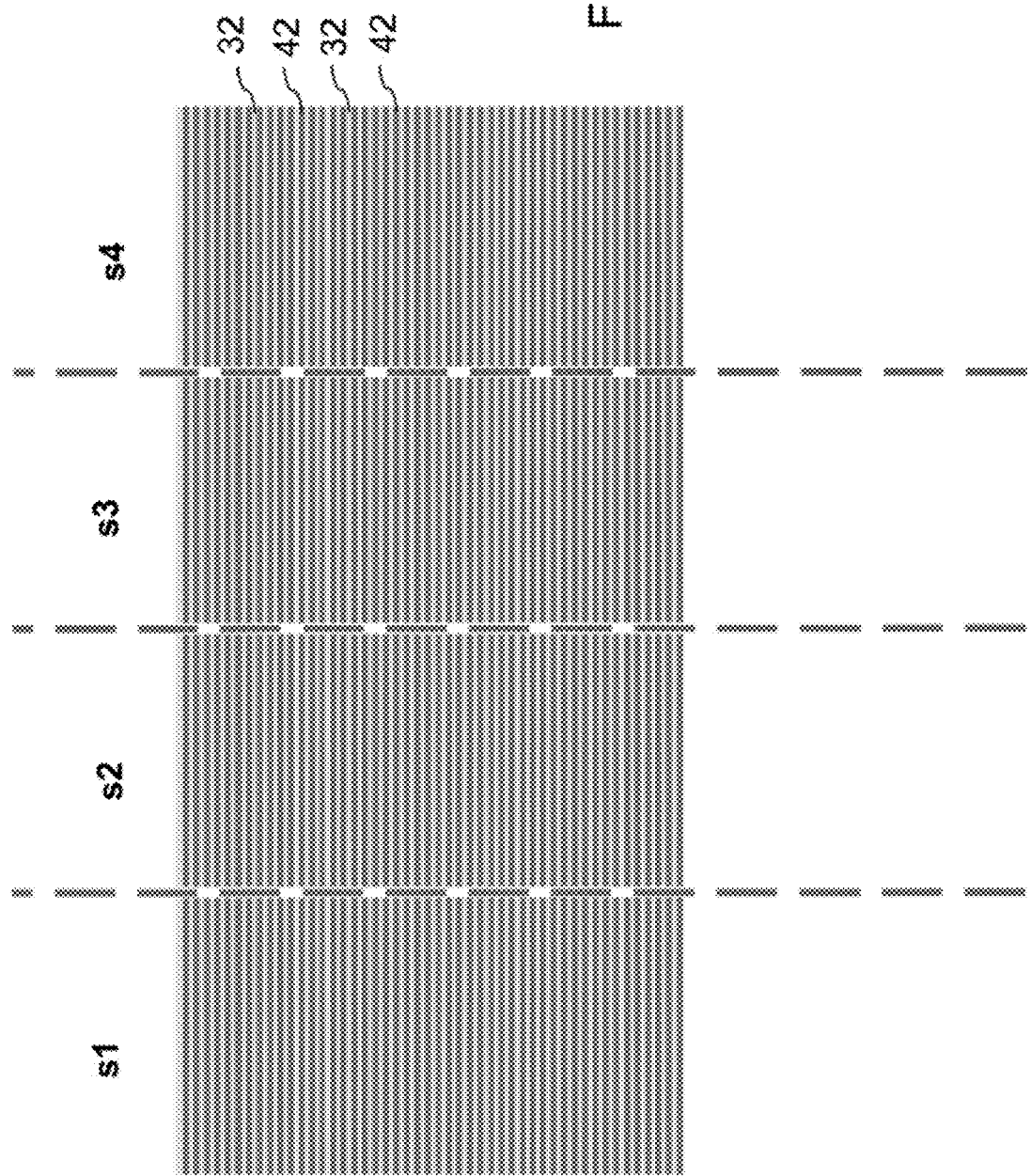

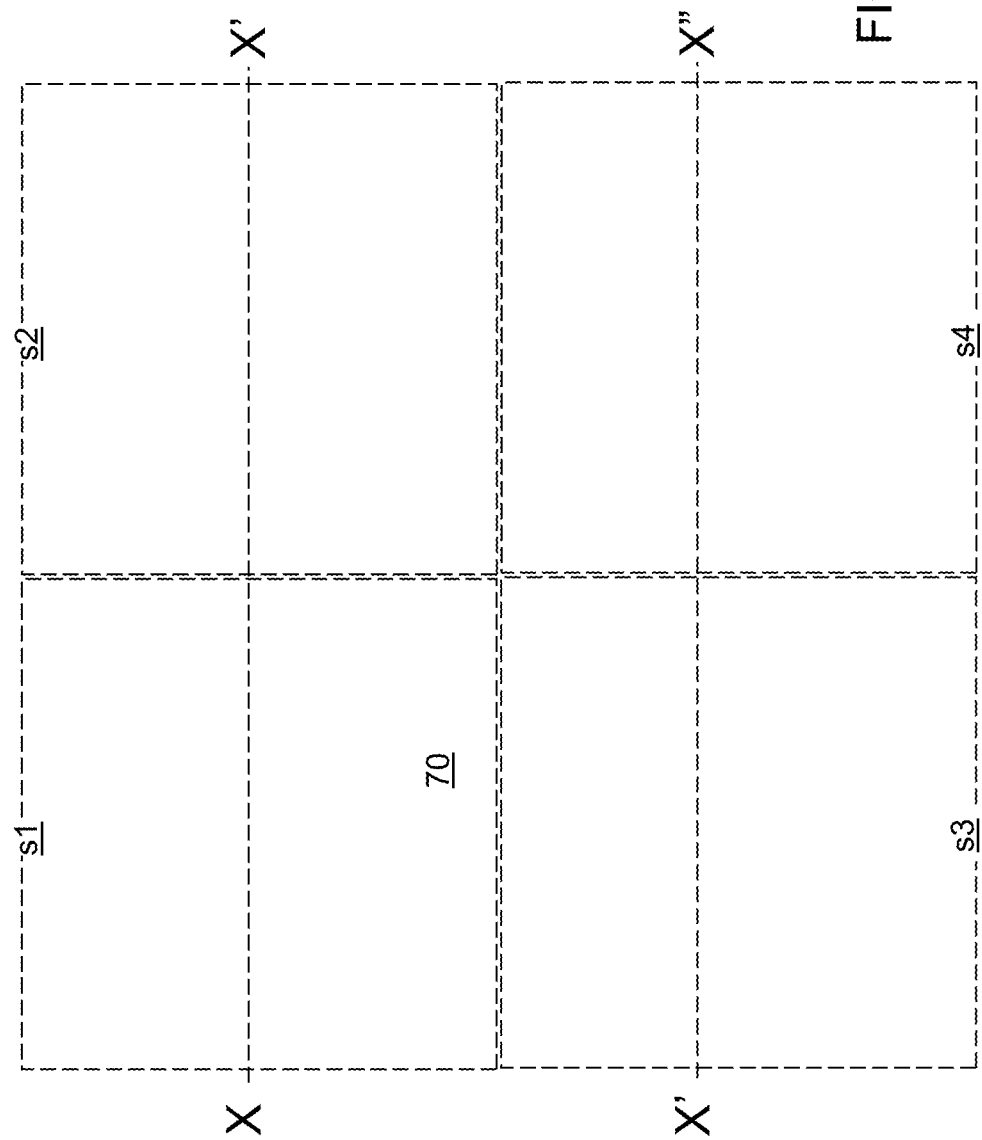

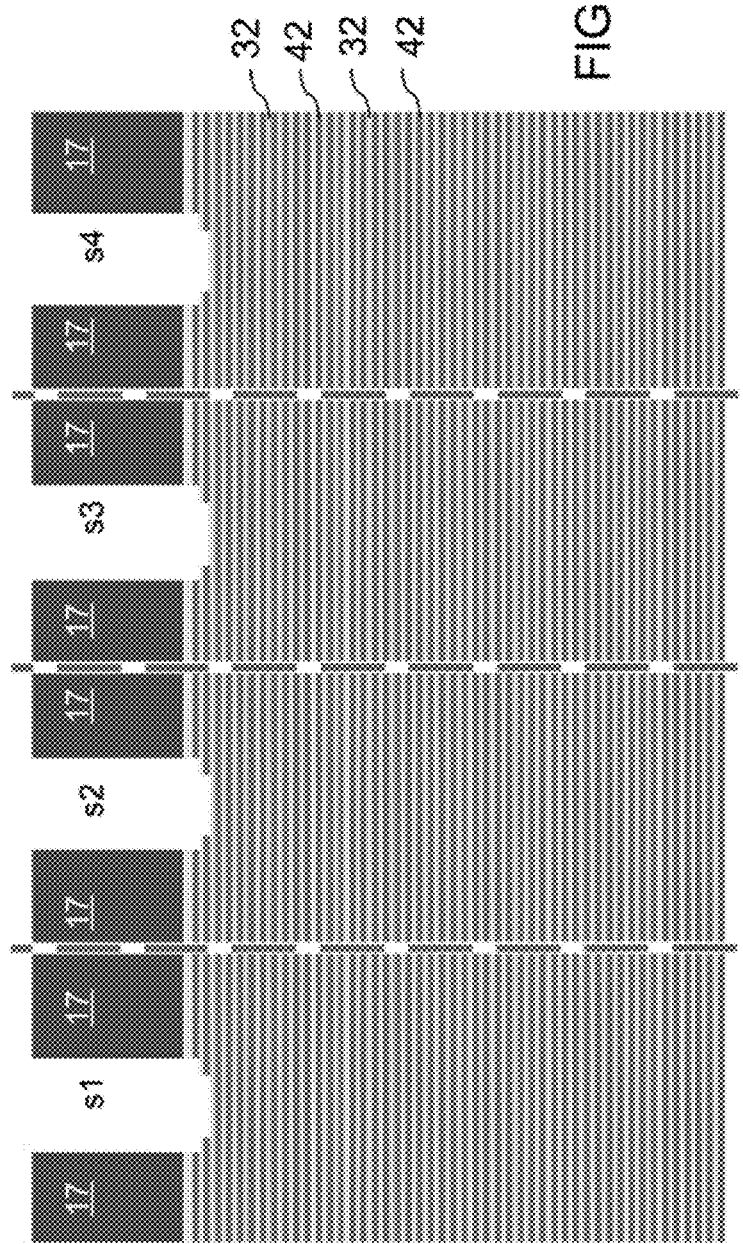
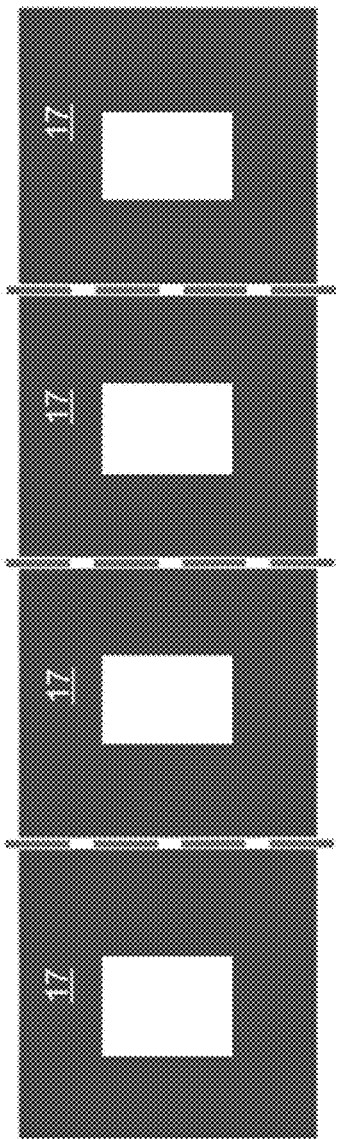
FIG. 12A
FIG. 12B

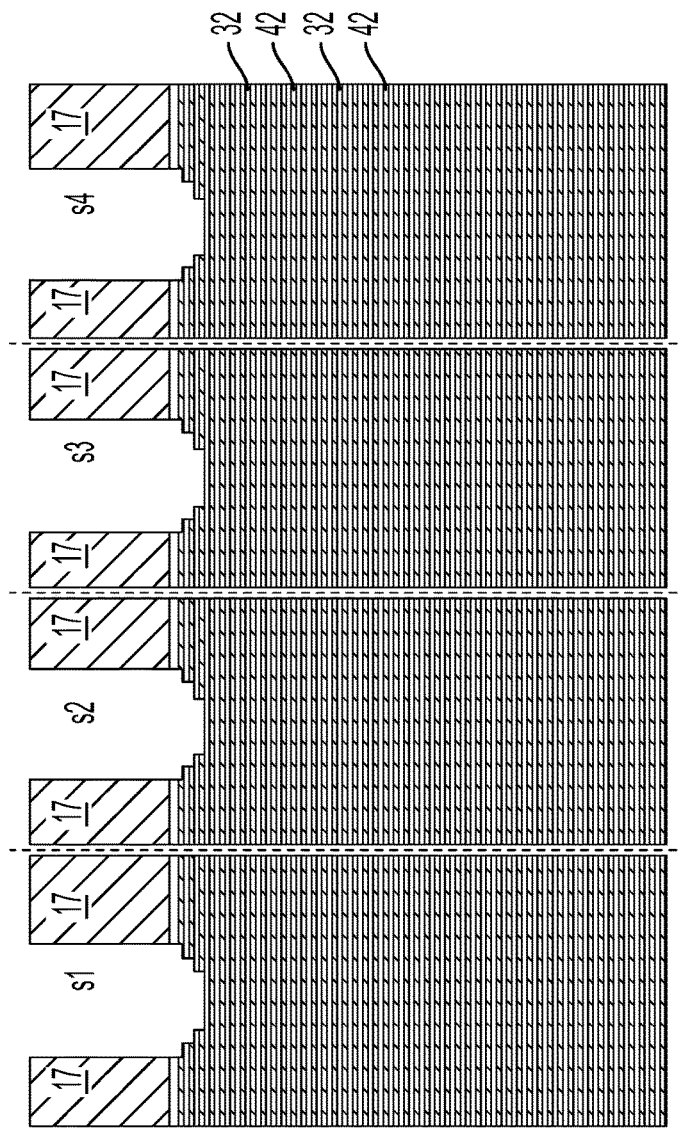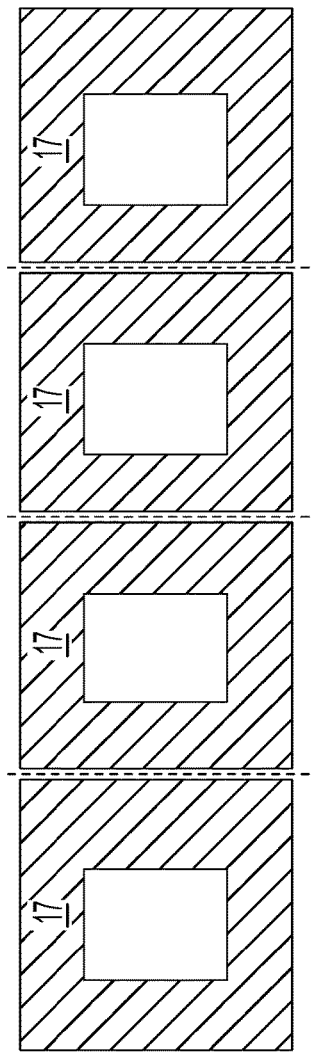
FIG. 13A
FIG. 13B

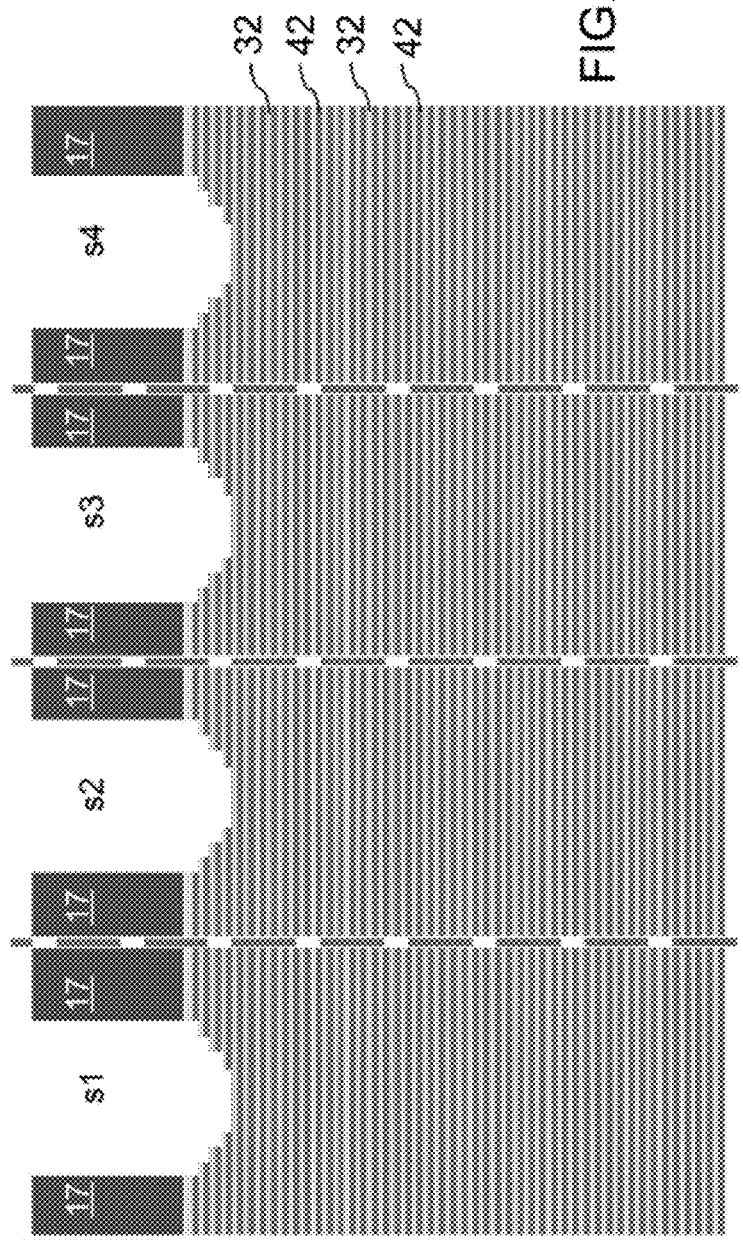
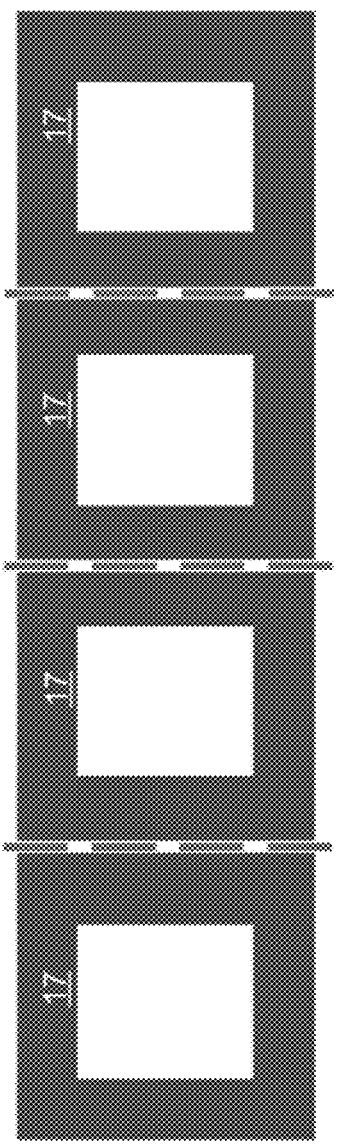

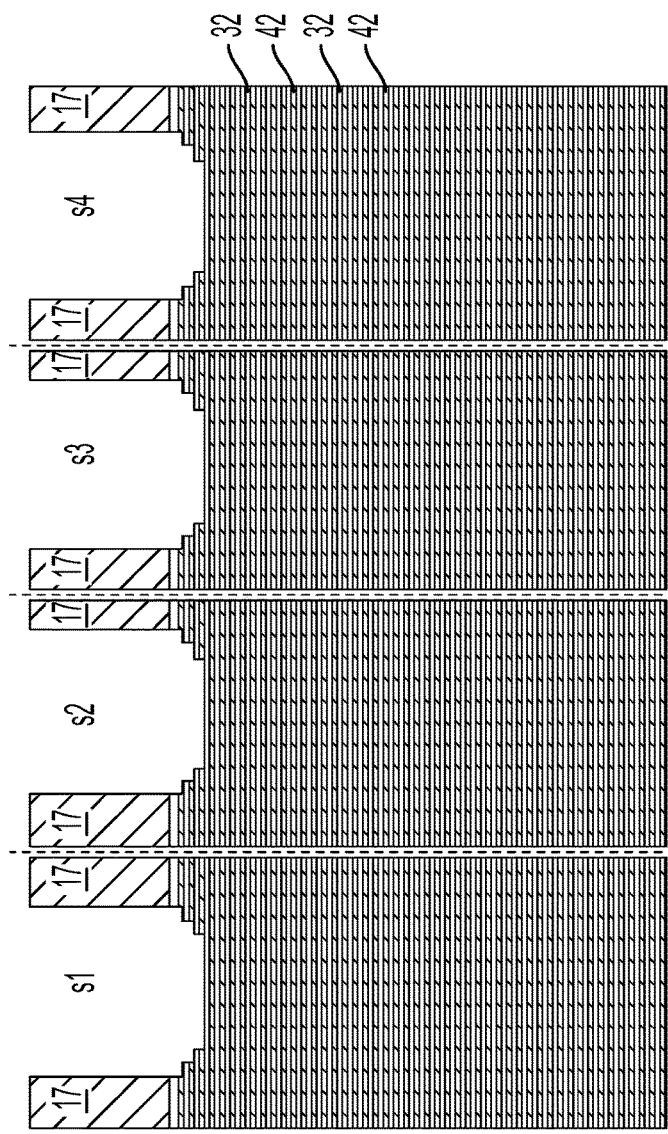
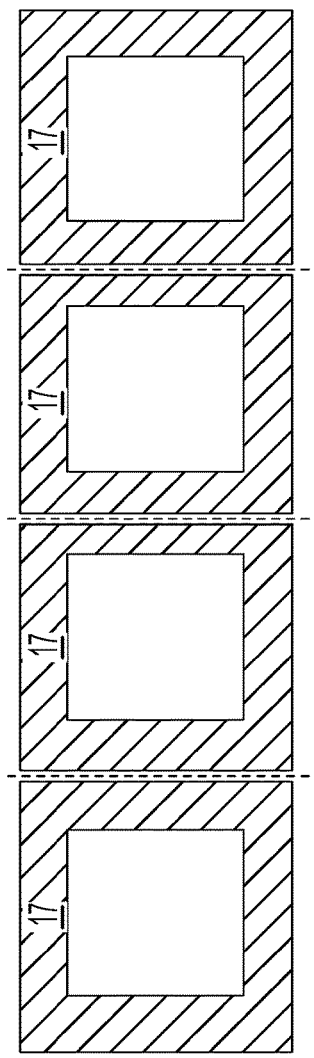
FIG. 15A
FIG. 15B

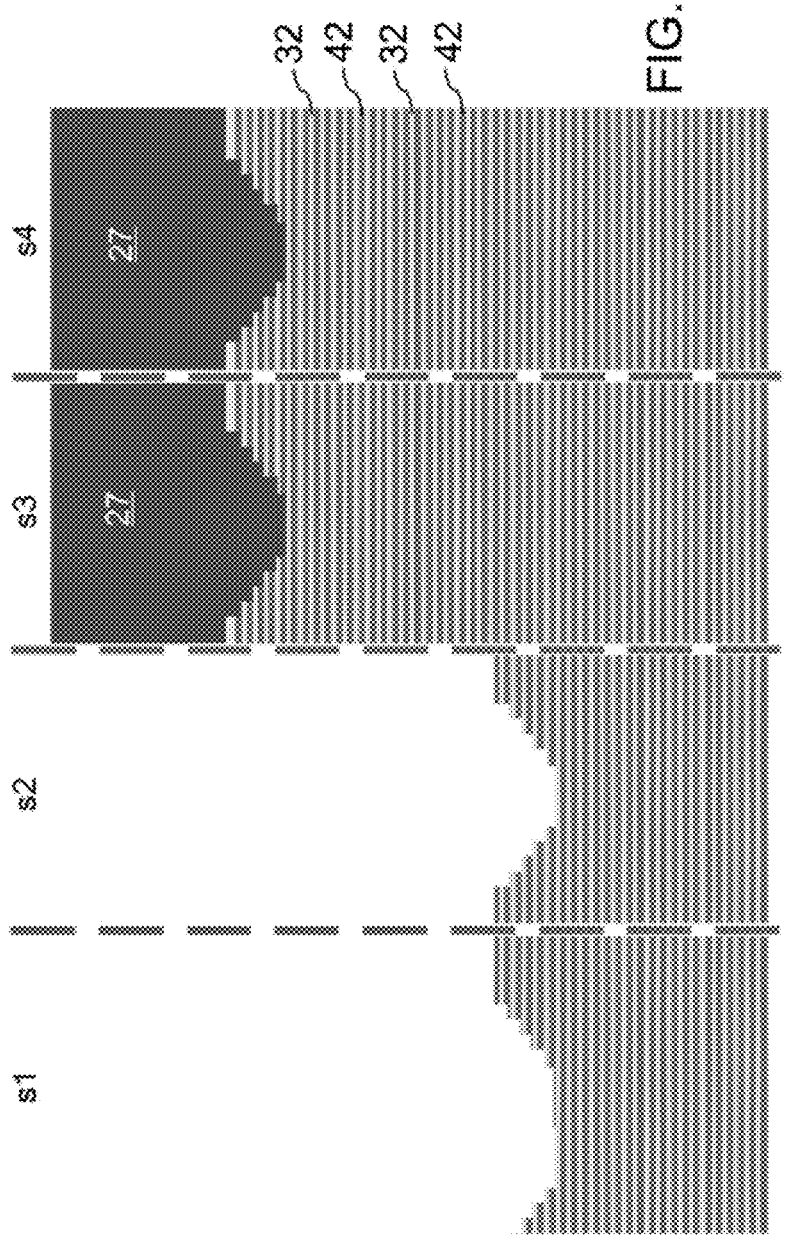
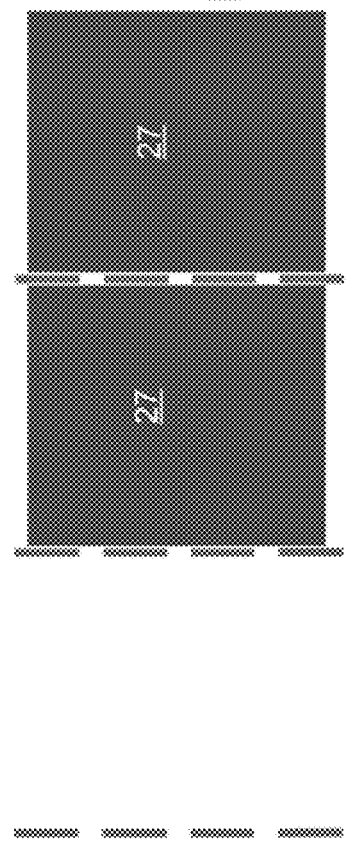

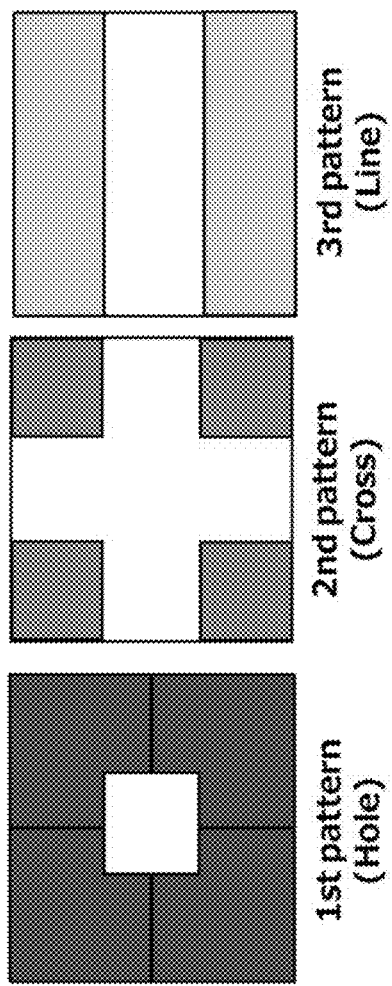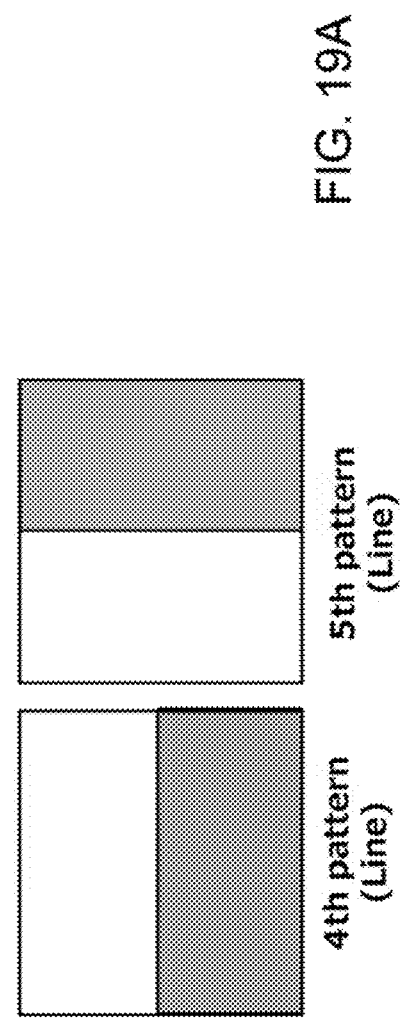
FIG. 19A

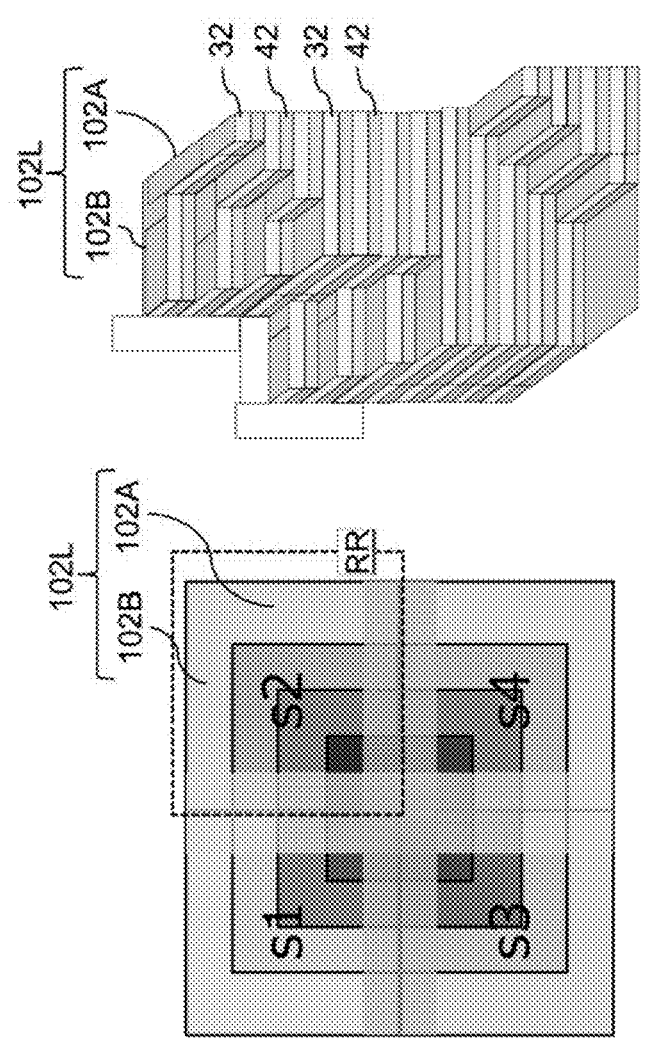

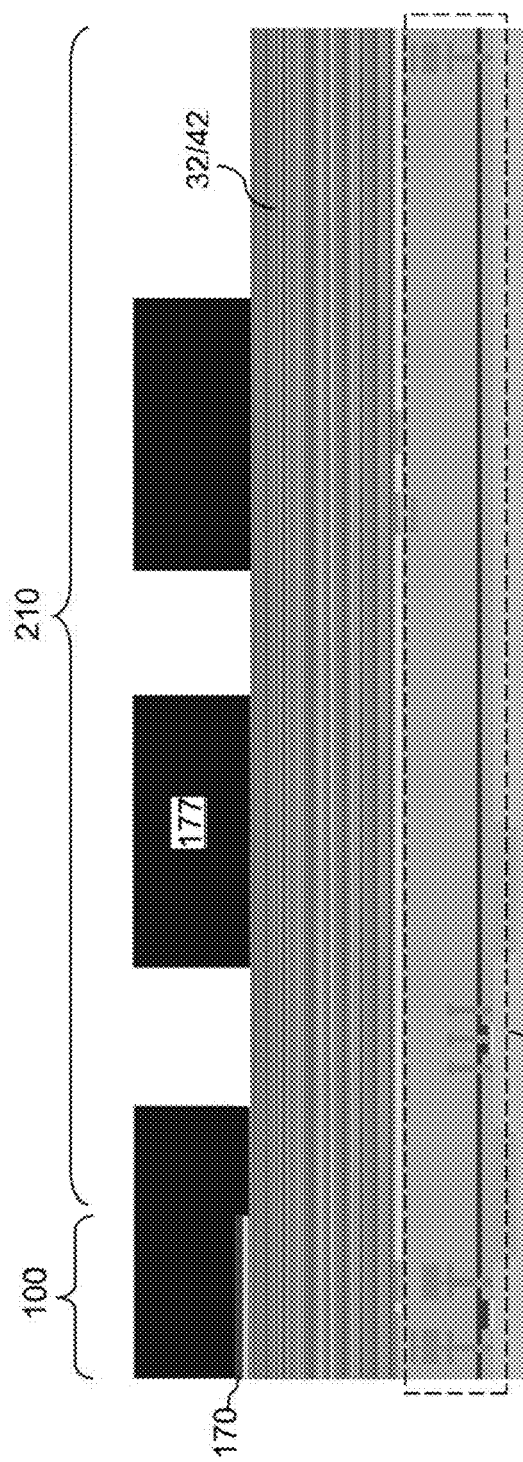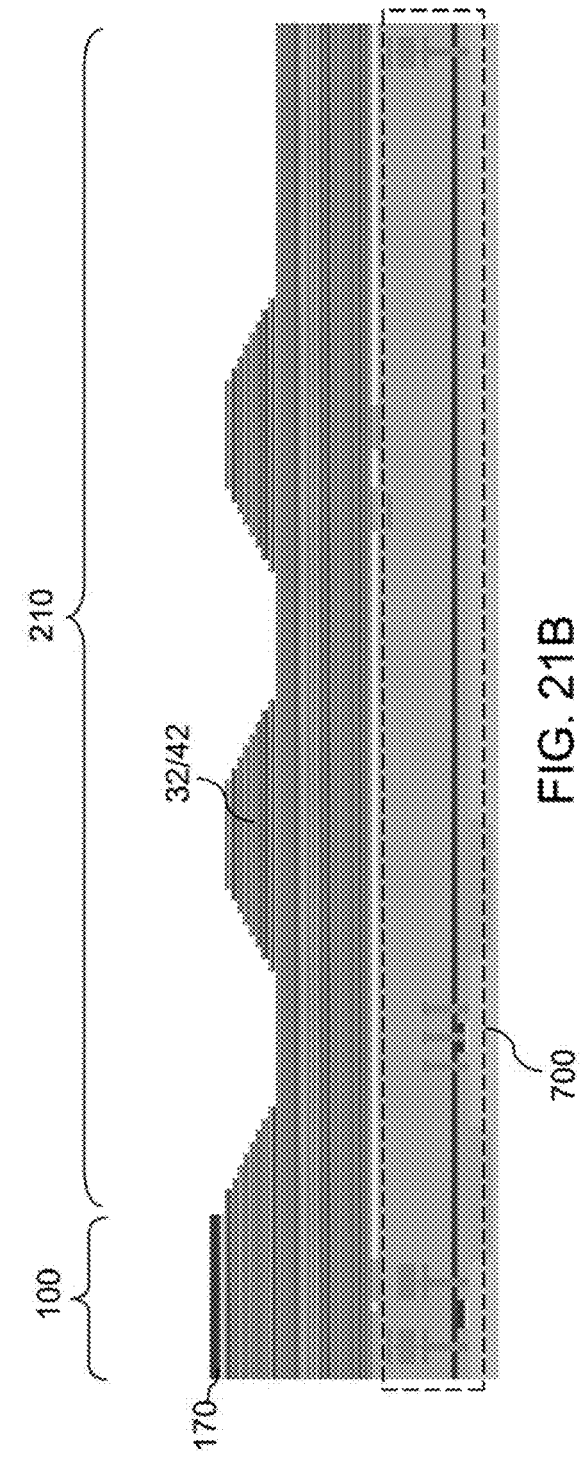

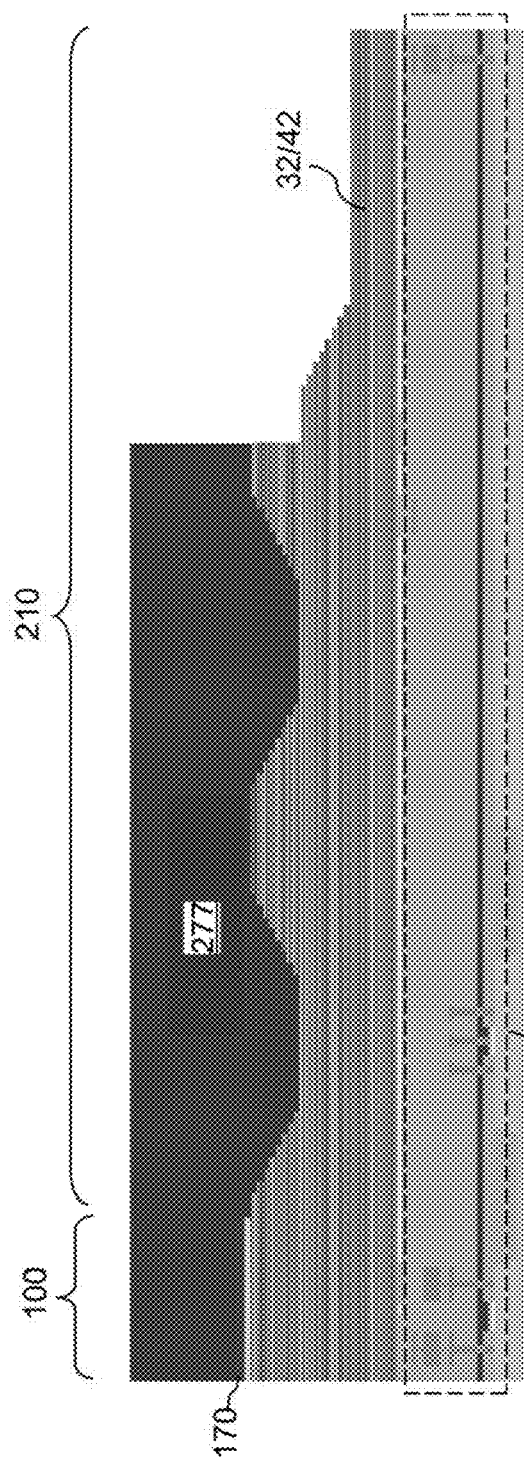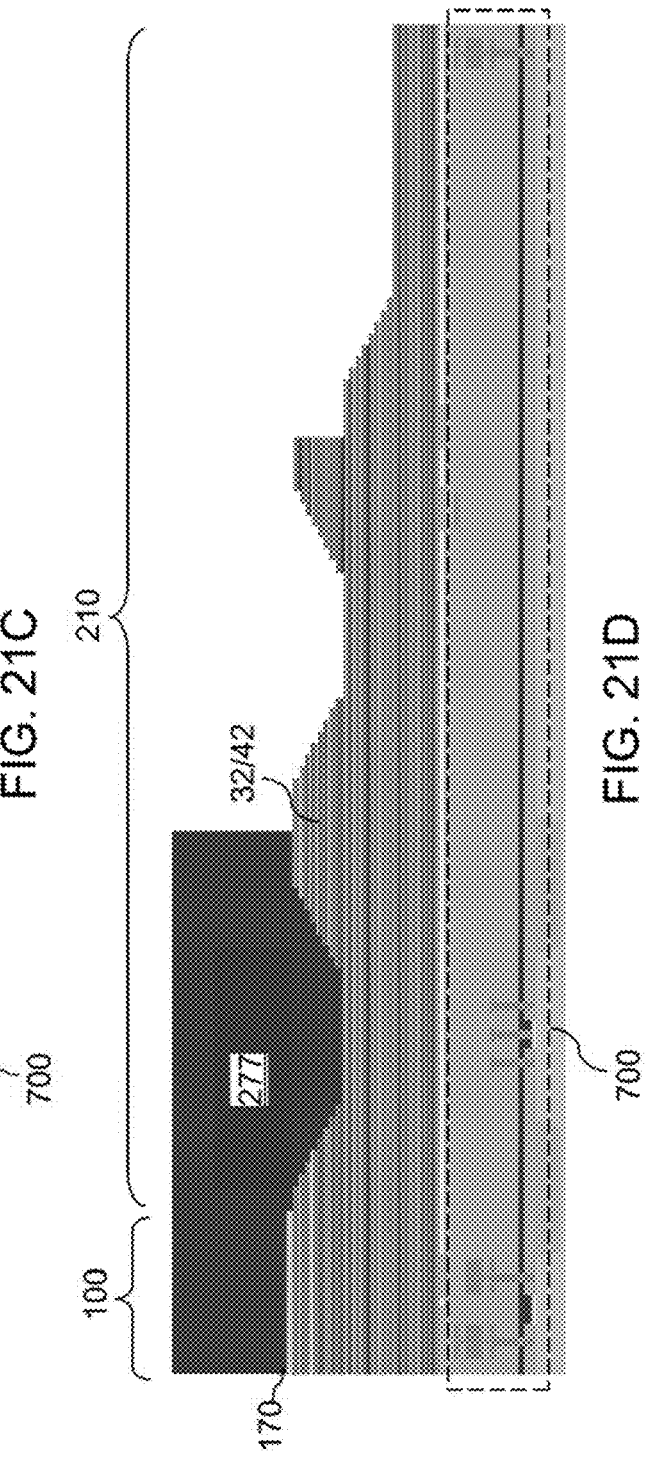

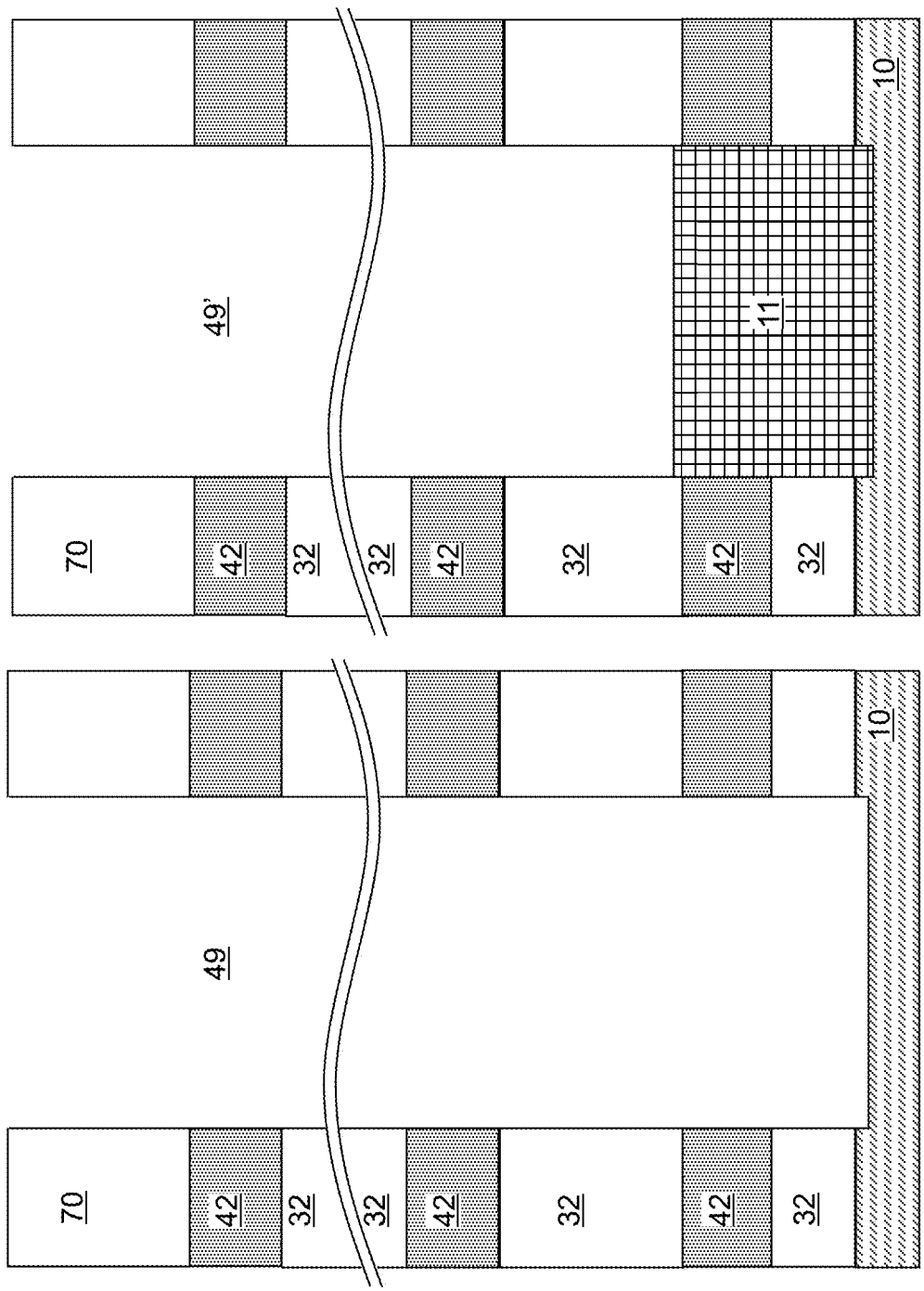

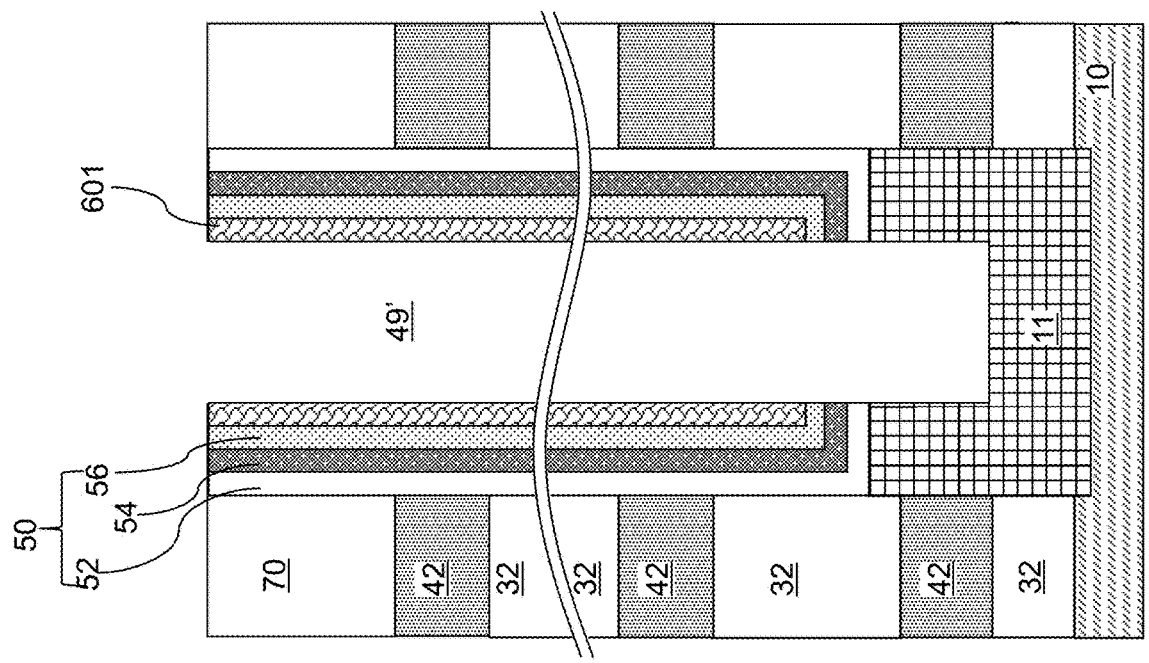
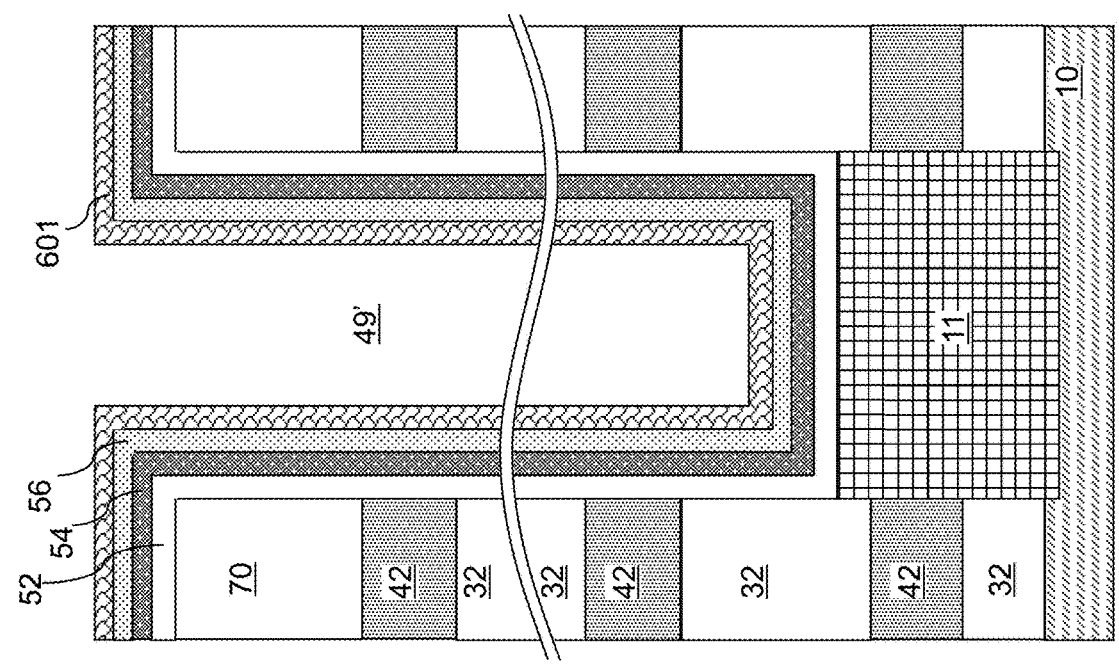

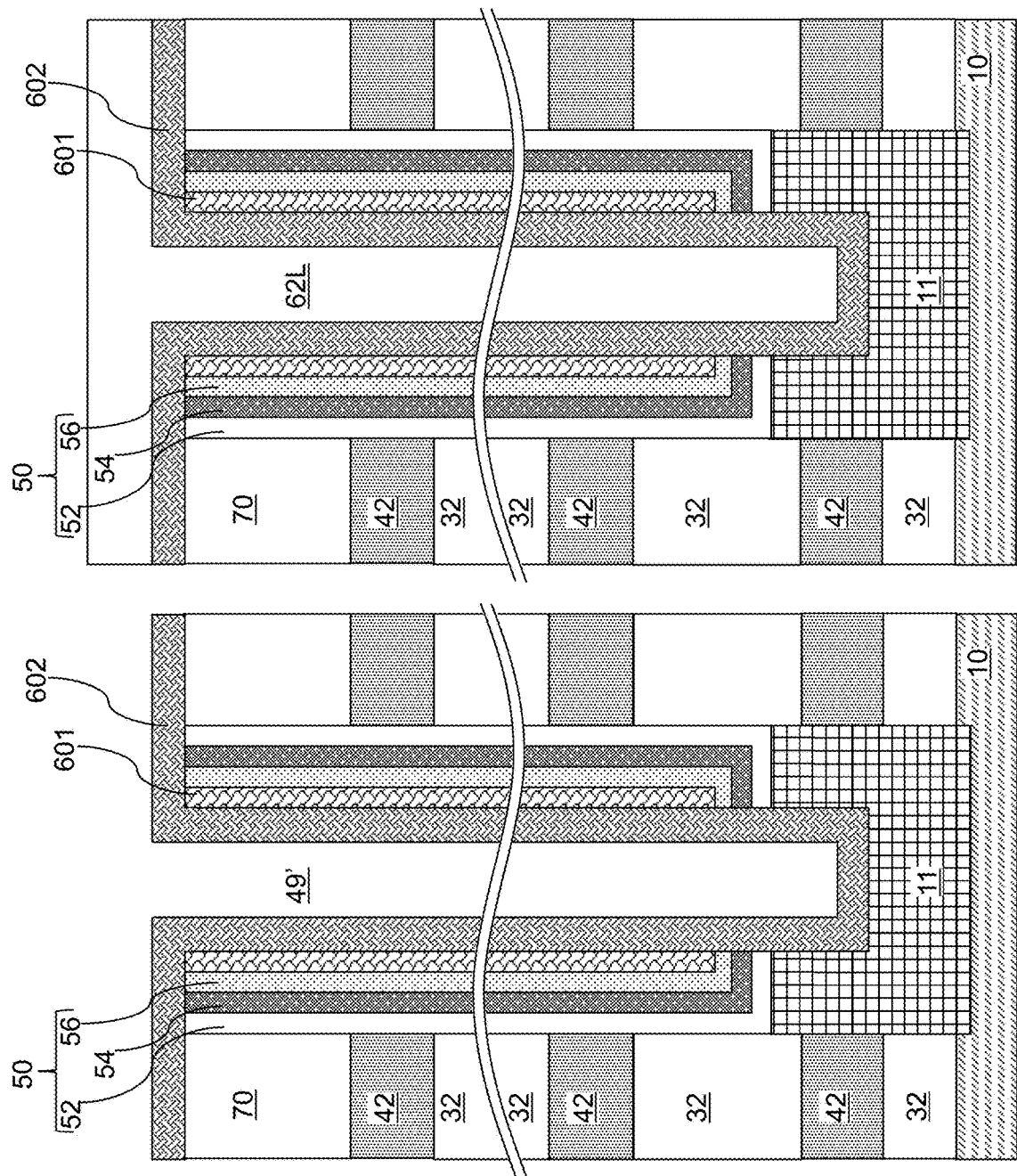

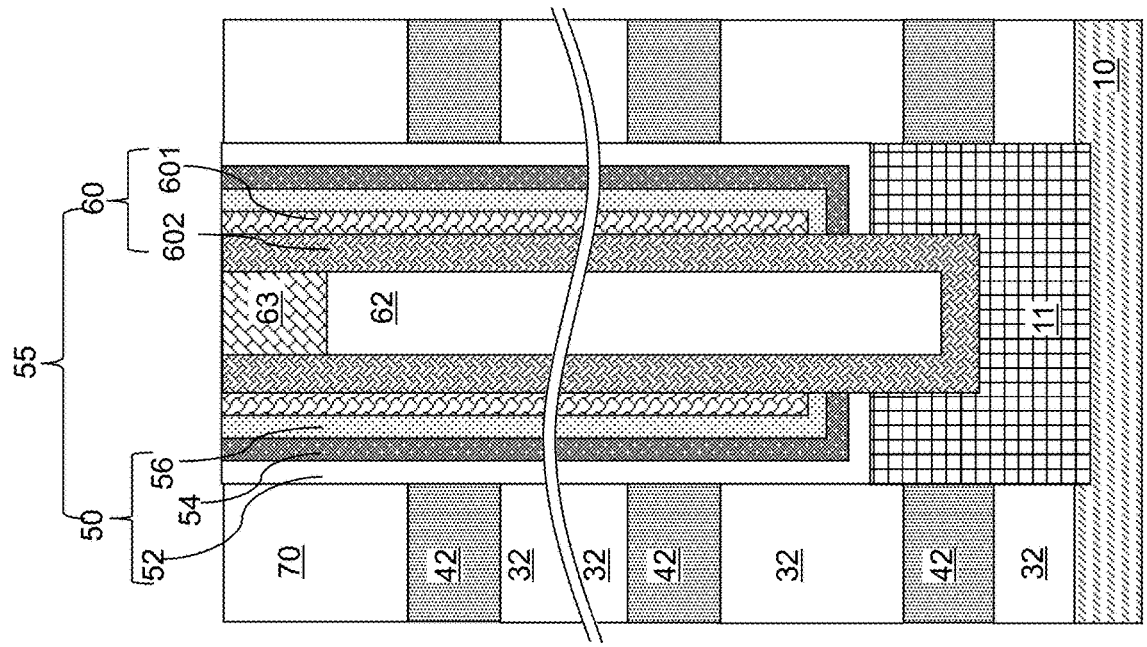
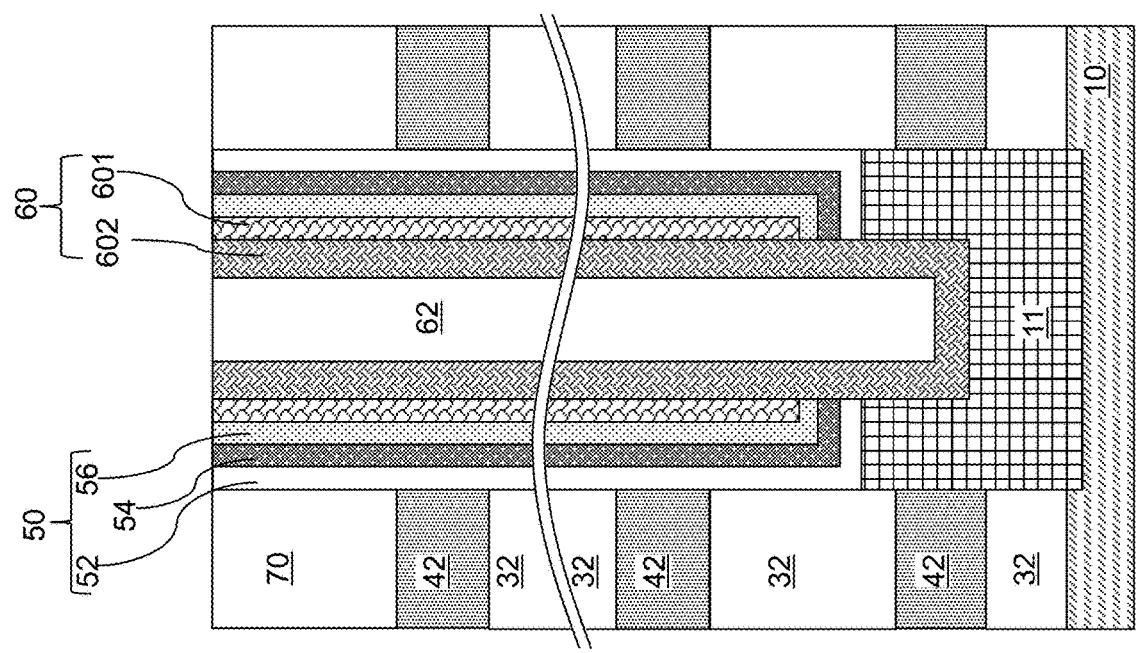

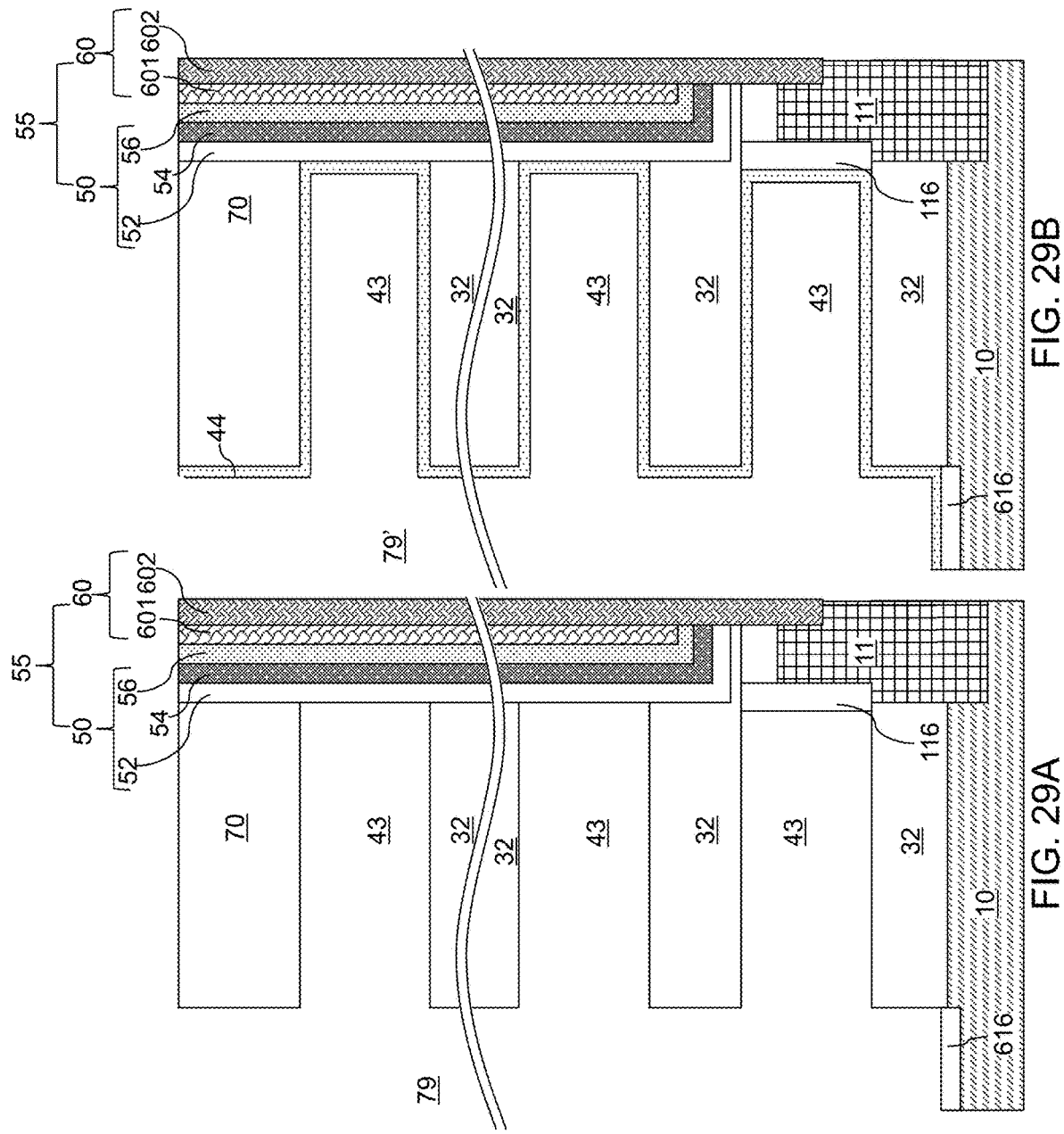

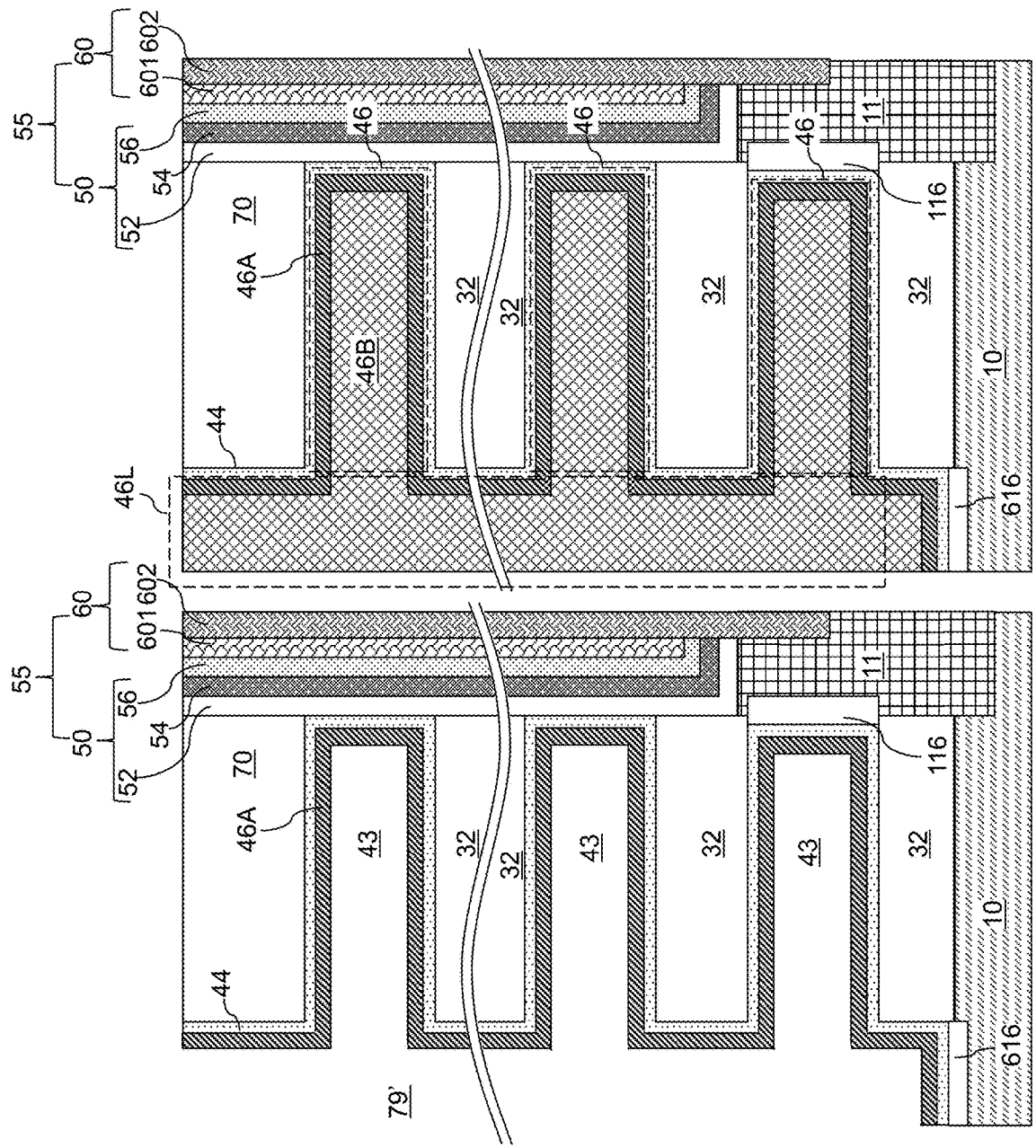

THREE-DIMENSIONAL MEMORY DEVICE CONTAINING BIDIRECTIONAL TAPER STAIRCASES AND METHODS OF MAKING THE SAME

FIELD

The present disclosure relates generally to the field of semiconductor devices, and particular to a three-dimensional memory device containing bidirectional taper staircases and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, memory stack structures vertically extending through the alternating stack, each memory stack structure including a memory film and a vertical semiconductor channel, and a contact well set that includes contact wells extending through a respective upper region of the alternating stack. Each of the contact wells contains first stepped surfaces which have a stepwise descending vertical profile along a first horizontal direction and second stepped surfaces which have a stepwise descending vertical profile along a second horizontal direction which is perpendicular to the first horizontal direction.

According to another aspect of the present disclosure, a method of forming a three-dimensional memory device includes forming an alternating stack of insulating layers and spacer material layers located over a substrate, wherein the spacer material layers are formed as, or are subsequently replaced with, electrically conductive layers, patterning the alternating stack to form a contact well set including contact wells that extend through a respective upper region of the alternating stack, wherein at least two different mask patterns having different geometric shapes are used during the step of patterning, and forming memory stack structures vertically extending through the alternating stack, wherein each of the memory stack structures comprises a memory film and a vertical semiconductor channel.

BRIEF DESCRIPTION OF THE DRAWINGS

FIG. 3 is a plan view of a first exemplary three-dimensional memory device incorporating the first exemplary structure according to the first embodiment of the present disclosure.

FIG. 4B is a vertical cross-sectional view of the first exemplary contact well set along the vertical plane B-B' of FIG. 4A.

FIG. 4C is a vertical cross-sectional view of the first exemplary contact well set along the vertical plane C-C' of FIG. 4A.

FIG. 7B is a vertical cross-sectional view of the second exemplary contact well set along the vertical plane B-B' of FIG. 7A.

FIG. 7C is a vertical cross-sectional view of the second exemplary contact well set along the vertical plane C-C' of FIG. 7A.

FIG. 10A illustrates composite vertical cross-sectional views of an in-process fourth exemplary contact well set along vertical planes X-X' and X'-X" of FIG. 10B.

FIG. 10B is a plan view of the in-process fourth exemplary contact well set of FIG. 10A.

FIG. 12A is composite vertical cross-sectional views of the in-process fourth exemplary contact well set after a first iteration of a trimming process and the anisotropic etch according to an embodiment of the present disclosure.

FIG. 12B is a composite top-down view of the in-process fourth exemplary contact well set at the processing steps of FIG. 12A.

FIG. 13A is composite vertical cross-sectional views of the in-process fourth exemplary contact well set after a second iteration of the trimming process and the anisotropic etch according to an embodiment of the present disclosure.

FIG. 13B is a composite top-down view of the in-process fourth exemplary contact well set at the processing steps of FIG. 13A.

FIG. 14A is composite vertical cross-sectional views of the in-process fourth exemplary contact well set after a third iteration of the trimming process and the anisotropic etch according to an embodiment of the present disclosure.

FIG. 14B is a composite top-down view of the in-process fourth exemplary contact well set at the processing steps of FIG. 14A.

FIG. 15A is composite vertical cross-sectional views of the in-process fourth exemplary contact well set an (N−1)-th iteration of the trimming process and the anisotropic etch according to an embodiment of the present disclosure.

FIG. 15B is a composite top-down view of the in-process fourth exemplary contact well set at the processing steps of FIG. 15A.

FIG. 16A is composite vertical cross-sectional views of the in-process fourth exemplary contact well set after formation of a first etch mask layer that covers the third and fourth contact wells and a first level-shifting anisotropic etch according to an embodiment of the present disclosure.

FIG. 16B is a composite top-down view of the in-process fourth exemplary contact well set at the processing steps of FIG. 16A.

FIG. 19A is a set of mask patterns that can be employed to pattern mask layers that can be employed to pattern a fifth exemplary contact well set according to an embodiment of the present disclosure.

FIG. 19B is a top-down view of the fifth exemplary contact well set that can be formed employing the set of mask patterns of FIG. 19A.

FIG. 19C is a perspective view of a rectangular region RR within the fifth exemplary contact well set of FIG. 19B.

FIGS. 21A-21F are sequential vertical cross-sectional views of a second exemplary semiconductor structure within the three-dimensional memory device of FIG. 20 along the vertical plane X-X' during formation of a combination of ascending vertical stepped surfaces and descending vertical stepped surfaces according to an embodiment of the present disclosure.

FIGS. 25A-25H are sequential schematic vertical cross-sectional views of a memory opening within the exemplary structure during formation of a memory stack structure, an optional dielectric core, and a drain region therein according to an embodiment of the present disclosure.

FIGS. 29A-29D are vertical cross-sectional views of a region of the first or second exemplary structure during formation of electrically conductive layers according to an embodiment of the present disclosure.

DETAILED DESCRIPTION

Figure 1:
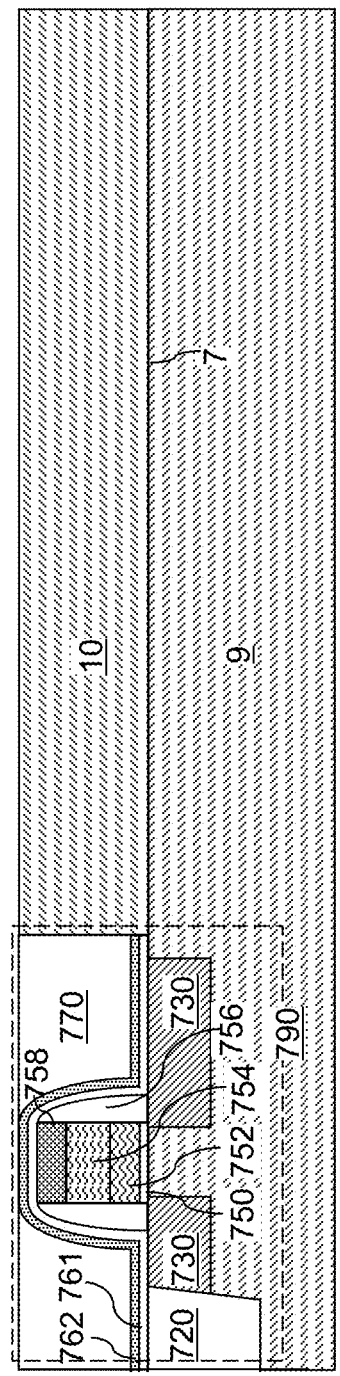
FIG. 1 is a schematic vertical cross-sectional view of a first exemplary structure after formation of at least one peripheral device and a semiconductor material layer according to a first embodiment of the present disclosure.

As discussed above, the present disclosure is directed to a three-dimensional memory device employing bidirectional taper staircase structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 790 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 790 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770. The region (i.e., area) of the at least one semiconductor device 790 is herein referred to as a peripheral device region.

Figure 2:
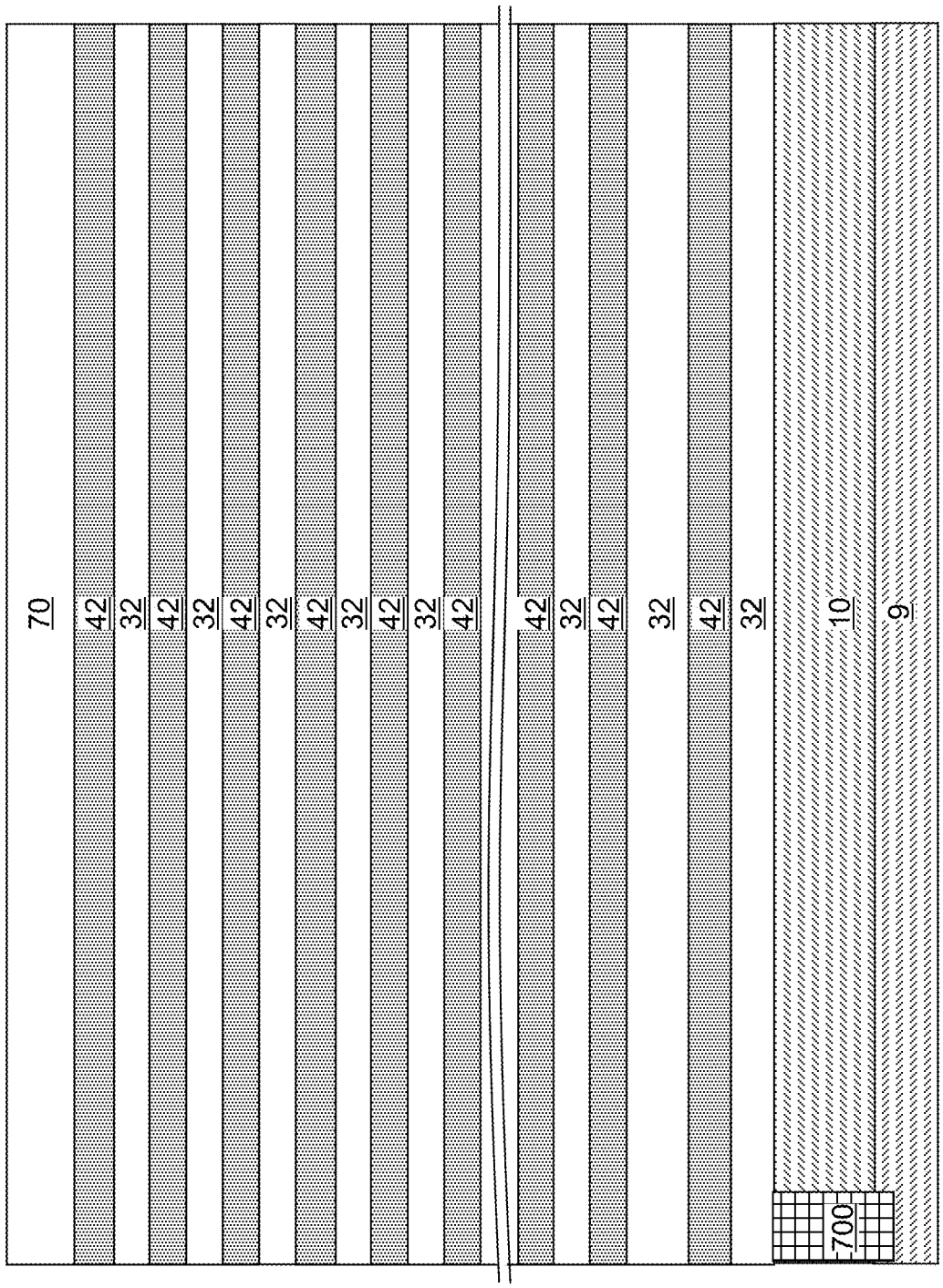
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, a plan view of an in-process first exemplary three-dimensional memory device incorporating the first exemplary structure of FIG. 2 is illustrated. The first in-process exemplary three-dimensional memory device includes the first exemplary structure of FIG. 2. The in-process first exemplary three-dimensional memory device includes a memory array region 100, at least one word line decoder region 400 that is also referred to as at least one row decoder region that contains word line driver circuitry, a sense amplifier region 500 including sense amplifiers connected to bit lines extending to the memory array region 100, and a peripheral device region 700 including the semiconductor devices 790, such as bit line driver circuitry. A contact region 200 including a first exemplary contact well set (s1, s2, s3, s4) can be formed within the area of the memory array region 100. The first exemplary contact well set (s1, s2, s3, s4) can be surrounded by memory stack structures to be formed later in the memory array region 100 instead of being located outside the memory array region 100 adjacent to one or more edges of the memory array region 100. In one embodiment, the memory array region 100 corresponds to a memory plane. Several memory planes (e.g., two to four memory planes) can be formed on the substrate at the same time.

Figure 4A:
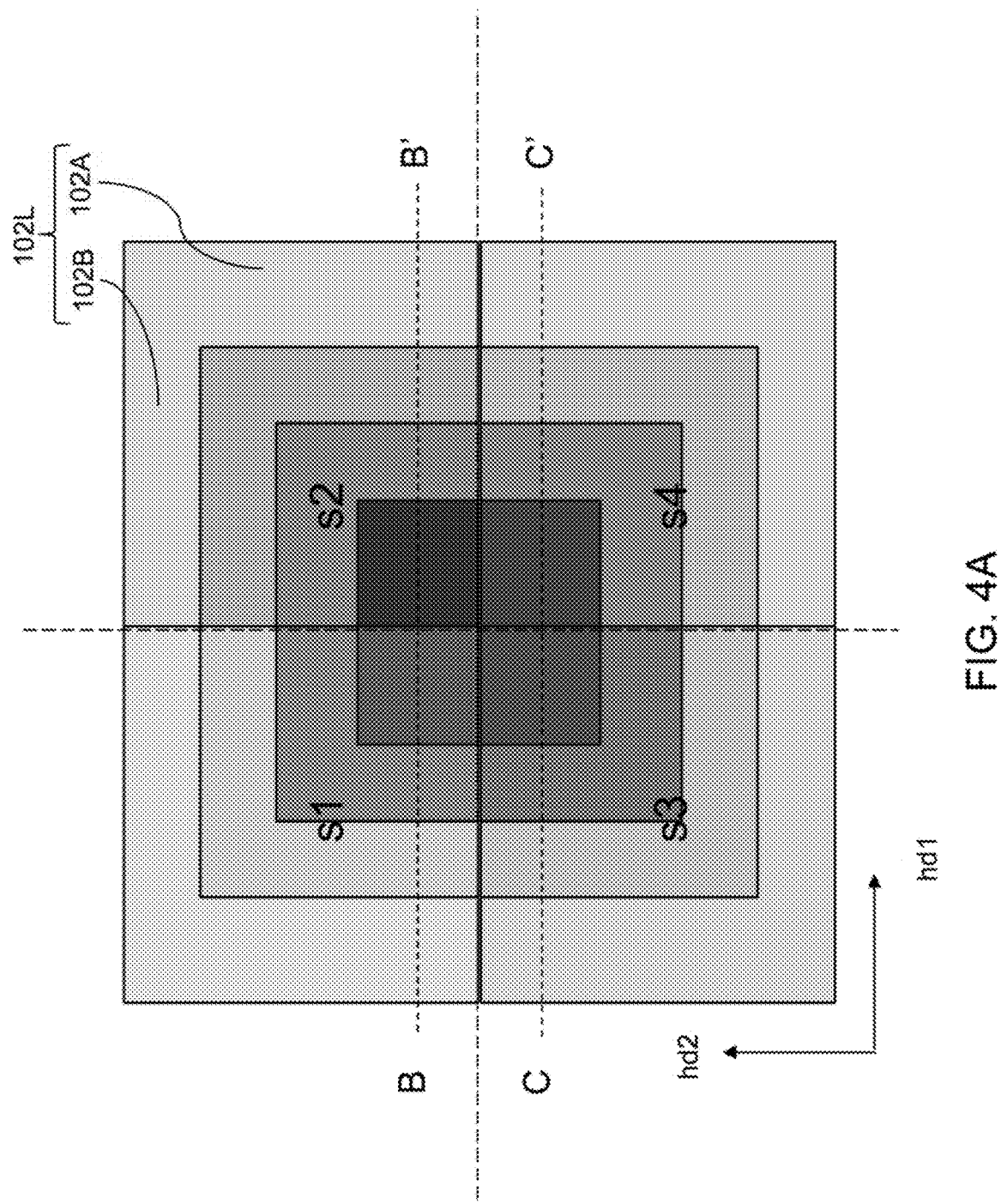
FIG. 4A is a plan view of a first exemplary contact well set that can be formed in the first exemplary structure.
Figure 5:
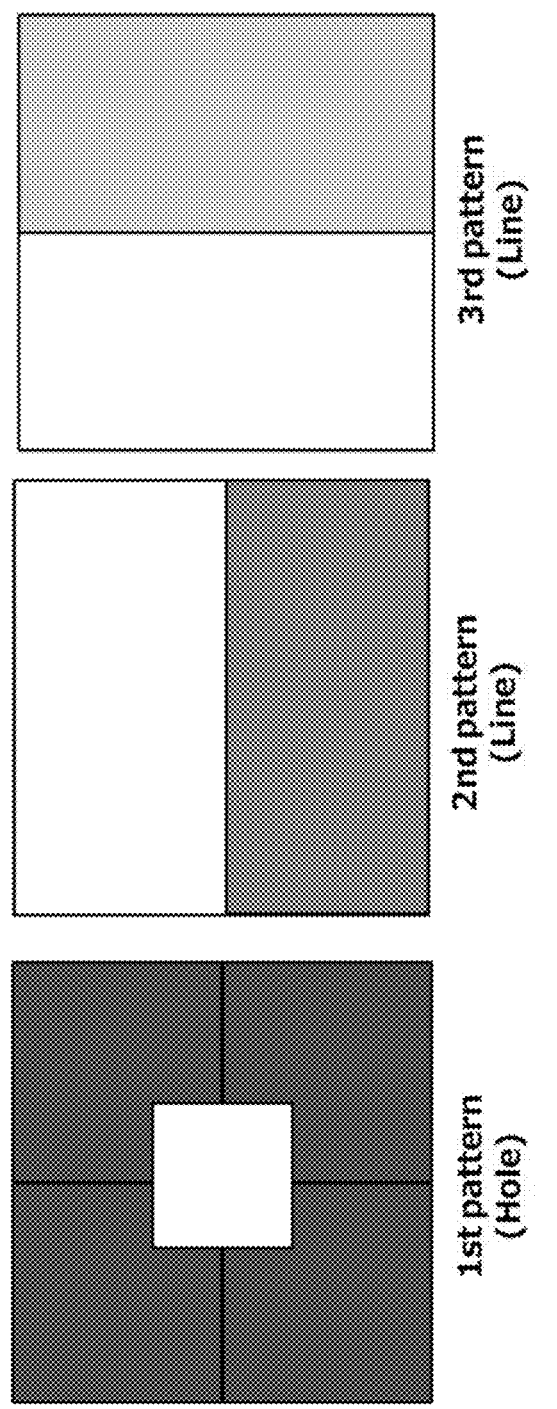
FIG. 5 is a set of mask patterns that can be employed to pattern mask layers that can be employed to pattern the first exemplary contact well set according to an embodiment of the present disclosure.

FIGS. 4A-4C provide various views of the first exemplary contact well set (s1, s2, s3, s4). The first exemplary contact well set (s1, s2, s3, s4) can be formed by patterning the alternating stack (32, 42). As used herein, a "contact well" is a recess in an alternating stack that contains steps of one or more staircases in which word line contact via structures will contact the word lines that will be formed in the alternating stack. While four contact wells are shown in FIGS. 4A-4C, three contact wells or more than four contact wells (e.g., five to eight contact wells) can be formed in the memory array region 100. Each contact well of the first exemplary contact well set (s1, s2, s3, s4) can extend through a respective upper region of the alternating stack (32, 42). The first exemplary contact well set (s1, s2, s3, s4) includes a respective set of nested vertical steps in which each vertical step laterally enclosing a respective inner vertical step in a top-down view is located above the respective inner vertical step in a vertical cross-sectional view. In one embodiment, the first exemplary contact well set (s1, s2, s3, s4) includes at least a first contact well s1 and a second contact well s2, and each horizontal surface of the second contact well s2 can be located above a topmost surface among horizontal surfaces of the first contact well s1. Each of the contact wells contains first stepped surfaces 102A which have a stepwise descending vertical profile along a first horizontal direction hd1 (e.g., word line direction) and second stepped surfaces 102B which have a stepwise descending vertical profile along a second horizontal direction hd2 (e.g., bit line direction) which is perpendicular to the first horizontal direction, as shown in FIG. 4A, Patterning of the first exemplary contact well set (s1, s2, s3, s4) can be performed employing a set of mask patterns. A first exemplary set of mask patterns that can be employed to form the first exemplary contact well set (s1, s2, s3, s4) is illustrated in FIG. 5. The first exemplary set of mask patterns includes a first mask pattern that generates a rectangular opening, a second mask pattern that generates a straight edge along a first horizontal direction, and a third mask pattern that generates a straight edge along a second horizontal direction that is perpendicular to the first horizontal direction. The first mask pattern can be employed to pattern a trimmable mask layer that provides a series of nested rectangular openings that increase with each trimming step, and defines the vertical edges arranged in nested rectangular shapes of the first exemplary contact well set (s1, s2, s3, s4). The second mask pattern can be employed to define a straight boundary between the first and second contact wells (s1, s2) and the third and fourth contact wells (s3, s4). The third mask pattern can be employed to define a straight boundary between the first and third contact wells (s1, s3) and the second and fourth contact wells (s2, s4). While the present disclosure is described employing embodiments in which the stepped surfaces include top surfaces of insulating layers 32, embodiments are expressly contemplated herein in which the stepped surfaces include top surfaces of sacrificial material layers 42 that are subsequently replaced with electrically conductive layers.

Figure 6:
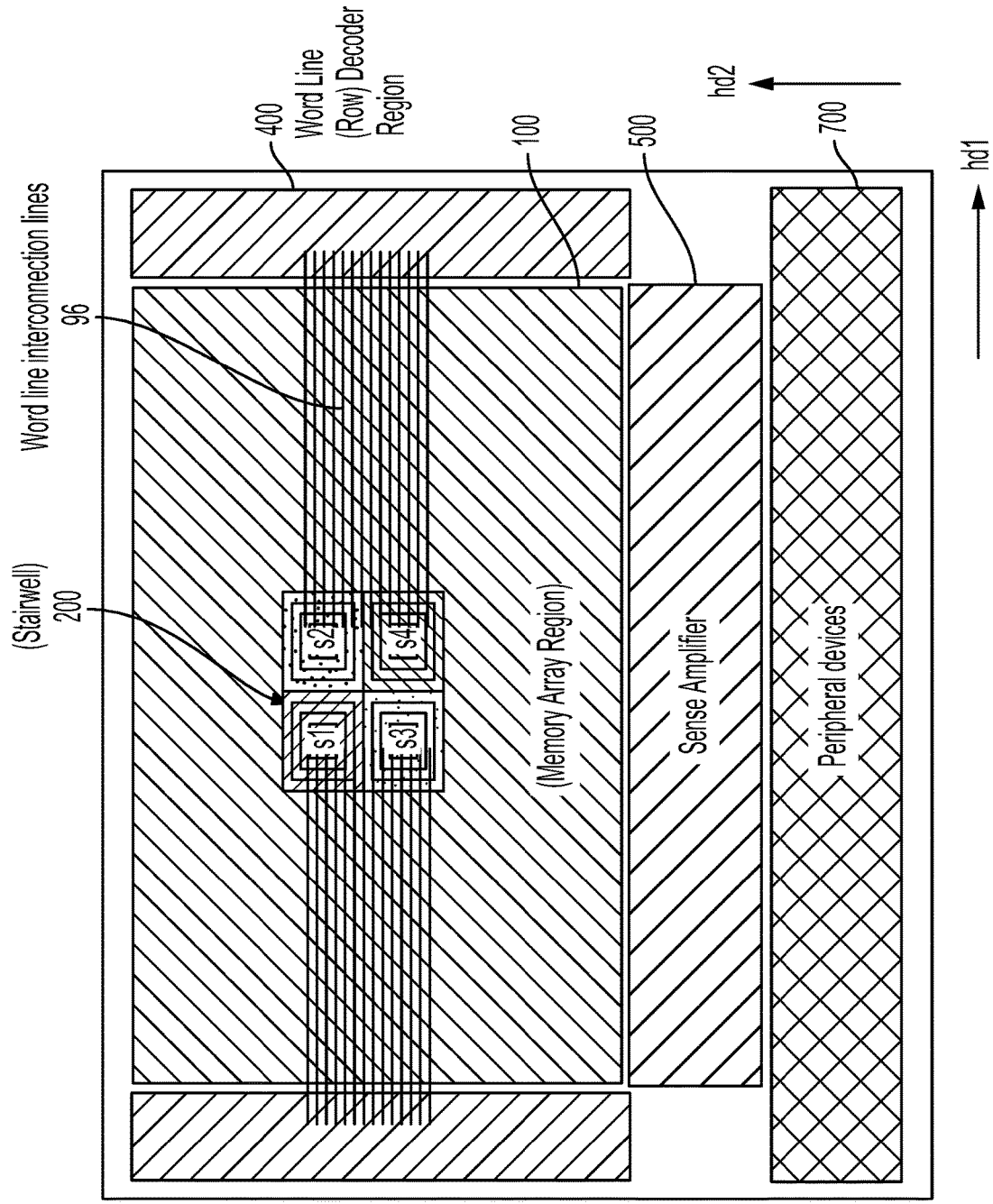
FIG. 6 is a plan view of a first alternative configuration of the first exemplary three-dimensional memory device after formation of contact via structures and word line interconnection lines according to an embodiment of the present disclosure.
Figure 33:
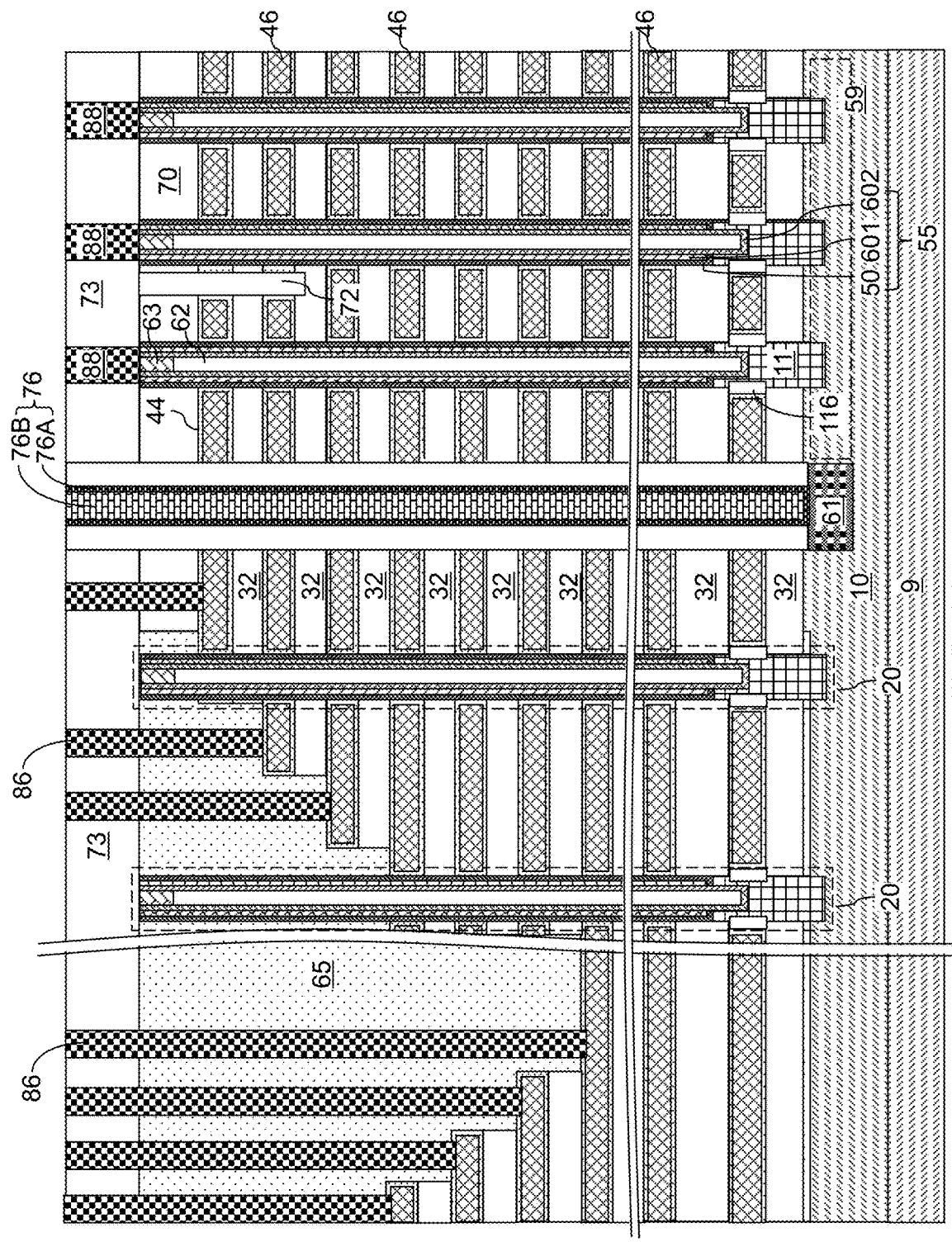
FIG. 33 is a schematic vertical cross-sectional view of the first or second exemplary structure after formation of additional contact via structures according to an embodiment of the present disclosure.

Referring to FIG. 6, a first alternative configuration of the first exemplary structure incorporating a second exemplary contact well set (s1, s2, s3, s4) is illustrated. Generally, after formation of contact wells (s1, s2, s3, s4) of any embodiment of the present disclosure, memory stack structures can be formed in the memory array region 100 of the in-process first exemplary three-dimensional memory device. If the spacer material layers are formed as sacrificial material layers 42, the sacrificial material layers 42 can be replaced with electrically conductive layers 46, as will be described below with respect to FIGS. 29A to 31. The electrically conductive layers 46 can be word lines for the memory stack structures 55. Word line contact via structures 86 can be formed on each of the electrically conductive layers in the first or second exemplary contact well set (s1, s2, s3, s4), as will be described below with respect to FIG. 33. Word line interconnection lines 96 can be formed in electrically contact with the word line contact via structures 86 and extend over the alternating stack of insulating layers 32 and electrically conductive layers 46 between the contact wells (s1, s2, s3, s4) and the word line decoder regions 400, as will be described below with respect to FIG. 34.

Figure 7A:
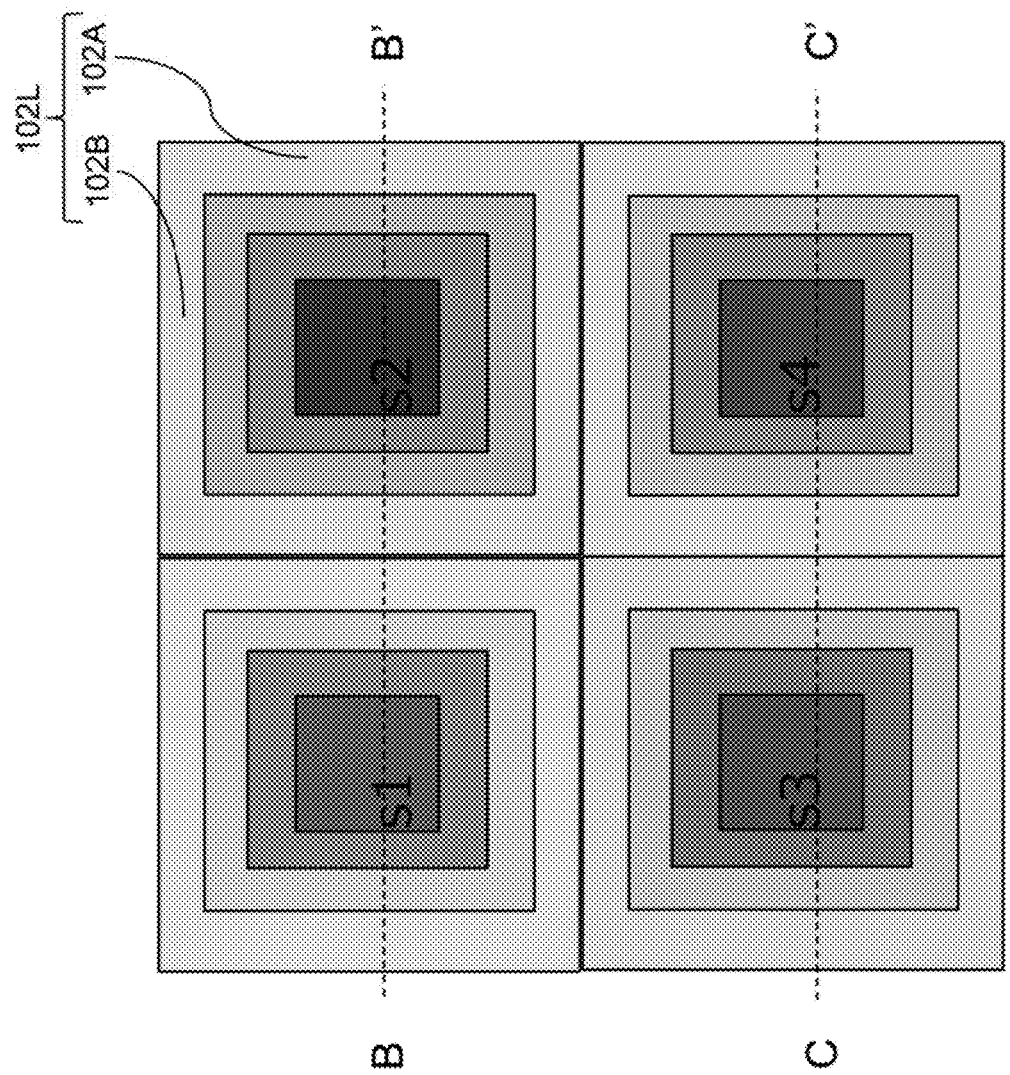
FIG. 7A is a plan view of a second exemplary contact well set that can be formed in the first exemplary structure.

Referring to FIGS. 7A-7C, the second exemplary contact well set (s1, s2, s3, s4) is illustrated, which are incorporated into the first alternative configuration of the first exemplary structure illustrated in FIG. 6. The second exemplary contact well set (s1, s2, s3, s4) can be formed by patterning the alternating stack (32, 42). Each of the second exemplary contact well set (s1, s2, s3, s4) can extend through a respective upper region of the alternating stack (32, 42). The second exemplary contact well set (s1, s2, s3, s4) includes a respective set of nested vertical steps in which each vertical step laterally enclosing a respective inner vertical step in a top-down view is located above the respective inner vertical step in a vertical cross-sectional view. In one embodiment, the second exemplary contact well set (s1, s2, s3, s4) includes at least a first contact well s1 and a second contact well s2, and each horizontal surface of the second contact well s2 can be located above a topmost surface among horizontal surfaces of the second contact well s1.

Figure 8:
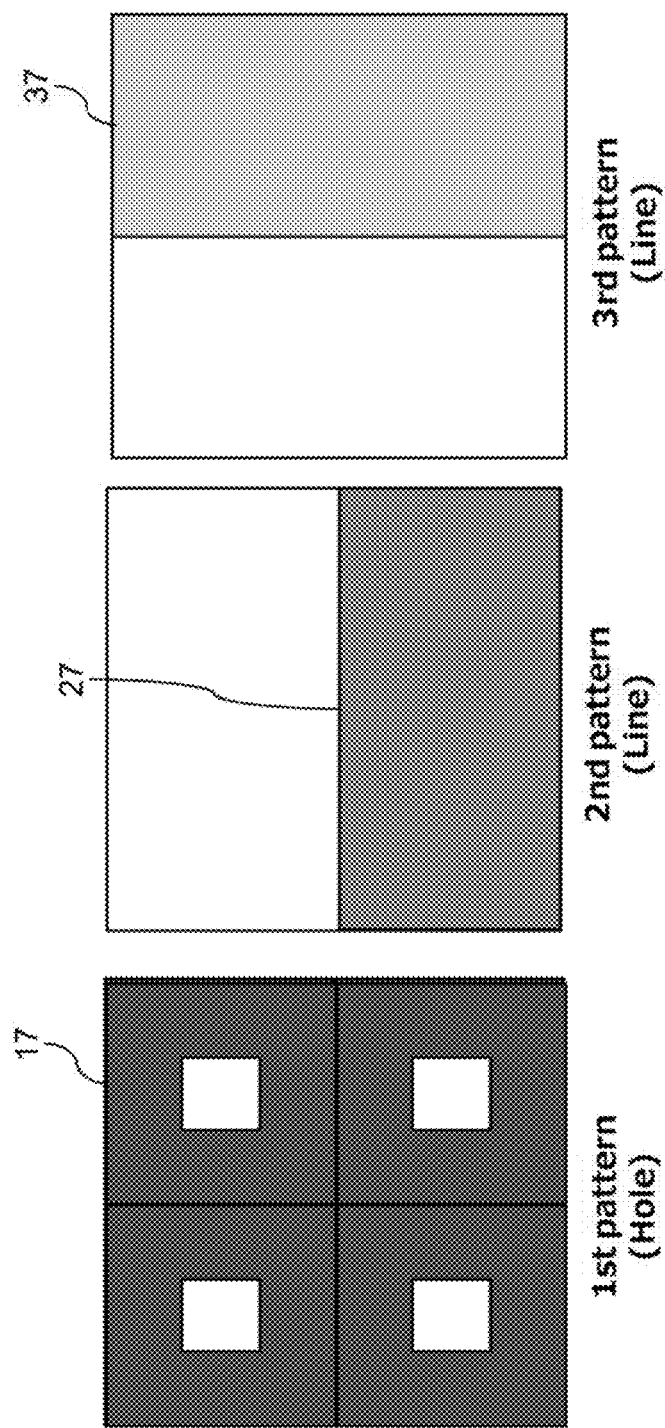
FIG. 8 is a set of mask patterns that can be employed to pattern mask layers that can be employed to pattern the second exemplary contact well set according to an embodiment of the present disclosure.

Patterning of the second exemplary contact well set (s1, s2, s3, s4) can be performed employing a set of mask patterns. A second exemplary set of mask patterns that can be employed to form the second exemplary contact well set (s1, s2, s3, s4) is illustrated in FIG. 8. The second exemplary set of mask patterns includes a first mask pattern 17 that generates four rectangular openings, a second mask pattern 27 that generates a straight edge along a first horizontal direction, and a third mask pattern 37 that generates a straight edge along a second horizontal direction that is perpendicular to the first horizontal direction. The first mask pattern can be employed to pattern a trimmable mask layer that provides four sets of nested rectangular openings that increase with each trimming step, and defines the vertical edges arranged in four sets of nested rectangular shapes of the second exemplary contact well set (s1, s2, s3, s4). The second mask pattern can be employed to define a straight boundary between the first and second contact wells (s1, s2) and the third and fourth contact wells (s3, s4). The third mask pattern can be employed to define a straight boundary between the first and third contact wells (s1, s3) and the second and fourth contact wells (s2, s4).

Figure 9:
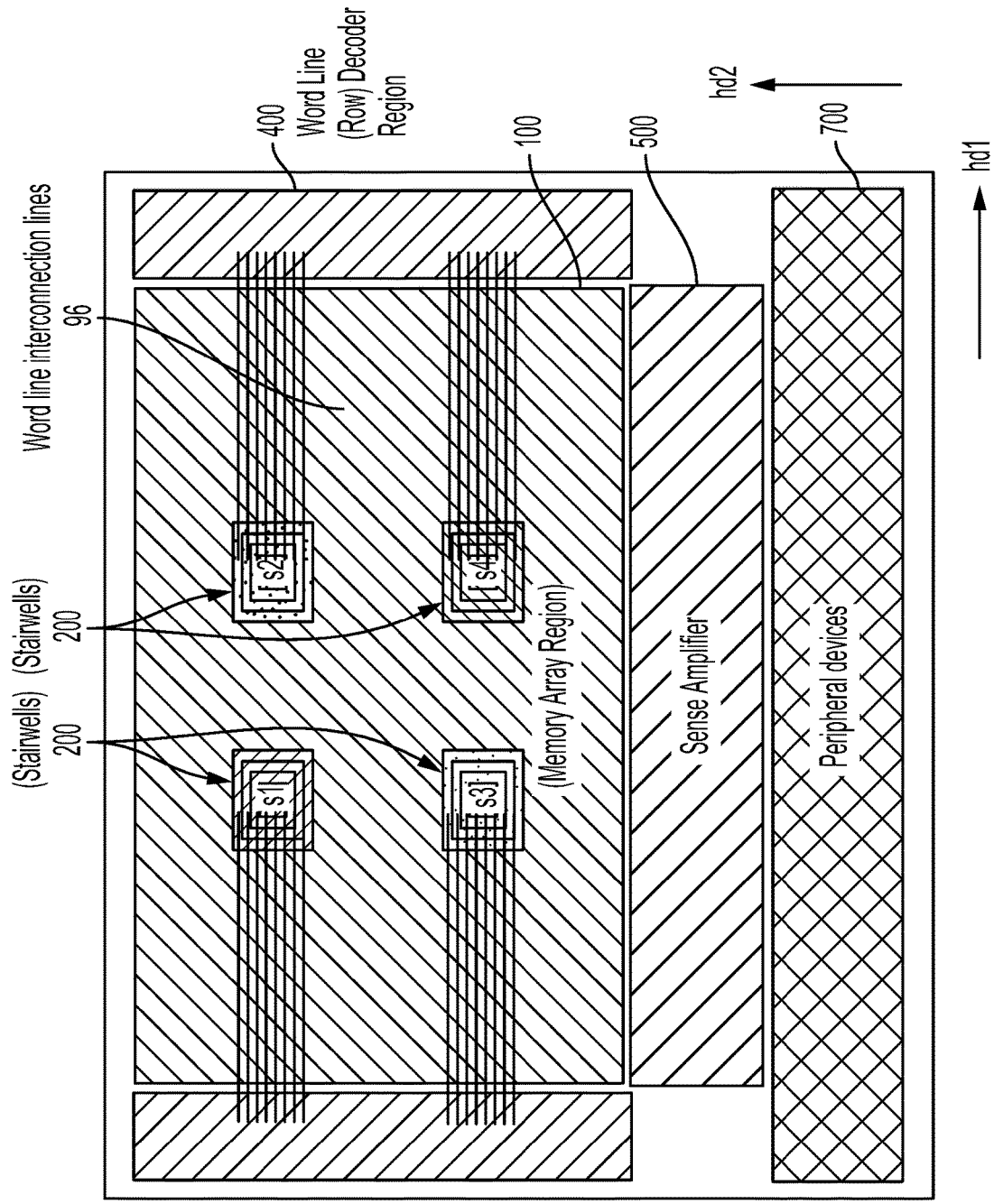
FIG. 9 is a plan view of a second alternative configuration of the first exemplary three-dimensional memory device after formation of contact via structures and word line interconnection lines according to an embodiment of the present disclosure.

Referring to FIG. 9, a second alternative configuration of the first exemplary three-dimensional memory device is illustrated after formation of contact via structures and word line interconnection lines. The second alternative configuration of the first exemplary structure includes a third exemplary contact well set (s1, s2, s3, s4). The third exemplary contact well set (s1, s2, s3, s4) includes four isolated contact wells. As used herein, isolated contact wells are contact wells that do not physically contact borders of nearest neighbor contact wells, such that memory stack structures can be formed between two isolated contact wells. The isolated contact wells include a first contact well s1, a second contact well s2, a third contact well s3, and a fourth contact well s4. The third exemplary contact well set (s1, s2, s3, s4) can be formed by employing the processing steps for forming the second exemplary contact well set (s1, s2, s3, s4) with modifications to the mask patterns. For example, a first mask pattern with four rectangular openings, a second mask pattern with two rectangular openings, and a third mask pattern with two rectangular openings can be employed to form the third exemplary contact well set (s1, s2, s3, s4). Contact via structures can be formed on the electrically conductive layers, and word line interconnection lines can be subsequently formed.

Referring to FIGS. 10A and 10B, an in-process fourth exemplary contact well set (s1, s2, s3, s4) is illustrated. FIG. 10A illustrates composite vertical cross-sectional views of the in-process fourth exemplary contact well set (s1, s2, s3, s4) along vertical planes X-X' and X'-X" of FIG. 10B. FIG. 10B is a plan view of the in-process fourth exemplary contact well set (s1, s2, s3, s4) of FIG. 10A. The two vertical cross-sectional views of the in-process fourth exemplary contact well set (s1, s2, s3, s4) along vertical planes X-X' and X'-X" of FIG. 10B are juxtaposed in the composite vertical cross-sectional views of FIG. 10A. The illustrated structure of FIGS. 10A and 10B can be the portion of the first exemplary structure of FIG. 2 in which a fourth exemplary contact well set (s1, s2, s3, s4) is to be subsequently formed.

Figure 11A:
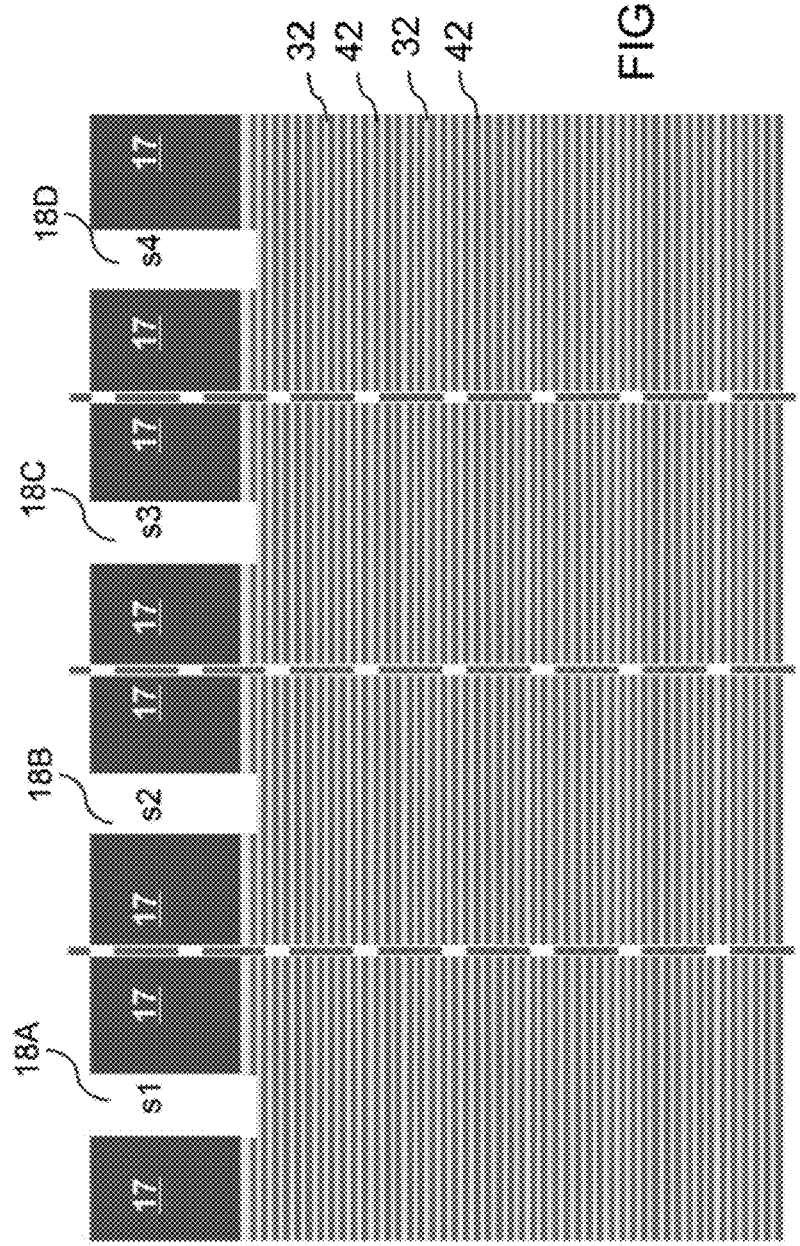
FIG. 11A is composite vertical cross-sectional views of the in-process fourth exemplary contact well set after formation of an trimmable mask layer including four openings, and an anisotropic etch that etches a topmost insulating layer and a topmost sacrificial material layer within each opening according to an embodiment of the present disclosure.
Figure 11B:
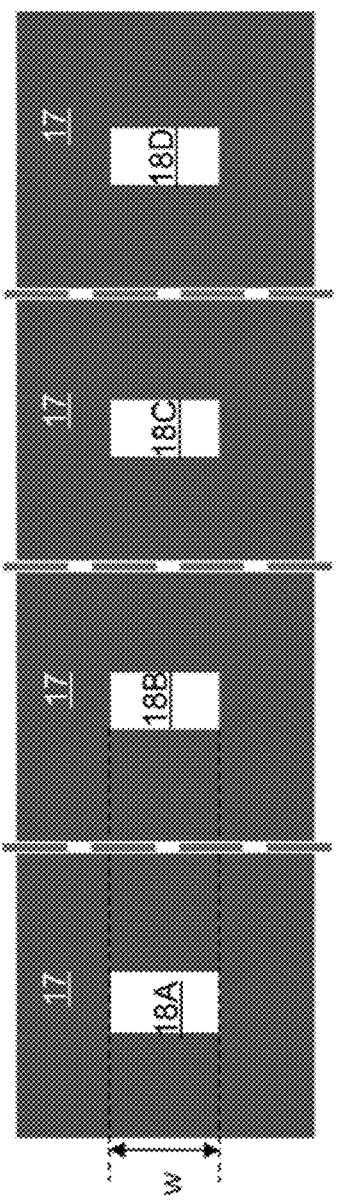
FIG. 11B is a composite top-down view of the in-process fourth exemplary contact well set at the processing steps of FIG. 11A.

Referring to FIGS. 11A and 11B, a trimmable mask layer 17 can be formed over the alternating stack (32, 42). The trimmable mask layer 17 corresponds to the first mask pattern 17 shown in FIG. 8. The trimmable mask layer 17 includes an opening within each area of contact wells (s1, s2, s3, s4). The openings 18A to 18D can include a first rectangular opening 18A in the area of a first contact well s1, a second rectangular opening 18B in the area of a second contact well s2, a third rectangular opening 18C in the area of a third contact well s3, and a fourth rectangular opening 18D in the area of a fourth contact well s4. Generally, any polygonal opening or any curvilinear opening may be employed in lieu of a rectangular opening. The trimmable mask layer 17 can be a photoresist layer. Alternatively, the trimmable mask layer can includes a trimmable mask material other than photoresist, such as a carbon-based material that can be controllably trimmed by ashing or isotropic etching. For example, the trimmable mask layer 17 can include amorphous carbon or diamond-like carbon (DLC). The trimmable mask layer 17 can be formed as a blanket trimmable material layer, and can be lithographically patterned by application and patterning of a photoresist layer and transfer of the pattern in the photoresist layer into the blanket trimmable material layer. The size of each rectangular opening 18A to 18D can be selected to correspond to the physically exposed area of a bottommost layer to be contacted within a respective contact well (s1, s2, s3, or s4). For example, the sides of the rectangular openings can be in a range from 30 nm to 600 nm, although lesser and greater dimensions can also be employed. An anisotropic etch process is performed to etch a topmost insulating layer 32 and a topmost sacrificial material layer 42 within each opening in the trimmable mask layer 17. A rectangular contact area is formed within each opening in the trimmable mask layer 17.

Referring to FIGS. 12A and 12B, a first iteration of a trimming process that trims the trimmable mask layer 17 and an anisotropic etch process that vertically recesses physically exposed portions of the alternating stack (32, 42) by a pair of an insulating layer 32 and a sacrificial material layer 42 is performed. The trimmable mask layer 17 can be isotropically recessed by the trimming process to increase the size of the openings 18A to 18D. The duration of the trimming process can be selected such that each newly exposed area of the alternating stack (32, 42) has a sufficient width for subsequently forming a contact via structure thereupon. For example, the trimming distance can be in a range from 30 nm to 600 nm, although lesser and greater trimming distance can also be employed. The anisotropic etch process etches exposed local insulating layers 32 and exposed local sacrificial material layers 42 within each opening in the trimmable mask layer 17. A nested set of two rectangular vertical steps is formed within each of the contact wells (s1, s2, s3, s4). A rectangular contact area and a rectangular frame-shaped contact area are formed within each opening in the trimmable mask layer 17.

Referring to FIGS. 13A and 13B, a second iteration of the trimming process and the anisotropic etch process is performed. The trimmable mask layer 17 can be isotropically recessed by the trimming process. The duration of the trimming process can be selected such that each newly exposed area of the alternating stack (32, 42) has a sufficient width for subsequently formed a contact via structure thereupon. The anisotropic etch process etches exposed local insulating layers 32 and exposed local sacrificial material layers 42 within each opening in the trimmable mask layer 17. A nested set of three rectangular vertical steps is formed within each of the contact wells (s1, s2, s3, s4). A rectangular contact area and two rectangular frame-shaped contact areas are formed within each opening in the trimmable mask layer 17.

Referring to FIGS. 14A and 14B, a third iteration of the trimming process and the anisotropic etch process is performed. The trimmable mask layer 17 can be isotropically recessed by the trimming process. The duration of the trimming process can be selected such that each newly exposed area of the alternating stack (32, 42) has a sufficient width for subsequently formed a contact via structure thereupon. The anisotropic etch process etches exposed local insulating layers 32 and exposed local sacrificial material layers 42 within each opening in the trimmable mask layer 17. A nested set of four rectangular vertical steps is formed within each of the contact wells (s1, s2, s3, s4). A rectangular contact area and three rectangular frame-shaped contact areas are formed within each opening in the trimmable mask layer 17.

Referring to FIGS. 15A and 15B, the combination of a trimming process that isotropically trims the trimmable mask layer 17 and a first etch process that vertically recesses physically exposed portions the alternating stack (32, 42) by a pair of layers within the alternating stack (32, 42) can be iteratively performed for a total of (N-1) times, in which N is an integer greater than 2. For example, N can be in a range from 3 to 64, such as from 4 to 32. A nested set of N rectangular vertical steps is formed within each of the contact wells (s1, s2, s3, s4). A rectangular contact area and (N-1) rectangular frame-shaped contact areas are formed within each opening in the trimmable mask layer 17. The trimmable mask layer 17 can be subsequently removed, for example, by ashing.

Referring to FIGS. 16A and 16B, a first etch mask layer 27 can be formed over the contact well set (s1, s2, s3, s4). The first etch mask layer 27 corresponds to the second mask pattern 27 in FIG. 8. In one embodiment, the first etch mask layer 27 can be a photoresist layer that can be lithographically patterned. The first etch mask layer 27 does not cover areas of a first subset of the contact well set, while covering areas of a second subset of the contact well set and areas outside of the contact well set (s1, s2, s3, s4). For example, the first etch mask layer 27 can cover the third and fourth contact wells (s3, s4), while the first and second contact wells (s1, s2) are not covered by the first etch mask layer 27. An anisotropic etch process is performed to etch through multiple pairs of the insulating layers 32 and the sacrificial material layers 42 within areas that are not covered by the first etch mask layer 27. The anisotropic etch is herein referred to as a first level-shifting anisotropic etch. Portions of the alternating stack (32, 42) that are not covered by the first etch mask layer 27 can be etched by M pairs of insulating layers 32 and spacer material layers (such as sacrificial material layers 42) within the alternating stack (32, 42). M is an integer that is at least a total number N of steps that are formed while the trimmable mask layer 17 is present over the alternating stack (32, 42). In one embodiment, the first level-shifting anisotropic etch can etch through N, 2N, 4N, 8N, or 16N pairs of insulating layers 32 and sacrificial material layers 42. The first etch mask layer 27 can be subsequently removed, for example, by ashing.

Figure 17A:
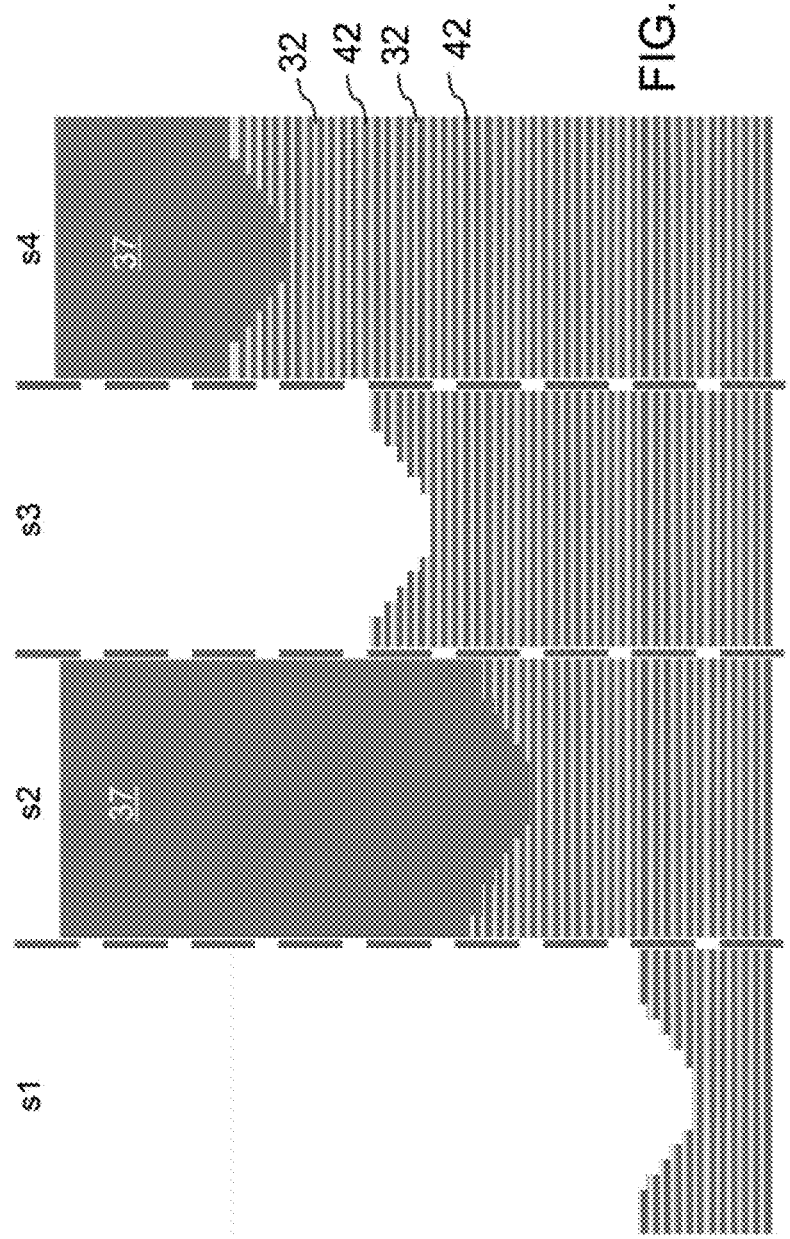
FIG. 17A is composite vertical cross-sectional views of the in-process fourth exemplary contact well set after formation of a second etch mask layer that covers the second and fourth contact wells and a second level-shifting anisotropic etch according to an embodiment of the present disclosure.
Figure 17B:
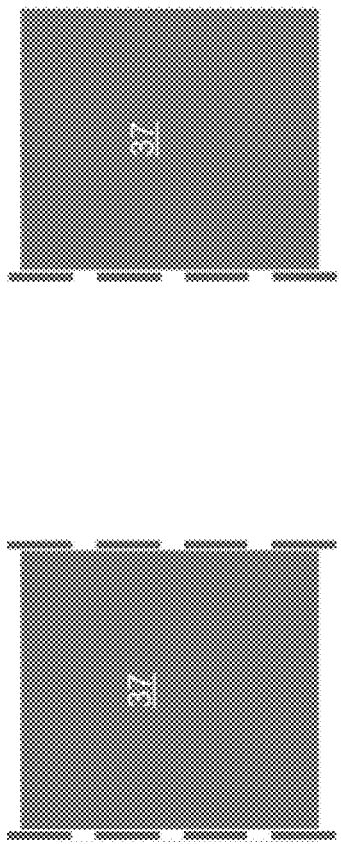
FIG. 17B is a composite top-down view of the in-process fourth exemplary contact well set at the processing steps of FIG. 17A.

Referring to FIGS. 17A and 17B, a second etch mask layer 37 can be formed over the contact well set (s1, s2, s3, s4). The second etch mask layer 37 corresponds to the third mask pattern 37 in FIG. 8. In one embodiment, the second etch mask layer 37 can be a photoresist layer that can be lithographically patterned. The second etch mask layer 37 does not cover areas of a third subset of the contact well set, while covering areas of a fourth subset of the contact well set and areas outside of the contact well set (s1, s2, s3, s4). For example, the second etch mask layer 37 can cover the second and fourth contact wells (s2, s4), while the first and third contact wells (s1, s3) are not covered by the second etch mask layer 37. An anisotropic etch process is performed to etch through multiple pairs of the insulating layers 32 and the sacrificial material layers 42 within areas that are not covered by the second etch mask layer 37. The anisotropic etch is herein referred to as a second level-shifting anisotropic etch. Portions of the alternating stack (32, 42) that are not covered by the second etch mask layer 37 can be etched by M' pairs of insulating layers 32 and spacer material layers (such as sacrificial material layers 42) within the alternating stack (32, 42). M' is an integer that is at least the total number N of steps that are formed while the trimmable mask layer 17 is present over the alternating stack (32, 42). In one embodiment, the second level-shifting anisotropic etch can etch through N, 2N, 4N, 8N, or 16N pairs of insulating layers 32 and sacrificial material layers 42. M and M' can differ by a factor of 2, 4, or 8. The second etch mask layer 37 can be subsequently removed, for example, by ashing.

In case further processing steps are not performed to modify the contact well set (s1, s2, s3, s4), the contact well set (s1, s2, s3, s4) can have the configuration of the first alternative configuration illustrated in FIGS. 7A-7C. In case the contact wells within the contact well set (s1, s2, s3, s4)

are laterally spaced apart, the contact well set (s1, s2, s3, s4) can have the configuration of the first alternative configuration illustrated in FIG. 9.

Figure 18A:
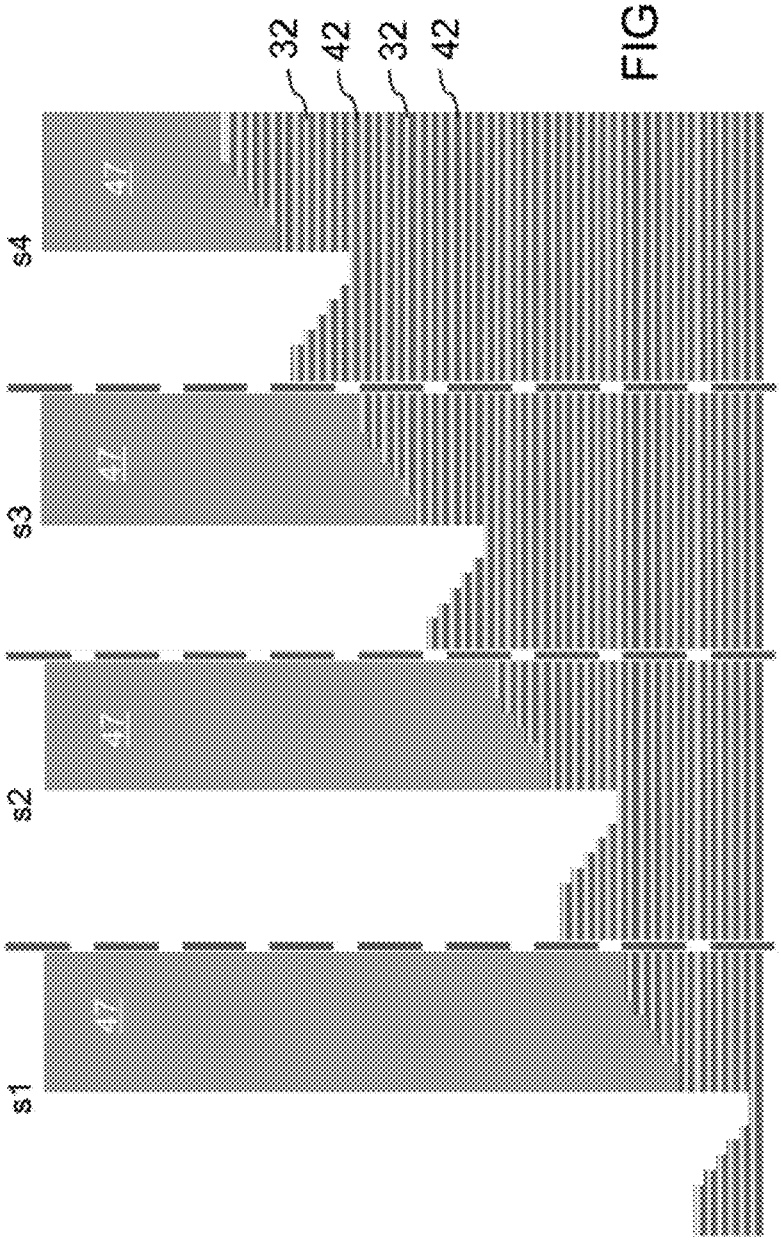
FIG. 18A is composite vertical cross-sectional views of the in-process fourth exemplary contact well set after formation of an etch mask layer and another level-shifting anisotropic etch according to an embodiment of the present disclosure.
Figure 18B:
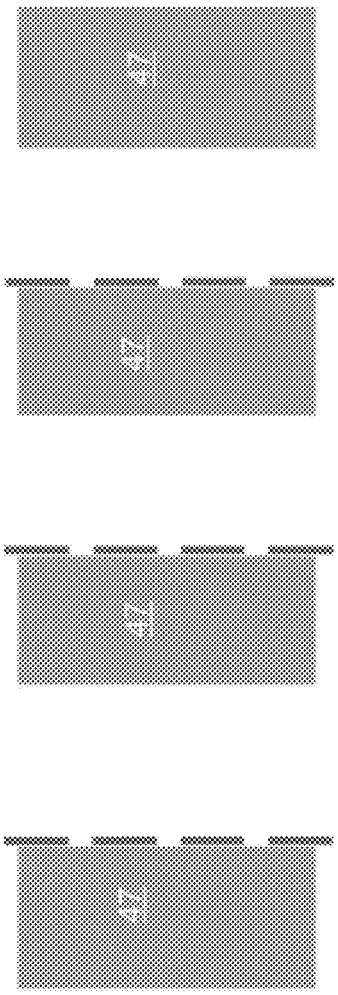
FIG. 18B is a composite top-down view of the in-process fourth exemplary contact well set after removal of the etch mask layer.

Referring to FIGS. 18A and 18B, further processing steps may be performed after the processing steps of FIGS. 17A and 17B. For example, a third etch mask layer 47 can be formed over the contact well set (s1, s2, s3, s4). In one embodiment, the third etch mask layer 47 can be a photoresist layer that can be lithographically patterned. The third etch mask layer 47 can be patterned with a straight edge that extends over, and partially covers, at least one contact well (s1, s2, s3, s4) among the contact well set (s1, s2, s3, s4). The third etch mask layer 27 can cover only a portion (e.g., the right side) of all contact wells in the contact well set (s1, s2, s3, s4). Each straight edge can laterally extend along a horizontal direction this is perpendicular to the vertical planes X-X' and X'-X". An etch process can be performed to etch physically exposed portions of pairs of layers of the alternating stack (32, 42) within each partially covered contact well (s1, s2, s3, s4). The etch process can be an anisotropic etch process that etches through multiple pairs of the insulating layers 32 and the sacrificial material layers 42 within areas that are not covered by the third etch mask layer 47. The anisotropic etch is herein referred to as a third level-shifting anisotropic etch. Portions of the alternating stack (32, 42) that are not covered by the third etch mask layer 47 can be etched by M" pairs of insulating layers 32 and spacer material layers (such as sacrificial material layers 42) within the alternating stack (32, 42). M" is an integer that is at least the total number N of steps that are formed while the trimmable mask layer 17 is present over the alternating stack (32, 42). In one embodiment, the third level-shifting anisotropic etch can etch through N, 2N, 4N, 8N, or 16N pairs of insulating layers 32 and sacrificial material layers 42. M" can differ from M and M' by a factor of 2, 4, or 8. The third etch mask layer 47 can be subsequently removed, for example, by ashing.

Figure 18C:
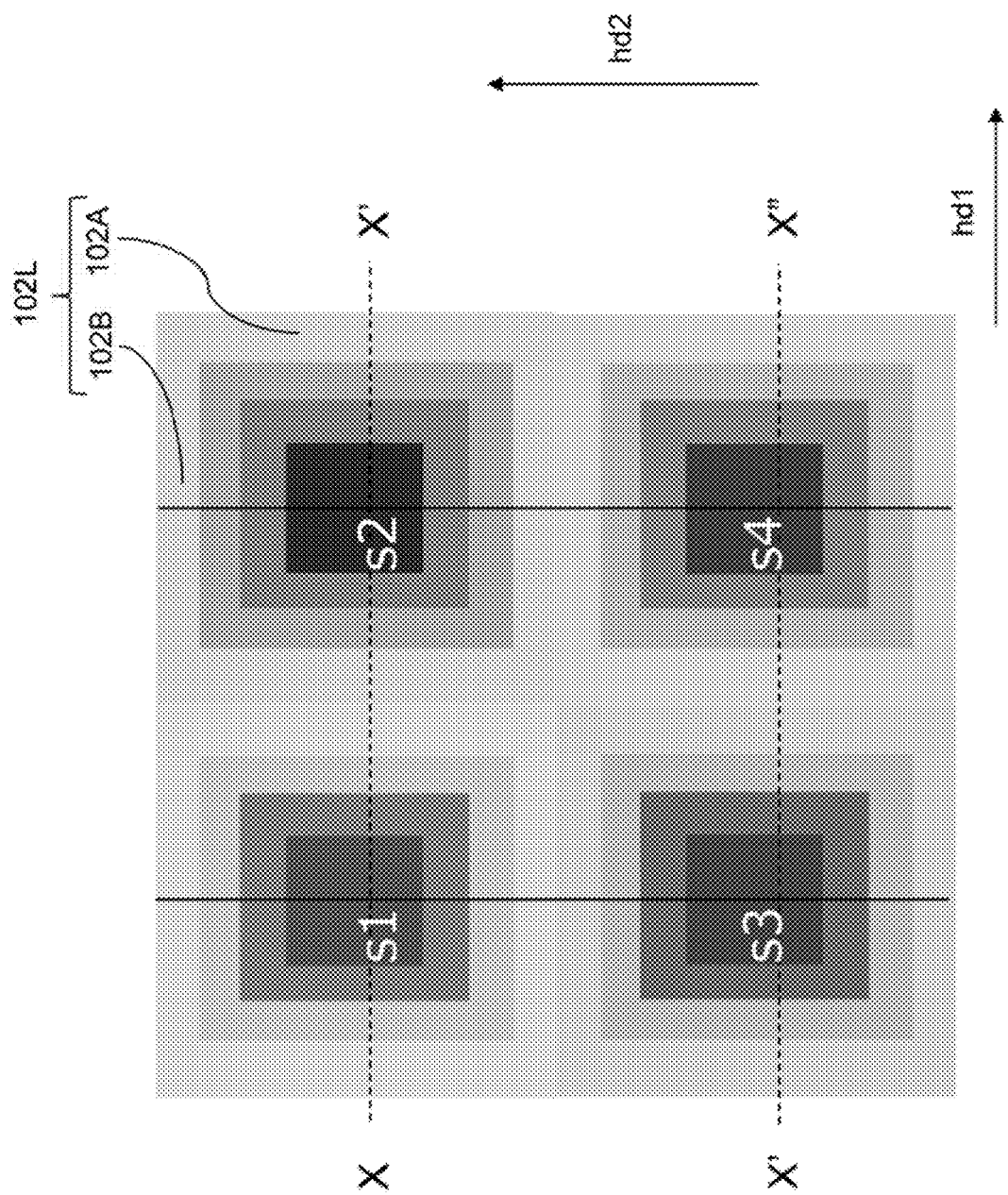
FIG. 18C is a top-down view of the in-process fourth exemplary contact well set at the processing steps of FIG. 18A.

Referring to FIG. 18C, further patterning process can be optionally performed. For example, a fourth etch mask layer (not shown) can be applied and patterned to provide a straight edge that extends over, and partially covers, at least one contact well (s1, s2, s3, s4) among the contact well set (s1, s2, s3, s4). Each straight edge can laterally extend parallel to the vertical planes X-X' and X'-X". An etch process can be performed to etch physically exposed portions of pairs of layers of the alternating stack (32, 42) within each partially covered contact well (s1, s2, s3, s4). The etch process can be an anisotropic etch process that etches through multiple pairs of the insulating layers 32 and the sacrificial material layers 42 within areas that are not covered by the fourth etch mask layer. The anisotropic etch is herein referred to as a fourth level-shifting anisotropic etch. The fourth etch mask layer can be subsequently removed, for example, by ashing.

The fourth exemplary contact well set (s1, s2, s3, s4) illustrated in FIG. 18C can include nested sets of rectangular vertical steps, and linear vertical steps at which the height of the stepped surfaces of the alternating stack (32, 42) changes by multiple levels. The locations of the liner vertical steps can coincide with the straight edges of the third and fourth etch mask layers. Further, each contact well (s1, s2, s3, s4) can be vertically offset among one another such that each sacrificial material layer 42 within the alternating stack (32, 42) has a physically exposed surface in a contact well (s1, s2, s3, s4) among the contact well set (s1, s2, s3, s4).

The alternating stack (32, 42) includes, from one side to another, first stepped surfaces (such as left side surfaces of the first contact well s1 or the third contact well s3), second stepped surfaces (such as right side surfaces of the first contact well s1 or the third contact well s3), third stepped surfaces (such as left side surfaces of the second contact well s2 or the fourth contact well s4), and fourth stepped surfaces (such as right side surfaces of the second contact well s2 or the fourth contact well s4) within a vertical plane that is parallel to the first horizontal direction hd1. The first and third stepped surfaces have a stepwise descending vertical cross-sectional profile as a function of a distance from a first side to a second side along the first horizontal direction hd1.

Referring to FIG. 19A, a set of mask patterns is illustrated, which can be employed to pattern mask layers. The mask layers can be employed to pattern a fifth exemplary contact well set (s1, s2, s3, s4) illustrated in FIGS. 19B and 19C. The various mask layers can be employed with a trimmable mask layer or a non-trimmable mask layer to provide level shifting among the various regions of the contact wells (s1, s2, s3, s4). The mask patterns can include a first mask pattern that contains at least one rectangular opening, a second mask pattern that contains a cross shaped opening, a third mask pattern that contains a linear opening that exposes adjacent edge portions of all four contact wells (s1, s2, s3, s4), a fourth mask pattern that generates a straight edge along a first horizontal direction and covers contact wells s3 and s4, and a fifth mask pattern that generates a straight edge along the second horizontal direction and covers contact wells s2 and s4.

Thus, in one embodiment, patterning the alternating stack (32, 42) to form a contact well set (s1, s2, s3, s4) includes using at least two different mask patterns having different geometric shapes are used during the step of patterning. For example, the patterns having openings and linear patterns can be used, as shown in FIGS. 5, 8 and 19A. In addition or alternatively, a mask pattern that contains a cross shaped opening and/or a mask pattern that contains a linear opening that exposes adjacent edge portions of four contact wells can be used, as shown in FIG. 19A.

Figure 20:
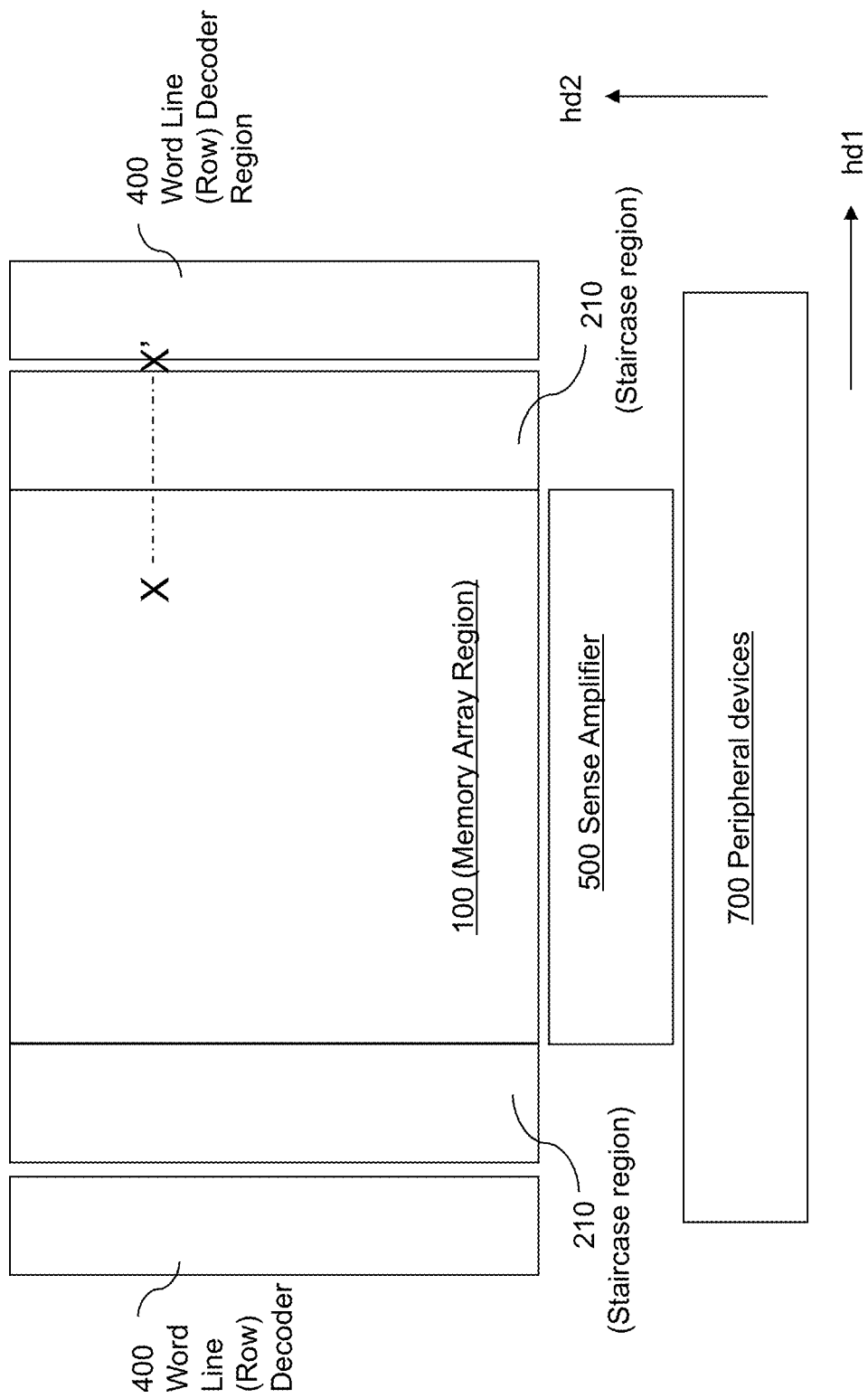
FIG. 20 is a layout for a three-dimensional memory device incorporating a second exemplary semiconductor structure according to an embodiment of the present disclosure.

Referring to FIG. 20, a plan view of an exemplary three-dimensional memory device incorporating a second exemplary structure to be described is illustrated. In this embodiment, the contact region 200 in the middle portion of the memory array region 100 is replaced with staircase regions 210 located outside the memory array region 100 between the word line decoder regions 400 and the memory array region 100. The second exemplary three-dimensional memory device includes a memory array region 100, at least one word line decoder region 400 that is also referred to as at least one row decoder region, at least one staircase region 210 that is located between the memory array region 100 and a respective word line decoder region 400, a sense amplifier region 500 including sense amplifiers connected to bit lines (shown in FIG. 34) extending to the memory array region 100, and a peripheral device region 700 including the semiconductor devices 790. In one embodiment, a pair of word line decoder regions 400 can be laterally spaced from the memory array region 100 along the first horizontal direction (e.g., word line direction) hd1, and the sense amplifier region 500 can be laterally spaced from the memory array region 100 along the second horizontal direction (e.g., bit line direction) hd2. Each staircase region 210 can be a contact region in which contact via structures contacting electrically conductive layers are subsequently formed.

FIGS. 21A-21F are sequential vertical cross-sectional views of the second exemplary semiconductor structure within the three-dimensional memory device of FIG. 20 along the vertical plane X-X' during formation of a combination of ascending vertical stepped surfaces and descending vertical stepped surfaces according to an embodiment of the present disclosure.

Referring to FIG. 21A, an optional hard mask layer 170 can be formed over the second exemplary semiconductor structure, and can be patterned to cover the memory array region 100, the at least one word line decoder region 400, the sense amplifier region 500, and the peripheral device region 700. A trimmable mask layer 177 can be applied over the second exemplary structure, and can be patterned to form line openings (i.e., openings having a shape of an elongated rectangle) within the staircase region 210. The lengthwise direction of the rectangular openings in the trimmable mask layer 177 can laterally extend along the second horizontal direction hd2 illustrated in FIG. 20.

Referring to FIG. 21B, an etch process can be performed to etch through a pair of a topmost insulating layer 32 and a topmost sacrificial material layer 42. Subsequently, a combination of a trimming process that isotropically trims the first trimmable mask layer 177 and an etch process that vertically recesses physically exposed portions the alternating stack (32, 42) by a pair of layers within the alternating stack (32, 42) can be iteratively performed for a total of (N−1) times, in which N is an integer greater than 2. For example, N can be in a range from 3 to 64, such as from 4 to 32. A nested set of N rectangular vertical steps is formed within each contact well, which is located around a respective one of the openings in the first trimmable mask layer 177. A rectangular contact area and (N−1) rectangular frame-shaped contact areas are formed within each opening in the first trimmable mask layer 177. The first trimmable mask layer 177 can be subsequently removed, for example, by ashing.

Referring to FIG. 21C, a second trimmable mask layer 277 can be applied over the second exemplary structure, and can be lithographically patterned to provide a straight edge between a pair of contact wells that are distal from the memory array region 100. The straight edge can extend along the second horizontal direction hd2. A level-shifting anisotropic etch process can be performed to etch through P pair of portions of insulating layers 32 and sacrificial material layers 42 that are not covered by the second trimmable mask layer 277. The number P can be the same as the number N, which is the total number of vertical steps formed within each contact well at the processing steps of FIG. 21B.

Referring to FIG. 21D, a trimming process can be performed to trim the second trimmable mask layer 277 such that a straight edge of the second trimmable mask layer 277 as trimmed is located between another pair of contact wells that are more proximal to the memory array region 100 relative to the most distal pair of contact regions.

Figure 21E:
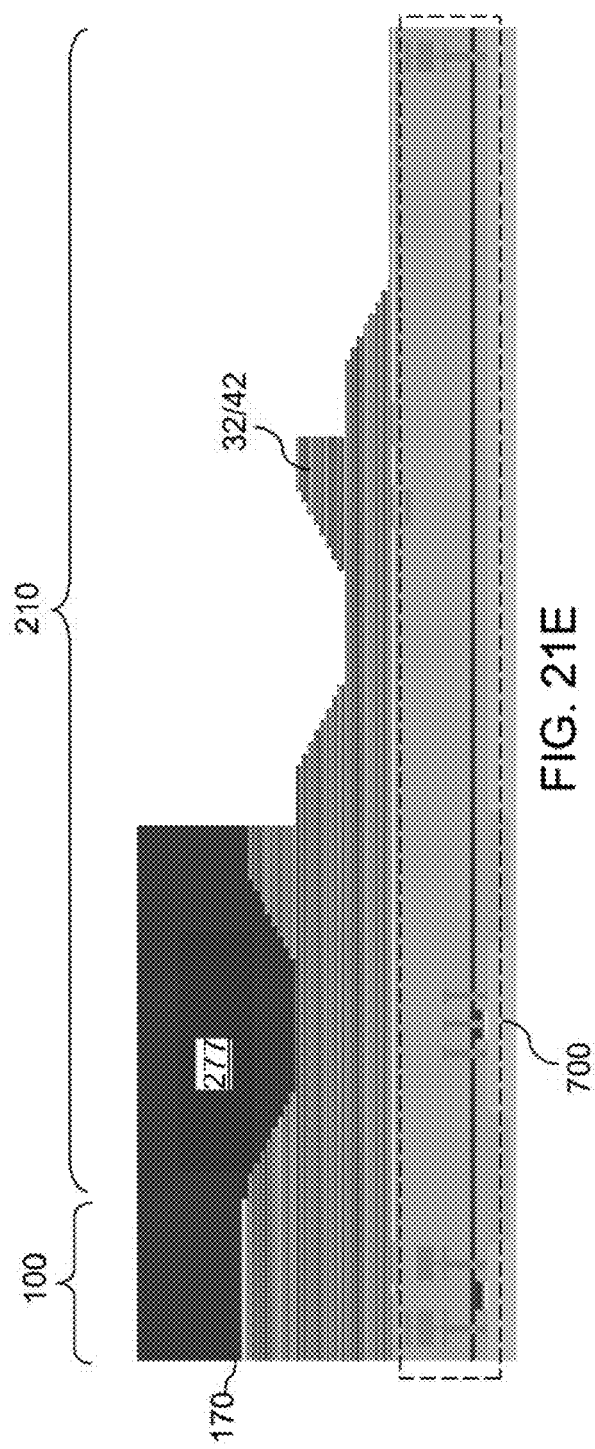

Referring to FIG. 21E, a level-shifting anisotropic etch process can be performed to etch through P' pair of portions of insulating layers 32 and sacrificial material layers 42 that are not covered by the second trimmable mask layer 277. The number P' can be the same as the number N.

Figure 21F:
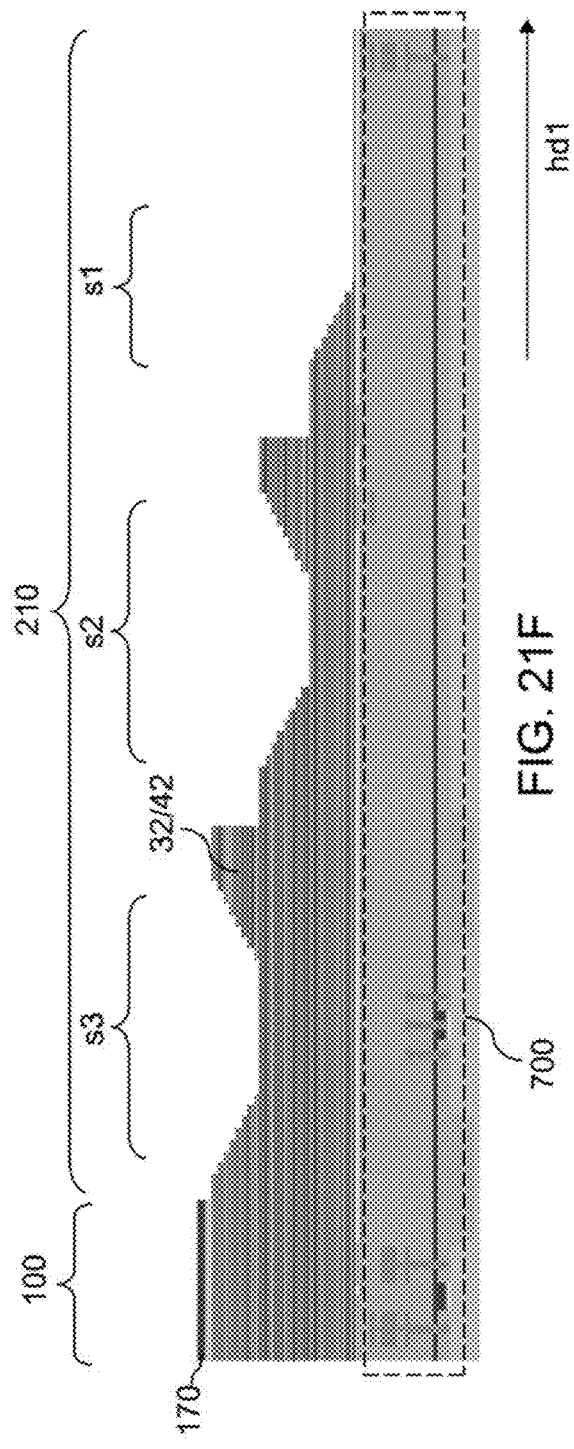

Referring to FIG. 21F, the second trimmable mask layer 277 can be removed, for example, by ashing. Each sacrificial material layer 42 is physically exposed within a respective one of the contact wells in the staircase region 210. Contact wells (s1, s2, s3) are formed in the staircase region 200.

The alternating stack (32, 42) includes, from one side to another, first stepped surfaces (such as left side surfaces of the third contact well s3), second stepped surfaces (such as right side surfaces of the third contact well s3), third stepped surfaces (such as left side surfaces of the second contact well s2), and fourth stepped surfaces (such as right side surfaces of the second contact well s2) within a vertical plane that is parallel to the first horizontal direction hd1. The first and third stepped surfaces have a stepwise descending vertical cross-sectional profile while the second and fourth stepped surfaces have a stepwise ascending vertical cross-sectional profile, as a function of a distance from a first side to a second side along the first horizontal direction hd1.

Figure 22:
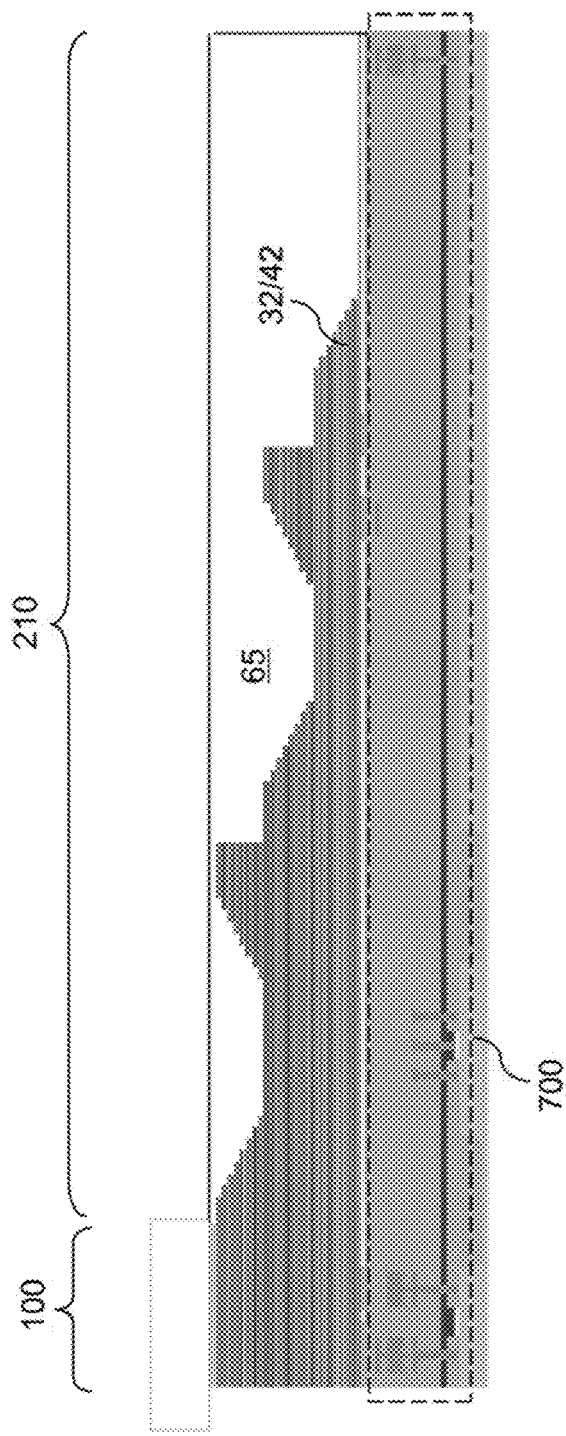
FIG. 22 is a vertical cross-sectional view of the second exemplary semiconductor structure after formation of a retro-stepped dielectric material portion according to an embodiment of the present disclosure.

Referring to FIG. 22, a retro-stepped dielectric material portion 65 can be formed over the stepped surfaces of the staircase region 210. A dielectric material such as silicon oxide can be deposited over the stepped surfaces, and can be planarized, for example, by chemical mechanical planarization (CMP) to form the retro-stepped dielectric material portion 65.

Figure 23:
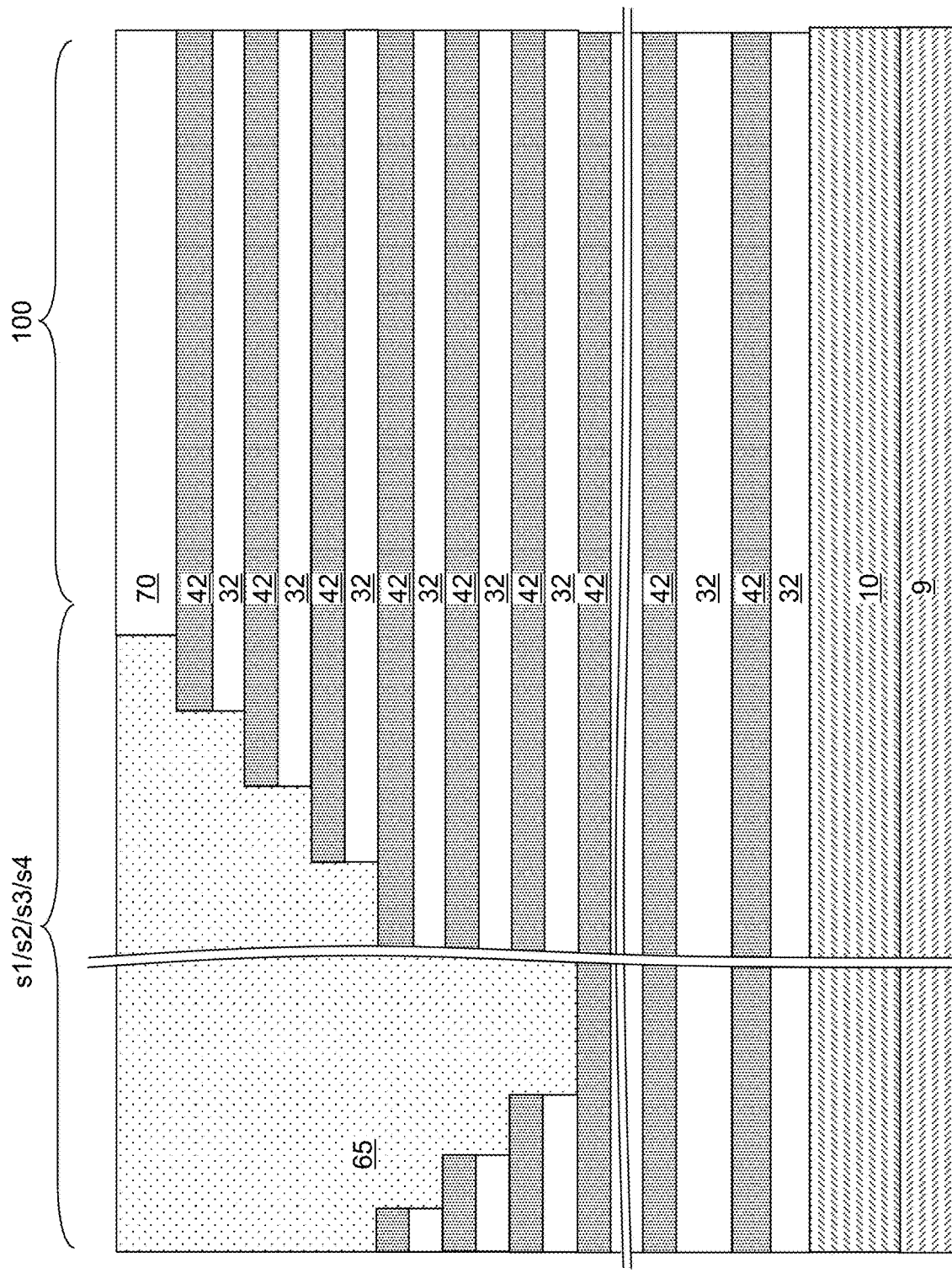
FIG. 23 is a vertical cross-sectional view of the first or second exemplary semiconductor structure after formation of at least one retro-stepped dielectric material portion according to an embodiment of the present disclosure.

Generally, at least one retro-stepped dielectric material portion 65 can be formed over the contact well set (s1, s2, s3, s4) of the first or second exemplary semiconductor structure as illustrated in FIG. 23.

Figure 24A:
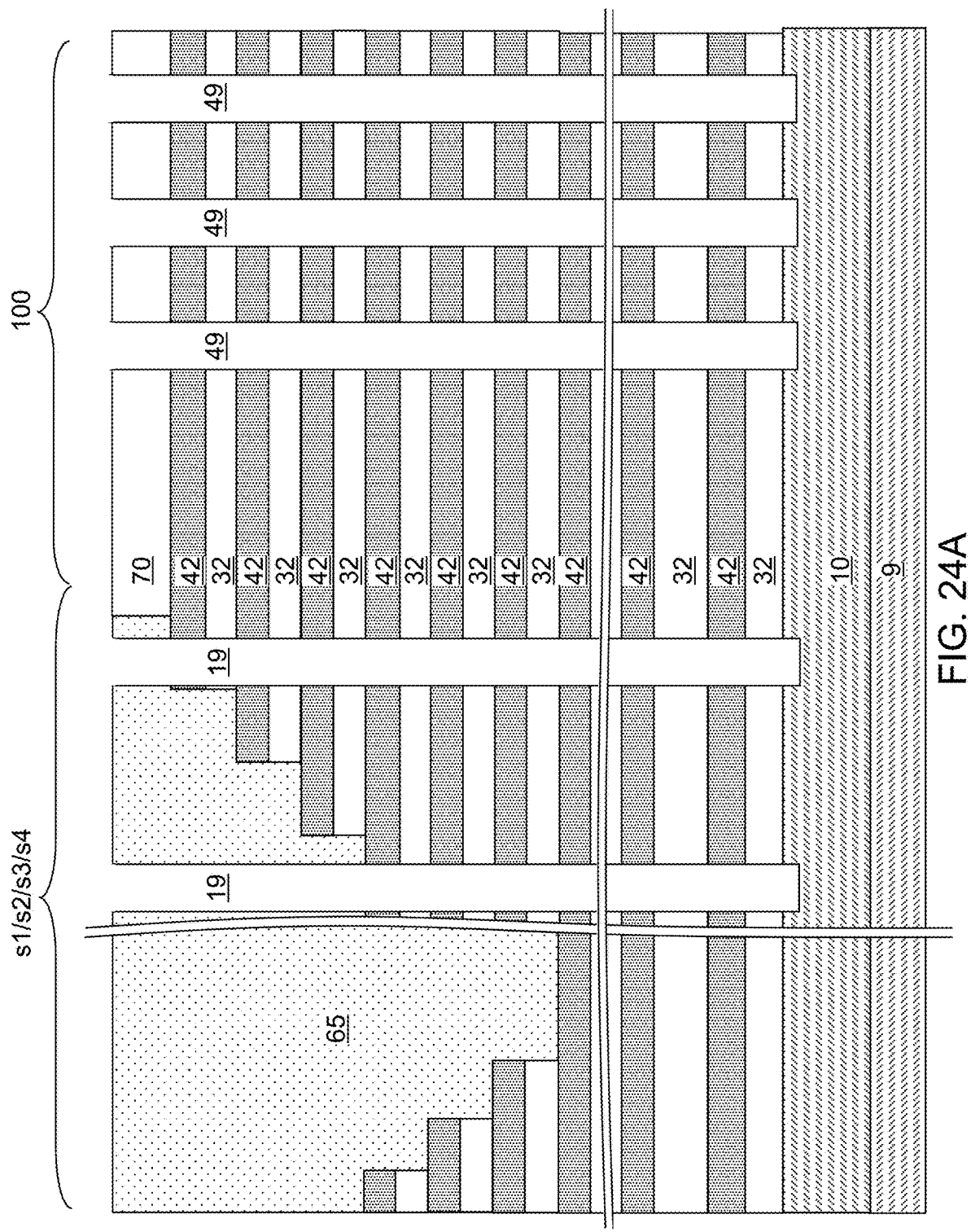
FIG. 24A is a vertical cross-sectional view of the first or second exemplary semiconductor structure after formation of memory openings and support openings according to an embodiment of the present disclosure.
Figure 24B:
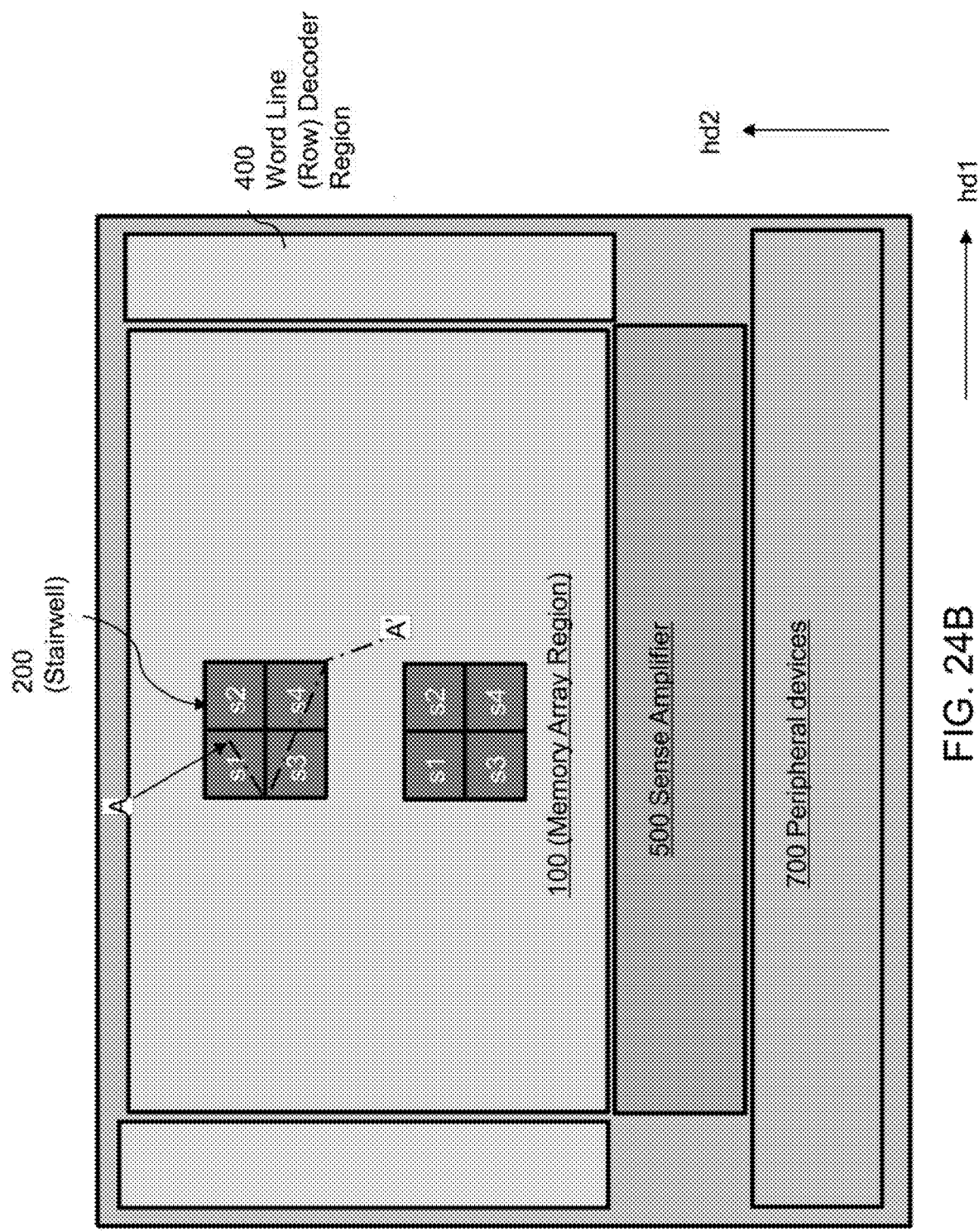
FIG. 24B is a plan view of a configuration of the first exemplary structure at the processing steps of FIG. 24A. The vertical plane A-A' corresponds to the plane of the vertical cross-sectional view of FIG. 24B.

Referring to FIGS. 24A and 24B, a lithographic material stack (not shown) including at least a photoresist layer can be formed over the insulating cap layer 70 and the retro-stepped dielectric material portion 65 of the first or second exemplary structure. The lithographic material stack can be lithographically patterned to form openings therein. The openings include a first set of openings formed over the memory array region 100 and a second set of openings formed over the contact wells (s1, s2, s3, s4). The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact wells (s1, s2, s3, s4).

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact wells (s1, s2, s3, s4). The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 25A-25H illustrate structural changes in a memory opening 49, which is one of the memory openings 49 in the first or second exemplary structure of FIGS. 24A and 24B. The same structural change occurs simultaneously in each of the other memory openings 49 and in each support opening 19.

Referring to FIG. 25A, a memory opening 49 in the first exemplary device structure of FIGS. 24A and 24B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 25B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 25C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 25D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 25E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 25F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 25G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 25H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 26:
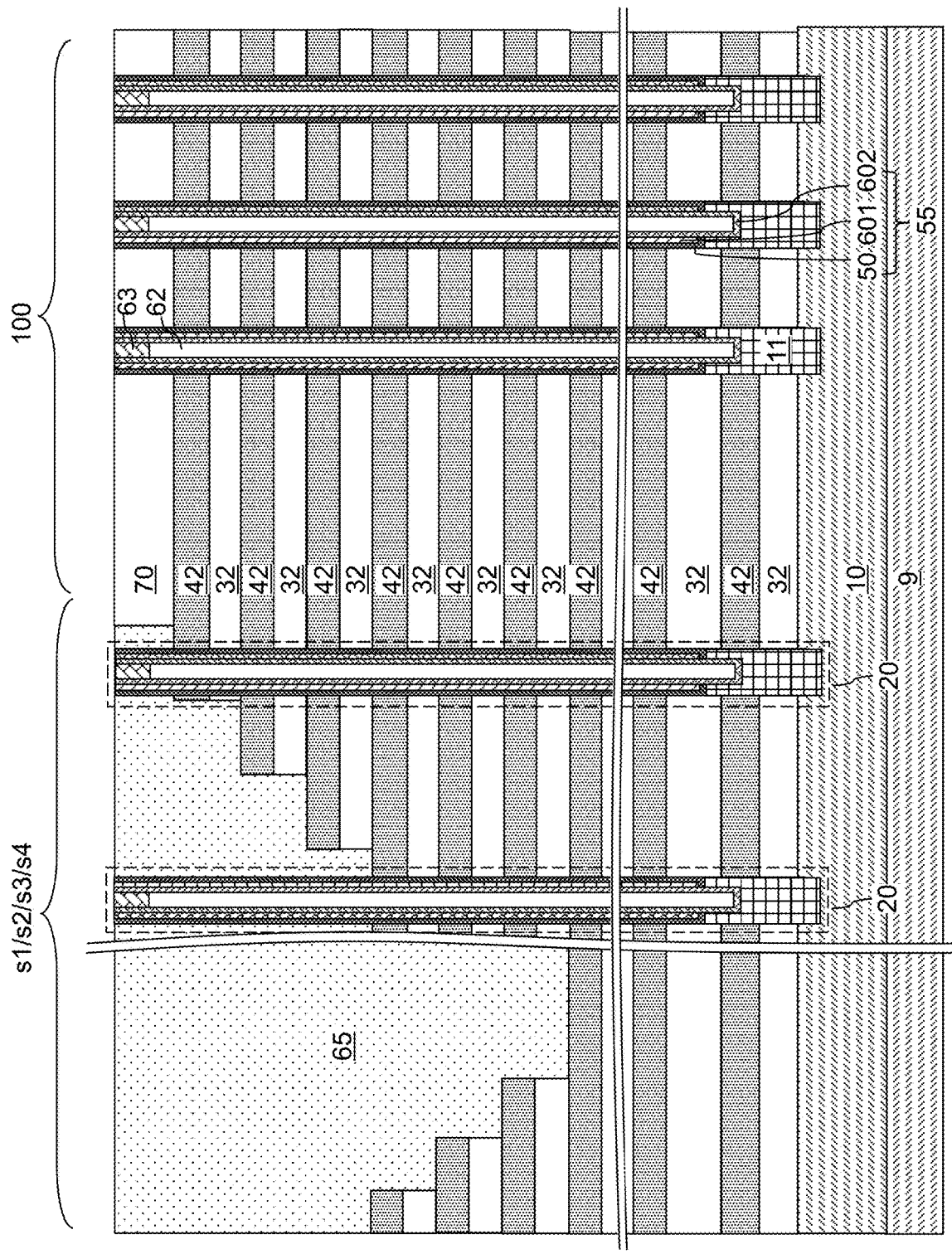
FIG. 26 is a schematic vertical cross-sectional view of the first or second exemplary structure after formation of memory stack structures and support pillar structures according to an embodiment of the present disclosure.

Referring to FIG. 26, the first or second exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 24A and 24B. An instance of the support pillar structure 20 can be formed within each support opening 19 of the structure of FIGS. 24A and 24B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 27A:
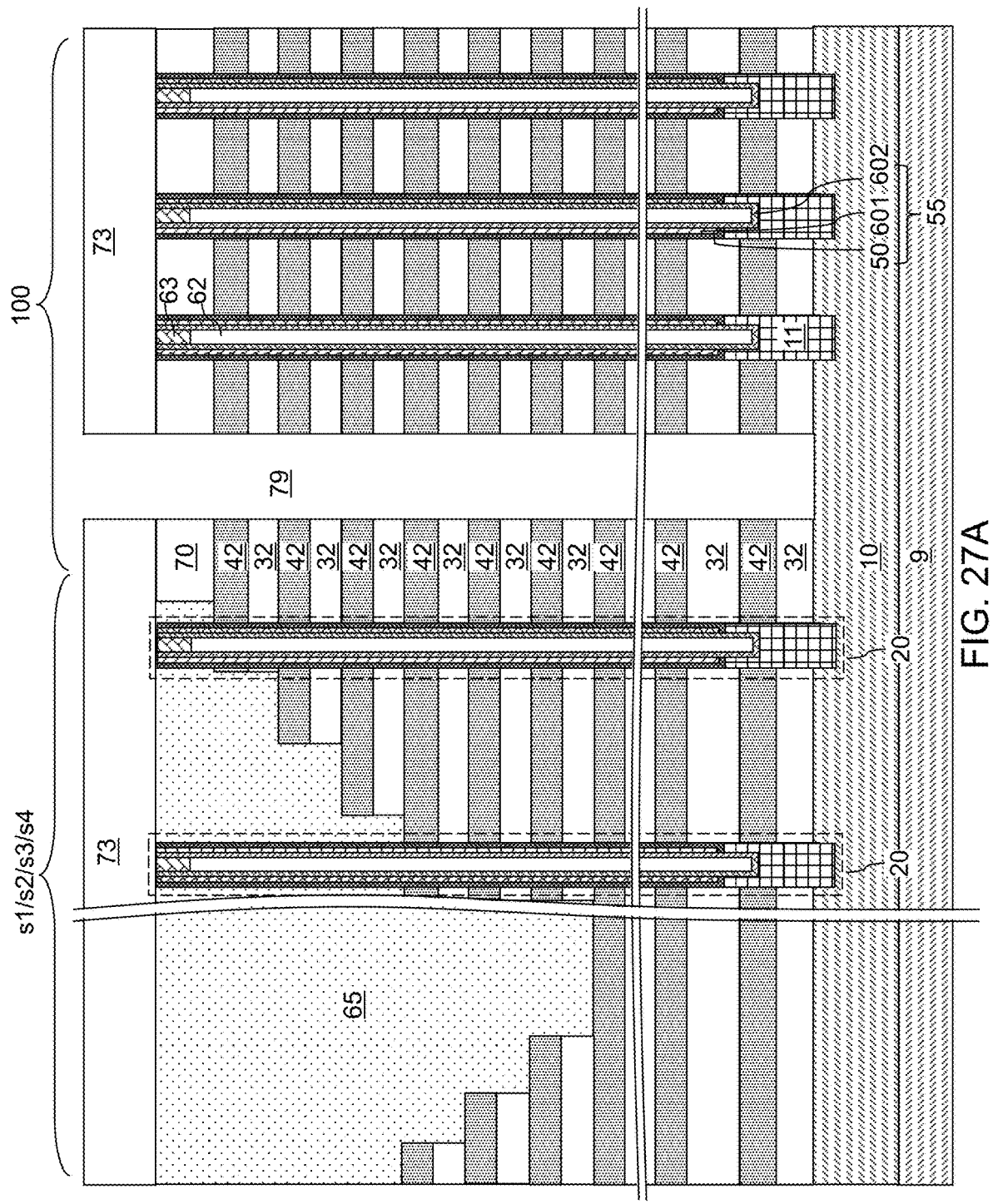
FIG. 27A is a schematic vertical cross-sectional view of the first or second exemplary structure after formation of backside trenches according to an embodiment of the present disclosure.
Figure 27B:
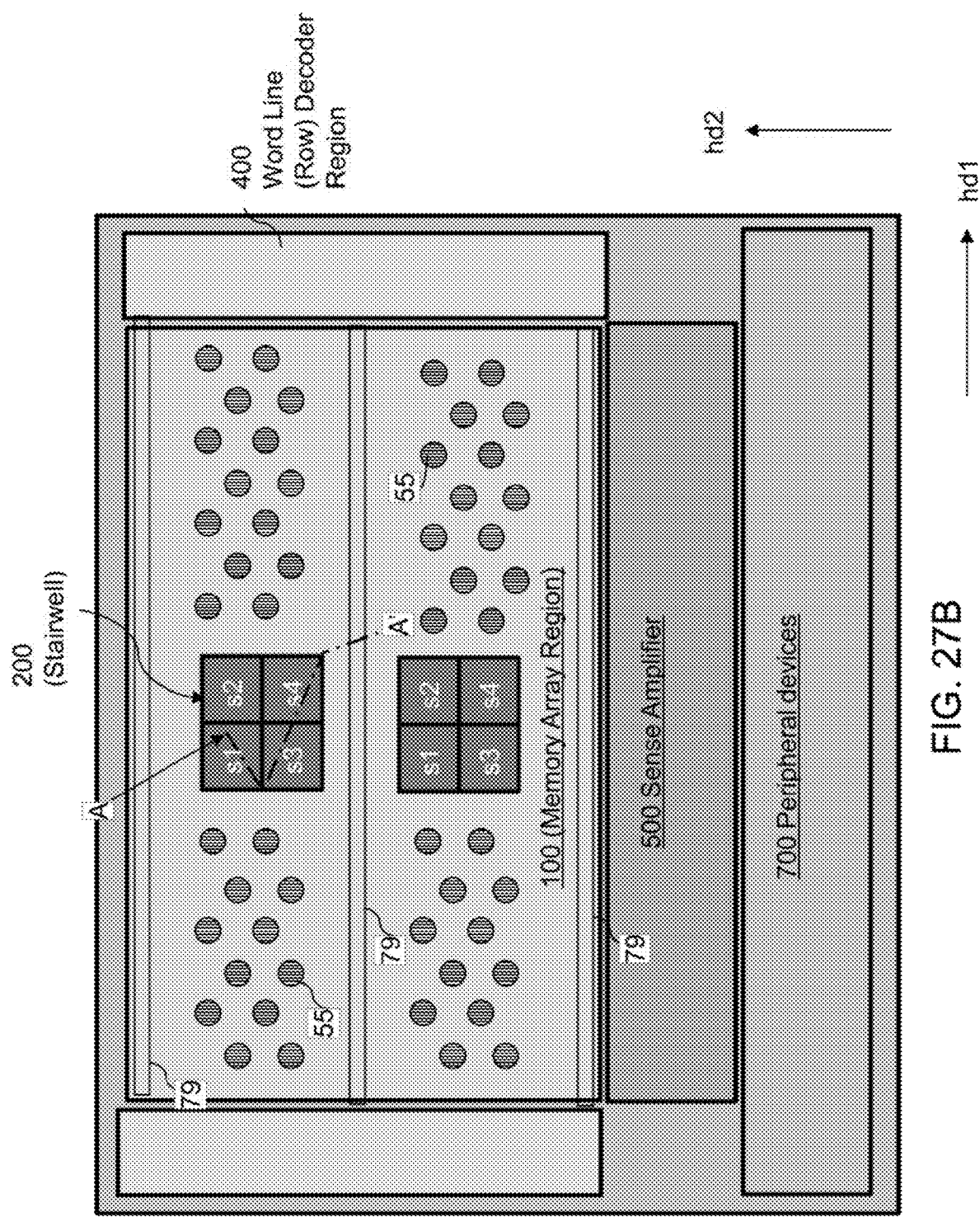
FIG. 27B is a plan view of a configuration of the first exemplary structure at the processing steps of FIG. 27A. The vertical plane A-A' corresponds to the plane of the vertical cross-sectional view of FIG. 27A.
Figure 27C:
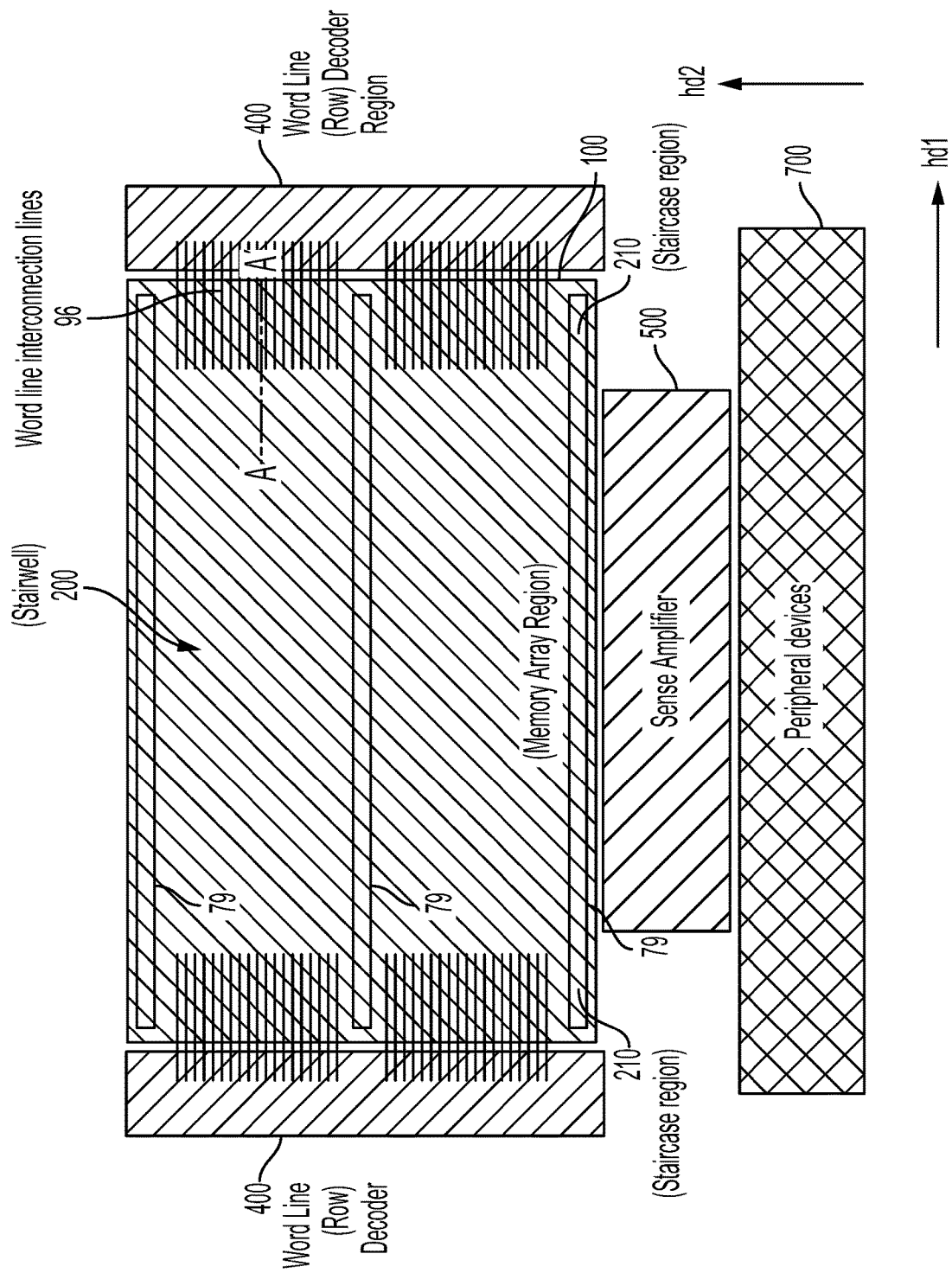
FIG. 27C is a plan view of a configuration of the second exemplary structure at the processing steps of FIG. 27A. The vertical plane A-A' corresponds to the plane of the vertical cross-sectional view of FIG. 27A. Locations of word line interconnection lines to be subsequently formed are illustrated.

Referring to FIGS. 27A-27C, a contact level dielectric layer 73 are formed over the alternating stack (32, 42) of the first or second exemplary structure. Backside trenches 49 are subsequently formed through the first contact level dielectric layer 73, the alternating stack (32, 42), and the retro-stepped dielectric material portions 65. FIG. 27A is a schematic vertical cross-sectional view of the first or second exemplary structure. For the case of the first exemplary structure, FIG. 27B is a plan view of a configuration of the first exemplary structure at the processing steps of FIG. 27A. The vertical plane A-A' corresponds to the plane of the vertical cross-sectional view of FIG. 27A. For the case of the second exemplary structure, FIG. 27C is a plan view of a configuration of the second exemplary structure at the processing steps of FIG. 27A. The vertical plane A-A' corresponds to the plane of the vertical cross-sectional view of FIG. 27A. Locations of word line interconnection lines to be subsequently formed are illustrated.

The contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact wells (s1, s2, s3, s4).

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 28:
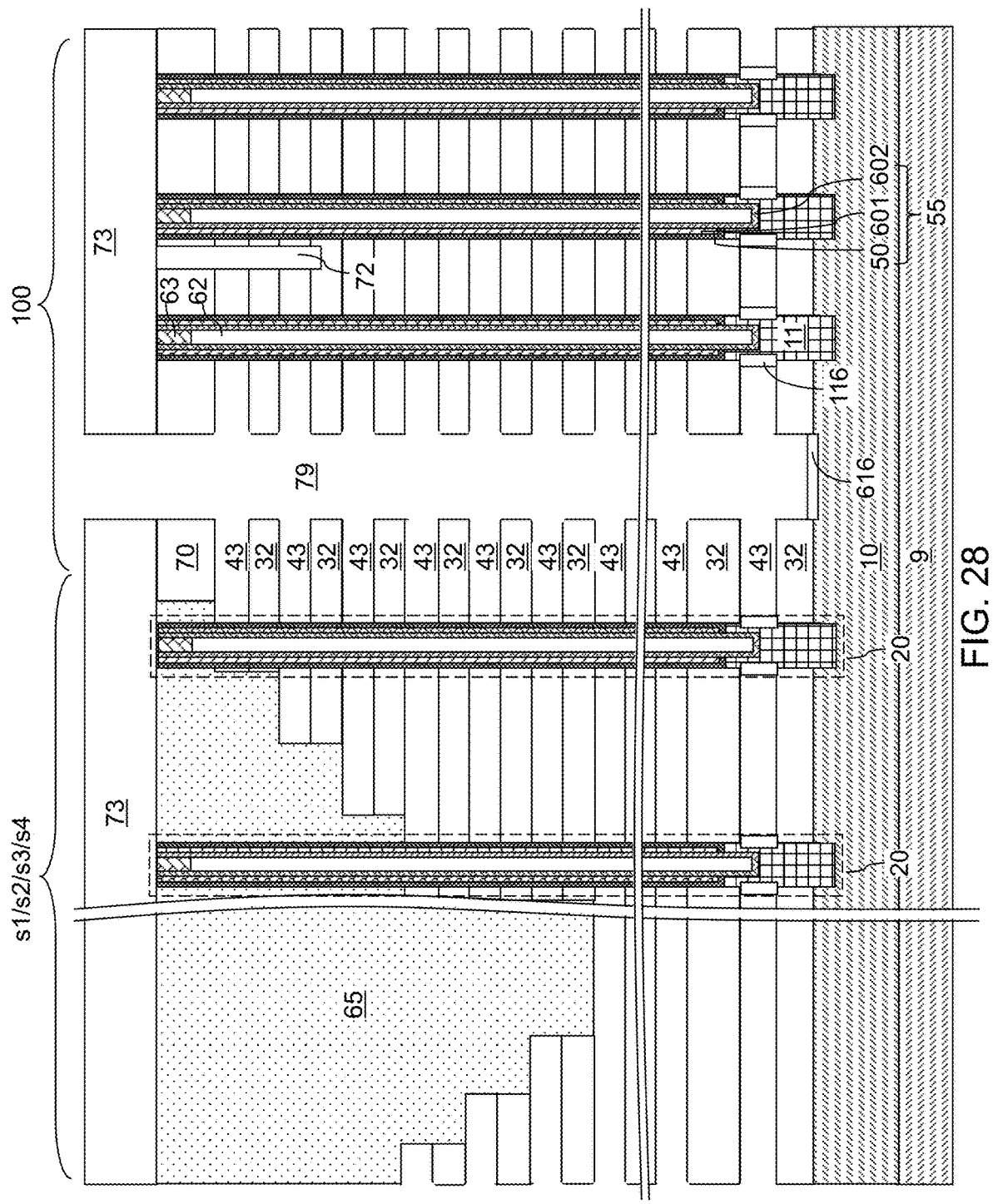
FIG. 28 is a schematic vertical cross-sectional view of the first or second exemplary structure after formation of backside recesses according to an embodiment of the present disclosure.

Referring to FIGS. 28 and 29A, an etchant that selectively etches the second material of the sacrificial material layers 42 with respect to the first material of the insulating layers 32 can be introduced into the backside trenches 79, for example, employing an etch process. FIG. 29A illustrates a region of the first exemplary structure of FIG. 28. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 29B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 29C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 30:
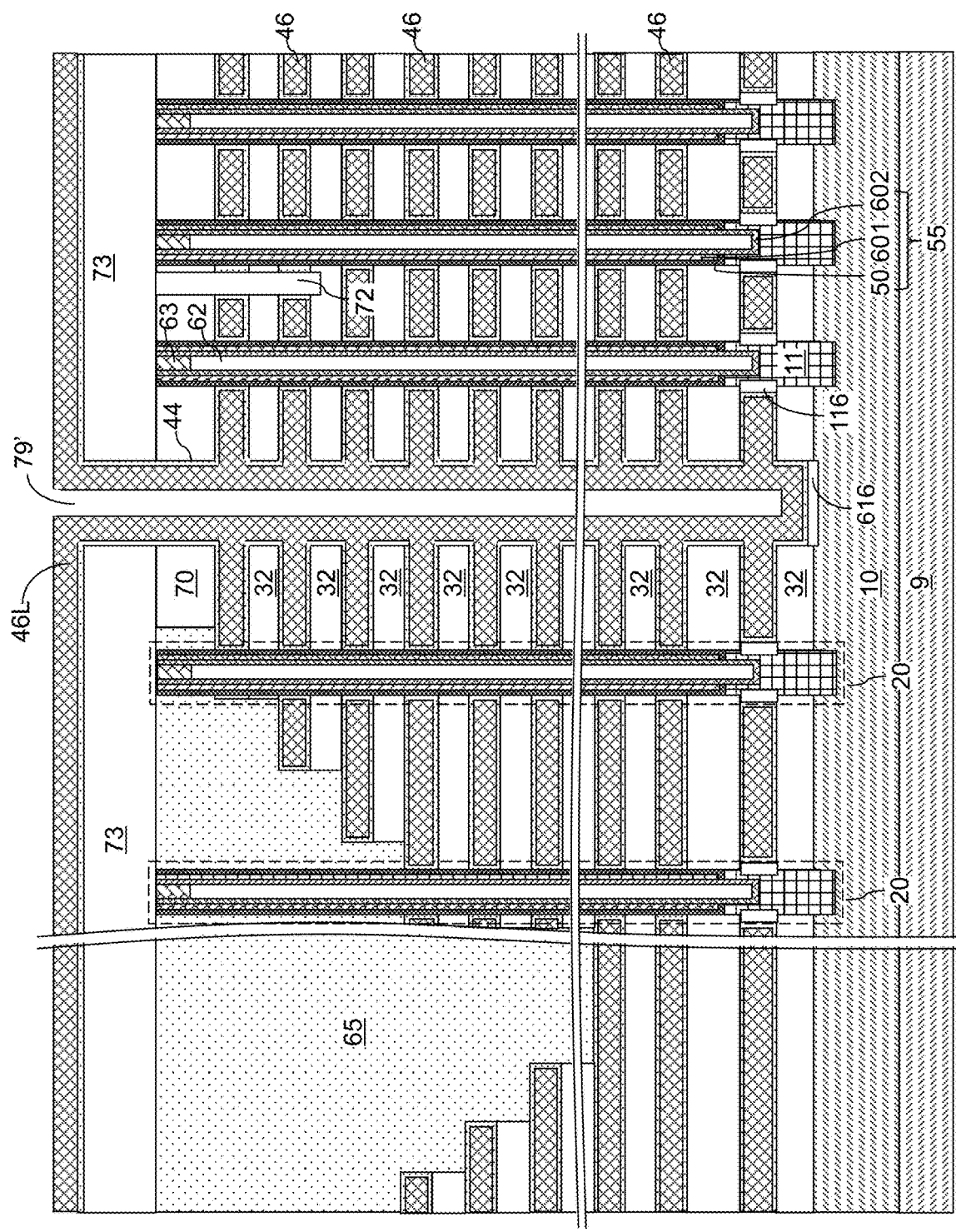
FIG. 30 is a schematic vertical cross-sectional view of the first or second exemplary structure after formation of electrically conductive layers according to an embodiment of the present disclosure.

Referring to FIGS. 29D and 30, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 31:
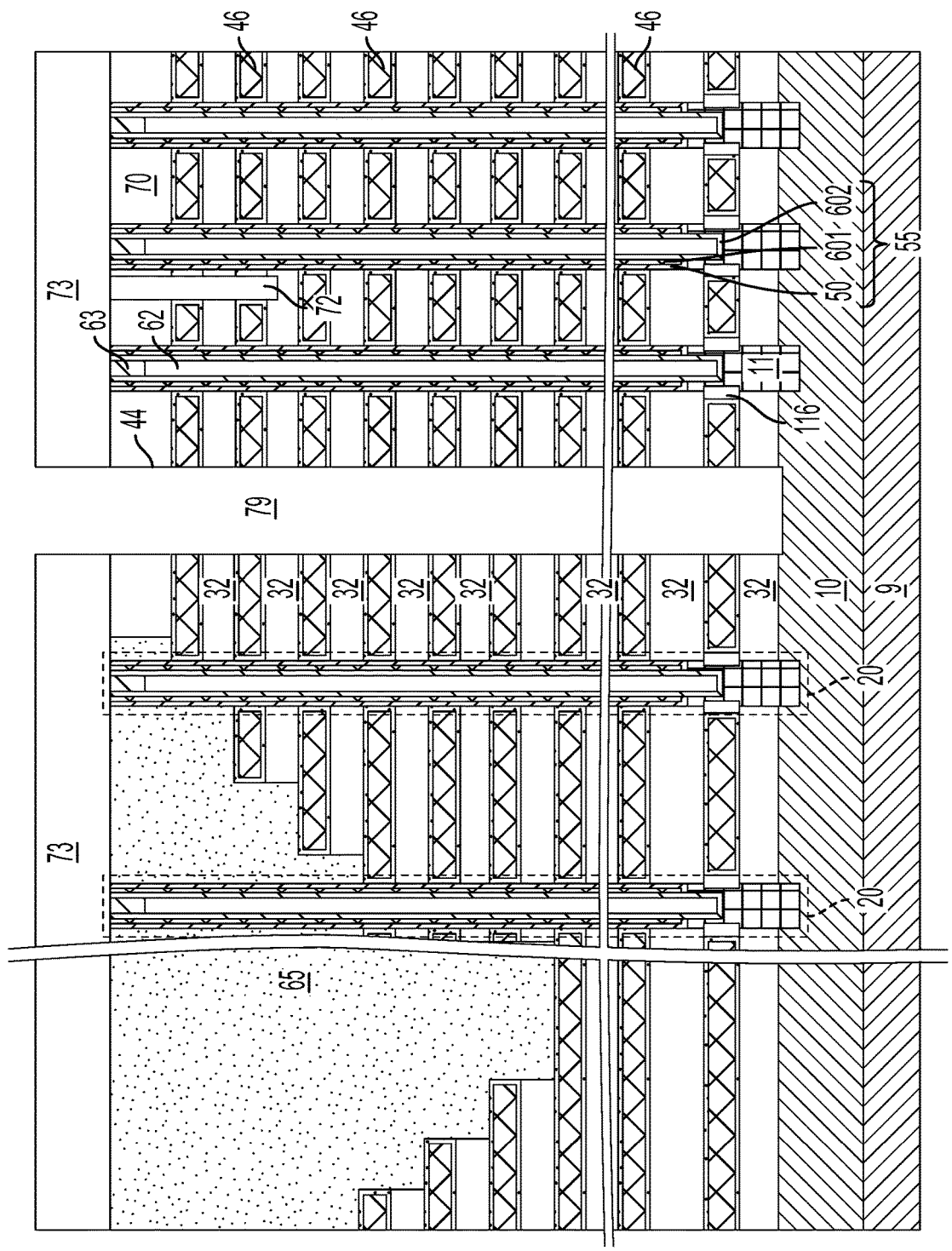
FIG. 31 is a schematic vertical cross-sectional view of the first or second exemplary structure after removal of conductive material portions from backside trenches according to an embodiment of the present disclosure.

Referring to FIG. 31, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 32:
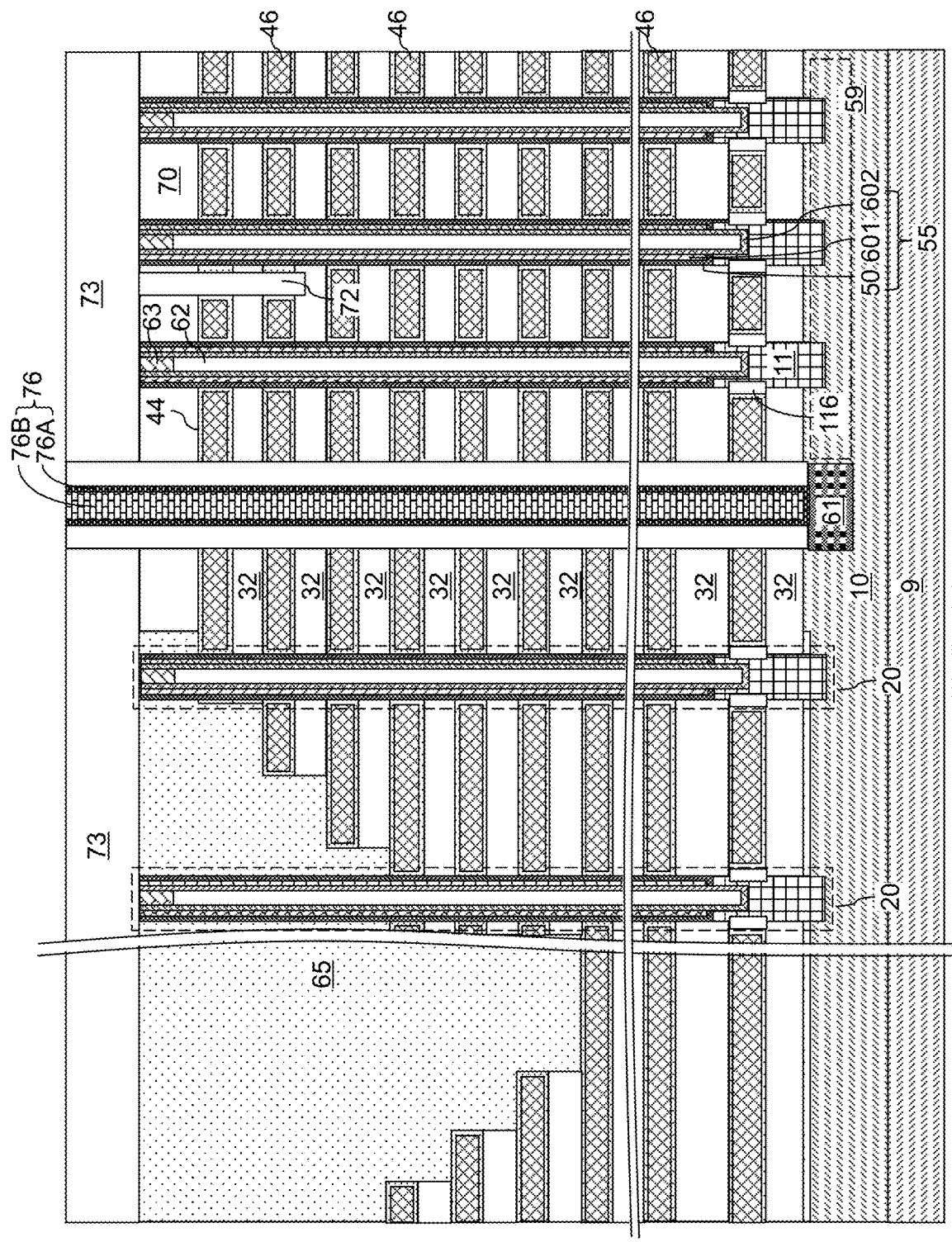
FIG. 32 is a schematic vertical cross-sectional view of the exemplary structure after formation of source regions, insulating spacers, and backside contact via structures according to an embodiment of the present disclosure.

Referring to FIG. 32, an insulating material layer can be formed in the backside trenches 79 and over the contact level dielectric layer 73 by a conformal deposition process. first exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Additional contact via structures (88, 86) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. The word line contact via structures 86 are contact via structures that provide electrical contact to the electrically conductive layers 46, and are formed through the at least one retro-stepped dielectric material portion 65. The word line contact via structures 86 are formed on a subset of the electrically conductive layers 46 that are on, or underneath, horizontal surfaces of stepped surfaces of the contact well set (s1, s2, s3, s4). Peripheral device contact via structures (not shown) can be formed through the retro-stepped dielectric material portion 65 directly on respective nodes of the peripheral devices.

Figure 34:
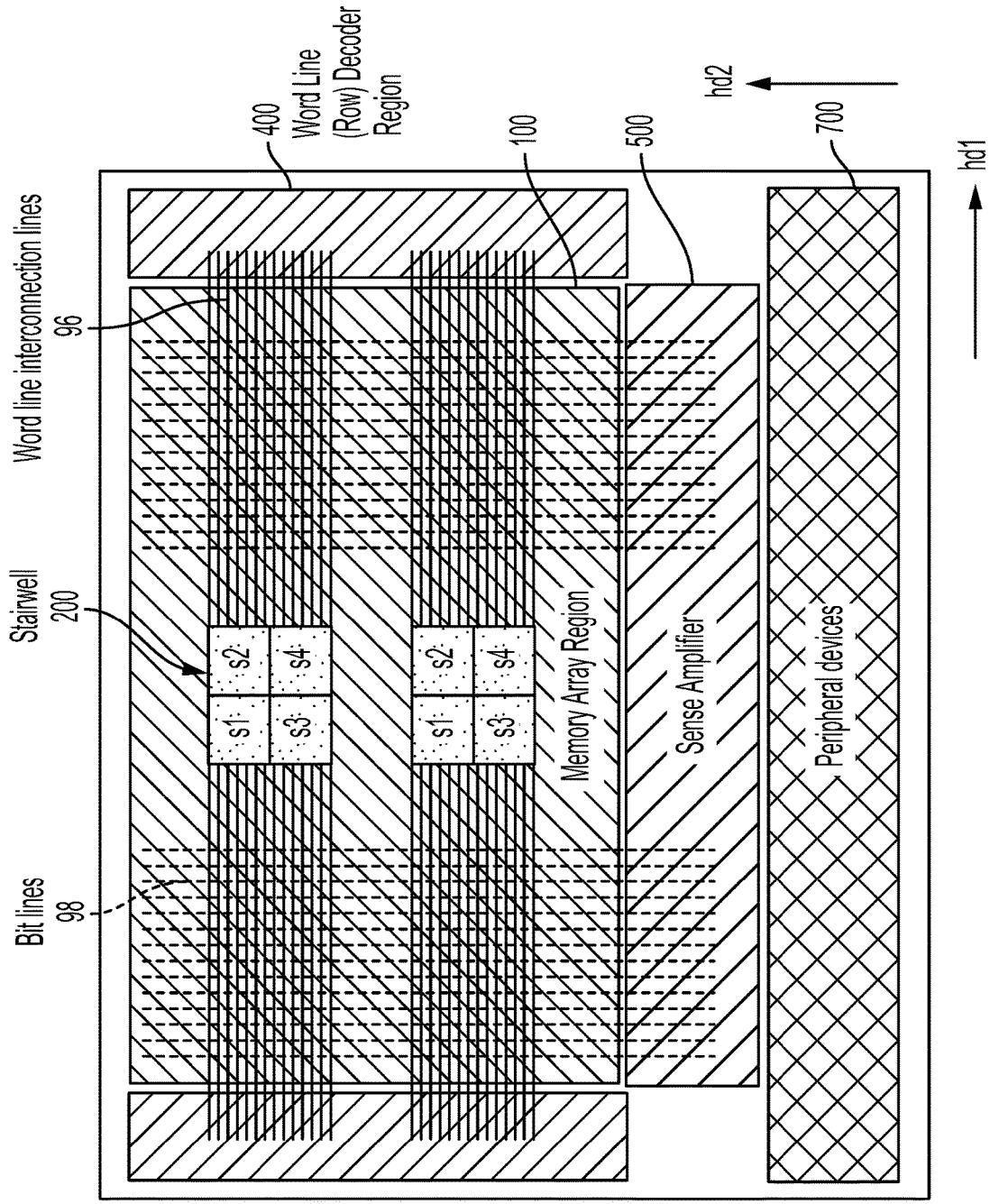
FIG. 34 is a plan view of a configuration of the first exemplary structure after formation of word line interconnection lines according to an embodiment of the present disclosure.

Referring to FIG. 34, additional interconnect level dielectric layers can be formed over the contact level dielectric layer 73. Word line interconnection lines 96 laterally extending along the first horizontal direction hd1 (e.g., word line direction) are formed in the additional interconnect level dielectric layers. The word line interconnect lines 96 provide electrical connection between the word line contact via structures 86 and the various devices (e.g., word line driver circuit devices) in the word line decoder region 400. Bit lines 98 which laterally extend along the second horizontal direction hd2 (e.g., bit line direction) can be formed in the additional interconnect level dielectric layers. The bit lines 98 provide electrical connection between the drain contact via structures 88 and the various devices in the sense amplifier region 500.

Referring to all drawings and according to various embodiments of the present disclosure, a three-dimensional memory device is provided, which comprises: an alternating stack of insulating layers 32 and electrically conductive layers 46 located over a substrate (9, 10); and memory stack structures 55 vertically extending through the alternating stack (32, 46), wherein each of the memory stack structures 55 comprises a memory film 50 and a vertical semiconductor channel 60.

The device also includes a contact well set (s1, s2, s3, s4) that includes contact wells extending through a respective upper region of the alternating stack (32, 46). Each of the contact wells contains first stepped surfaces 102A which have a stepwise descending vertical profile along a first horizontal direction and second stepped surfaces 102B which have a stepwise descending vertical profile along a second horizontal direction which is perpendicular to the first horizontal direction, as shown in FIGS. 4A, 7A and 19B-19C.

The first and the second stepped surfaces (102A, 102B) can comprise stepped surfaces of the insulating layers 32 or stepped surfaces of the electrically conductive layers 46.

In one embodiment, at least some of the first stepped surfaces 102A and the second stepped surfaces 102B are adjoined to each other to form an L-shaped horizontal surface 102L as shown in FIGS. 4A and 19C for example.

In one embodiment, each of the contact wells (s1, s2, s3, s4) contains four peripheral vertical sidewalls extending from a topmost layer within the alternating stack (32, 46) to top surfaces of four different layers within the alternating stack, such as shown in FIG. 19B for example.

In one embodiment, each of the contact wells contains a respective set of nested vertical steps in which each vertical step laterally enclosing a respective inner vertical step in a top-down view is located above the respective inner vertical step in a vertical cross-sectional view, as shown in FIG. 7A for example.

In one embodiment, different contact wells within the contact well set have stepped surfaces for different vertically consecutive sets of electrically conductive layers that are vertically offset with respective to each other, as shown in FIG. 19C for example.

In one embodiment, each of the contact wells has a vertical cross-sectional profile along a respective vertical plane (e.g., X-X') that includes a stepwise descending vertical cross-sectional profile as a function of a distance from a first side to a second side along the first horizontal direction hd1, and a stepwise ascending vertical cross-sectional profile as a function of the distance from the first side to the second side along the first horizontal direction hd1, as shown in FIGS. 7B, 7C, 22 and 23, for example.

In one embodiment, the contact well set comprises a subset of two or more contact wells located adjacent among one another within a common set of peripheral sidewalls that define a single continuous cavity overlying the set of two or more contact wells, as shown in FIGS. 4A and 6, for example. In another embodiment shown in FIG. 9, the contact well set comprises discrete contact wells.

In one embodiment, at least one retro-stepped dielectric material portion 65 is located over the contact well set, and contact via structures 86 extend at least from a top surface of the at least one retro-stepped dielectric material portion and contact a subset of the electrically conductive layers 46 that are on, or underneath, horizontal surfaces of the first and the second stepped surfaces of the contact well set.

In one embodiment, the memory stack structures 55 are located in a memory plane 100 of a vertical NAND memory device. The electrically conductive layers 46 comprise word lines of the vertical NAND memory device which extend in the first horizontal direction, while bit lines 98 extend in the second horizontal direction. The set of contact wells is located in the memory plane 100. At least some of the memory stack structures 55 are located in the memory plane 100 between the set of contact wells and a word line decoder region 400 of the memory plane 100, as shown in FIG. 27B.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The embodiments of the present disclosure provide a memory device which reduces the word line contact area. The dummy staircase which is located between the memory plane and the sense amplifier region can be eliminated. In one embodiment, by forming contact wells in which the stepped surfaces descend in more than one horizontal direction reduces the word line contact area. Furthermore, in one embodiment, by forming the contact wells in the memory plane can eliminate the staircase between the row decoder region and the memory plane.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
memory stack structures vertically extending through the alternating stack, wherein each of the memory stack structures comprises a memory film and a vertical semiconductor channel; and
a contact well set that includes four contact wells extending through a respective upper region of the alternating stack,
wherein the contact well set comprises a rectangular opening extending through the alternating stack and four peripheral sidewalls located at a periphery of the rectangular opening;
wherein the four contact wells contact a common vertical line extending along a vertical direction that is perpendicular to a top surface of the substrate;
wherein a bottommost horizontal surface of each contact well of the four contact wells contacts the common vertical line; and
wherein each of the four contact wells contains first stepped surfaces which have a stepwise descending vertical profile along a first horizontal direction and second stepped surfaces which have a stepwise descending vertical profile along a second horizontal direction which is perpendicular to the first horizontal direction; and
wherein each horizontal surface other than a topmost horizontal surface within each of the four contact wells includes a respective first straight edge that coincides with a bottom edge of a respective first vertical step that extends upward from the respective first straight edge, and includes a respective second straight edge that coincides with a bottom edge of a respective second vertical step that extends upward from the respective second straight edge and having a same height as the first respective vertical step, each first straight edge is parallel to the first horizontal direction and each second straight edge is parallel to the second horizontal direction, and each of the respective first vertical step and the respective second vertical step has a respective top edge that coincides with a corresponding straight edge of a respective overlying horizontal surface of a respective one of the four contact wells.

2. The three-dimensional memory device of claim 1, wherein each set of stepped surfaces within a respective one of the four contact wells comprises stepped surfaces of the insulating layers.

3. The three-dimensional memory device of claim 1, wherein each set of stepped surfaces within a respective one of the four contact wells stepped surfaces of the electrically conductive layers.

4. The three-dimensional memory device of claim 1, wherein each set of stepped surfaces within a respective one of the four contact wells comprises a respective set of L-shaped horizontal surfaces.

5. The three-dimensional memory device of claim 1, wherein:
horizontal surfaces within each contact well of the four contact wells are vertically offset from any other horizontal surface located within any other contact well of the four contact wells; and
each of the four peripheral sidewalls of the contact well set vertically extends from a topmost layer within the alternating stack to top surfaces of two different layers within the alternating stack that are vertically offset from each other.

6. The three-dimensional memory device of claim 1, wherein the four peripheral sidewalls define a single continuous cavity overlying the four contact wells.

7. The three-dimensional memory device of claim 1, further comprising:
a retro-stepped dielectric material portion located over the contact well set; and
contact via structures extending at least from a top surface of the retro-stepped dielectric material portion and contacting a subset of the electrically conductive layers that are on, or underneath, horizontal surfaces of the four sets of stepped surfaces of the contact well set.

8. The three-dimensional memory device of claim 1, wherein:
the four peripheral sidewalls are adjoined to each other at four vertical edges of the rectangular opening;

the four peripheral sidewalls comprise a first peripheral sidewall and a second peripheral sidewall that laterally extend along a first horizontal direction and a third peripheral sidewall and a fourth peripheral sidewall that laterally extend along a second horizontal direction that is perpendicular to the first horizontal direction;

each of the four contact wells contains a respective well edge that coincides with a respective one of the four vertical edges of the rectangular opening; and the first and second stepped surfaces within each of the four contact wells have a stepwise descending vertical profile along the respective first and second horizontals direction from the respective well edge to the common vertical line.

9. The three-dimensional memory device of claim 8, wherein:

the four contact wells are located in the rectangular opening and are laterally separated from each other by four vertical surfaces having a respective vertical edge that is located within the common vertical line; and the four vertical surfaces comprise a first vertical surface and a second vertical surface located within a first vertical plane between the first peripheral sidewall and the second peripheral sidewall, and comprises a third vertical surface and a fourth vertical surface located within a second vertical plane between the third peripheral vertical sidewall and the fourth peripheral sidewall.

10. The three-dimensional memory device of claim 9, wherein:

the common vertical line is located at an intersection of the first vertical plane and the second vertical plane; and each of the four contact wells has a respective rectangular periphery defined by a respective one of the first vertical surface and the second vertical surface, a respective one of the third vertical surface and the fourth vertical surface, a respective segment of one the first peripheral sidewall and the second peripheral sidewall, and a respective segment of one the third peripheral sidewall and the fourth peripheral sidewall.

11. The three-dimensional memory device of claim 9, wherein the contact well set has a vertical cross-sectional profile along a vertical plane that is parallel to the first horizontal direction, and wherein the vertical cross-sectional profile includes a stepwise descending vertical cross-sectional profile as a function of a distance from the third peripheral sidewall toward the fourth peripheral sidewall along the first horizontal direction, followed by a vertical step at one of the third vertical surface and the fourth vertical surface, and then followed by a stepwise ascending vertical cross-sectional profile as a function of the distance from the third peripheral sidewall toward the fourth peripheral sidewall along the first horizontal direction.

12. The three-dimensional memory device of claim 11, wherein each horizontal surface within the stepwise descending vertical cross-sectional profile is vertically offset from any horizontal surface within the stepwise ascending vertical cross-sectional profile by the vertical step.

13. The three-dimensional memory device of claim 12, wherein the contact well set has an additional vertical cross-sectional profile along an additional vertical plane that is parallel to the second horizontal direction, and wherein the additional vertical cross-sectional profile includes an additional stepwise descending vertical cross-sectional profile as a function of a distance from the first peripheral sidewall toward the second peripheral sidewall along the second horizontal direction, followed by an additional vertical step at one of the first vertical surface and the second vertical surface, and then followed by an additional stepwise ascending vertical cross-sectional profile as a function of the distance from the first peripheral sidewall toward the second peripheral sidewall along the first horizontal direction.

14. The three-dimensional memory device of claim 13, wherein each horizontal surface within the additional stepwise descending vertical cross-sectional profile is vertically offset from any horizontal surface within the additional stepwise ascending vertical cross-sectional profile by the additional vertical step.

15. The three-dimensional memory device of claim 14, wherein each of the first vertical surface, the second vertical surface, the third vertical surface, and the fourth vertical surface comprises a respective first vertical edge that coincides with the common vertical line, a respective second vertical edge located within one of the four peripheral sidewalls of the contact well set, an upper stepped edge connecting a top end of the respective first vertical edge and a top end of the respective second vertical edge, and a lower stepped edge connecting a bottom end of the respective first vertical edge and a bottom end of the respective second vertical edge.

16. The three-dimensional memory device of claim 15, wherein:

a vertical distance between the upper stepped edge of the first vertical surface and the lower stepped edge of first vertical surface is the same as a thickness of a first number of pairs of insulating layers and electrically conductive layers of the alternating stack within the first vertical surface; and a vertical distance between the upper stepped edge of the second vertical surface and the lower stepped edge of second vertical surface is the same as a thickness of the first number of pairs of insulating layers and electrically conductive layers of the alternating stack within the second vertical surface.

17. The three-dimensional memory device of claim 8, further comprising bit lines which extend in the second horizontal direction.

18. The three-dimensional memory device of claim 17, wherein:

the memory stack structures are located in a memory plane of a vertical NAND memory device;

the electrically conductive layers comprise word lines of the vertical NAND memory device which extend in the first horizontal direction;

the set of contact wells is located in the memory plane; and at least some of the memory stack structures are located in the memory plane between the set of contact wells and a word line decoder region of the memory plane.

19. The three-dimensional memory device of claim 1, wherein the four contact wells include a first contact well adjoining a first corner of the rectangular opening, a second contact well adjoining a second corner of the rectangular opening, a third contact well adjoining a third corner of the rectangular opening, and a fourth contact well adjoining a fourth corner of the rectangular opening.

20. The three-dimensional memory device of claim 19, wherein the common vertical line is located at an intersection of a first vertical plane and a second vertical plane, wherein the first vertical plane extends along a first horizontal direction and is located at a straight boundary between a combination of the first contact well and the second contact well and a combination of the third contact well and the fourth contact well, and the second vertical plane extends along a second horizontal direction and is located at a straight boundary between a combination of the first contact well and the third contact well and a combination of the second contact well and the fourth contact well.

* * * * *